(12) United States Patent
Kang et al.

(10) Patent No.: US 7,510,918 B2
(45) Date of Patent: Mar. 31, 2009

(54) TRANSISTOR AND METHOD OF MANUFACTURING THE SAME

(75) Inventors: Tae-Woong Kang, Suwon-si (KR); Joo-Hyoung Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 43 days.

(21) Appl. No.: 11/499,568

(22) Filed: Aug. 4, 2006

(65) Prior Publication Data

US 2007/0034962 A1 Feb. 15, 2007

(30) Foreign Application Priority Data

Aug. 9, 2005 (KR) .............. 10-2005-0072890

(51) Int. Cl.
*H01L 21/02* (2006.01)

(52) U.S. Cl. .............. 438/157; 438/151; 438/197; 438/283; 257/E21.035

(58) Field of Classification Search .......... 257/331, 257/332, 241, 507, E29.018, E21.035; 438/404, 438/300, 739, 197, 151, 157, 217, 221, 222, 438/241, 331

See application file for complete search history.

(56) References Cited

U.S. PATENT DOCUMENTS

| | | | |
|---|---|---|---|
| 6,716,684 B1 | 4/2004 | Krivokapic et al. | 438/157 |
| 6,737,706 B2 * | 5/2004 | Lee et al. | 257/347 |
| 6,812,075 B2 | 11/2004 | Fried et al. | 438/157 |
| 6,855,607 B2 | 2/2005 | Achuthan et al. | 438/283 |
| 2005/0085027 A1 * | 4/2005 | Mimura et al. | 438/197 |
| 2006/0231892 A1 * | 10/2006 | Furukawa et al. | 257/347 |

* cited by examiner

*Primary Examiner*—Wael Fahmy
*Assistant Examiner*—Minchul Yang
(74) *Attorney, Agent, or Firm*—Mills & Onello LLP

(57) ABSTRACT

In a transistor and a method of manufacturing the transistor, the transistor includes a dummy structure enclosing source/drain structures and channel structures. Thus, a gate electrode of the transistor may be efficiently formed over the channel structures. In addition, the source/drain structure may not grow exceedingly in an epitaxial growth process employed for forming the source/drain structure.

4 Claims, 58 Drawing Sheets

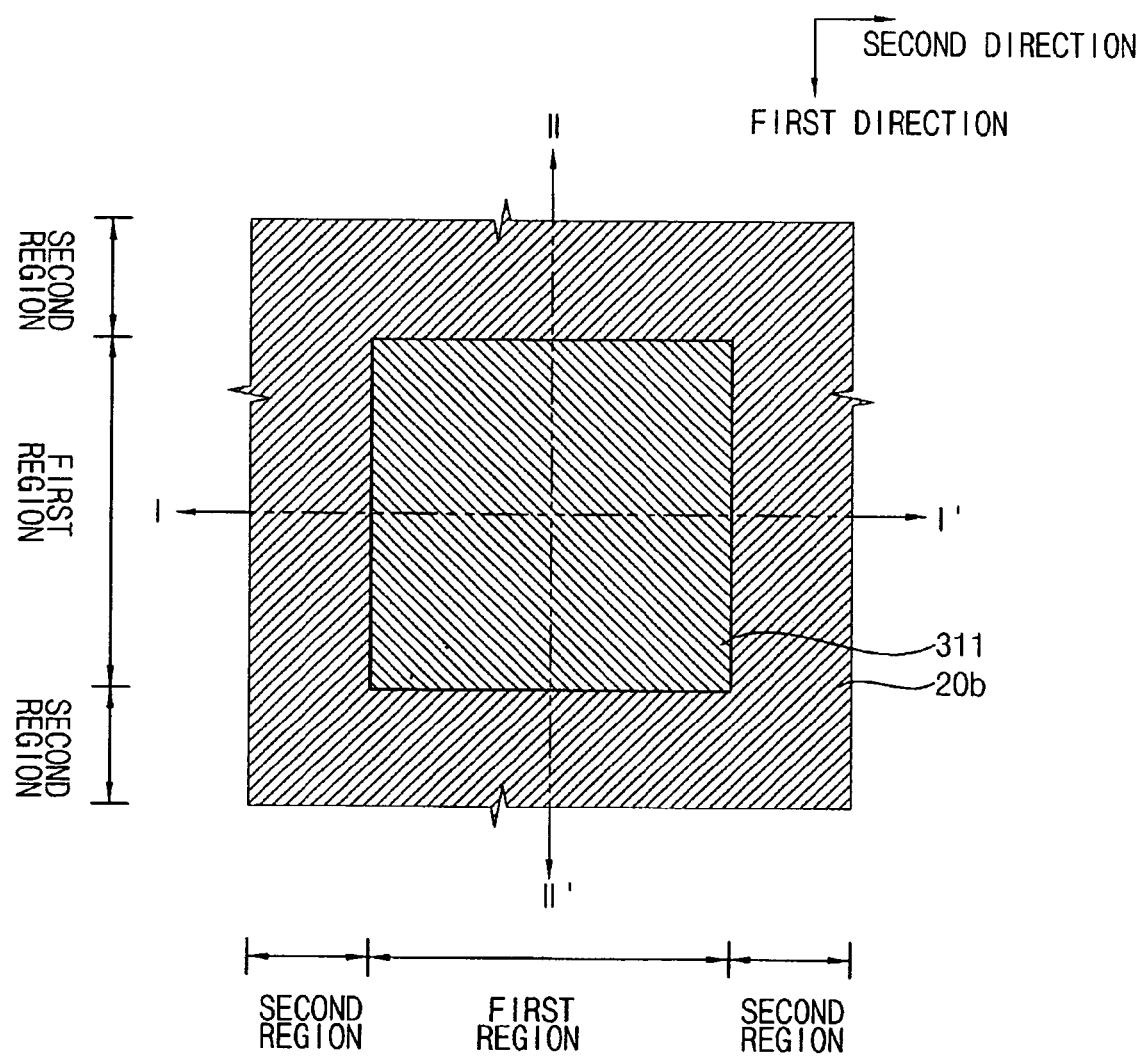

TRANSISTOR AND METHOD OF MANUFACTURING THE SAME

CROSS-REFERENCE TO RELATED APPLICATION

This application claims priority under 35 U.S.C. § 119 to Korean Patent Application No. 2005-72890 filed on Aug. 9, 2005, the contents of which are herein incorporated by reference in their entirety.

BACKGROUND OF THE INVENTION

1. Field of the Invention

The present invention relates to a transistor and a method of manufacturing the transistor. More particularly, the present invention relates to a transistor used as a switching device and a method of manufacturing the transistor.

2. Description of the Related Art

Operation characteristics of a transistor are mainly determined by a size of a channel region in the transistor. Particularly, in case that the size of the channel region increases, the operation characteristics of the transistor may also increase.

Thus, a triple gate transistor having a relatively large channel region is widely used. Because the channel region of the triple gate transistor is formed in an active structure located on an insulation layer, the channel region of the triple gate transistor may be relatively large. Thus, operation characteristics of the triple gate transistor may be relatively superior.

Particularly, in case that a voltage is applied to the active structure of the triple gate transistor, the channel region may be formed in sidewalls of the active structure as well as an upper surface of the active structure. Thus, the channel region of the triple gate transistor may be relatively large.

As described above, the active structure is formed on the insulation layer. Thus, in case that a conductive layer is formed on the insulation layer to cover the active structure, an upper face of the conductive layer may be uneven.

Thus, a margin of a photolithography process performed for patterning the conductive layer into a gate electrode may decrease.

In addition, source/drain structures of the triple gate transistor may be formed by an epitaxial growth process to reduce a contact resistance and a source/drain resistance.

However, in case that the source/drain structures grow exceedingly in the epitaxial growth process, the source/drain structures may be electrically connected to each other. Thus, an electrical short may be generated.

SUMMARY OF THE INVENTION

The present invention provides a transistor and a method of manufacturing the transistor.

According to one aspect of the present invention, a transistor can comprise an insulating layer having a first region and a second region, a dummy structure, a first source/drain structure, a second source/drain structure, channel structures, gate dielectric layer patterns, and a gate electrode. The second region encloses the first region. The dummy structure is formed on the second region. The dummy structure has an inner wall defining an opening exposing the first region. The first source/drain structure is formed on the first region. The first source/drain structure is in contact with a first portion of the inner wall. The second source/drain structure is formed on the first region. The second source/drain structure is in contact with a second portion of the inner wall to be spaced apart from the first source/drain structure. The second portion faces the first portion. The channel structures are formed on the first region. The channel structures are formed between the first and second source/drain structures. The gate dielectric layer patterns enclose respective surfaces of the channel structures. The gate electrode is formed on the dummy structure, the first region, and the gate dielectric layer patterns to enclose central portions of the gate dielectric layer patterns.

In one embodiment, the upper surface of the dummy structure and upper surfaces of the gate dielectric layer patterns have substantially the same elevation.

In another embodiment, the dummy structure comprises a first dummy layer pattern, a second dummy layer pattern, and a third dummy layer pattern. The first dummy layer pattern is partially formed on the second region to enclose the third dummy layer pattern. The second dummy layer pattern is formed on the third dummy layer pattern and the first dummy layer pattern. The third dummy layer pattern is partially formed on the second region to enclose the first region. The first dummy layer pattern has an etching selectivity with respect to the second dummy layer pattern.

In another embodiment, the transistor can further comprise a first dummy layer pattern on the second region to enclose the first region and a second dummy layer pattern on the first dummy layer pattern. The first dummy layer pattern has an etching selectivity with respect to the second dummy layer pattern.

In another embodiment, the transistor can further comprise a silicon substrate formed under the insulating layer.

In another aspect, the present invention is directed to a transistor comprising an insulating layer, a dummy structure, a first source/drain structure, a second source/drain structure, a channel structure, a gate dielectric layer pattern, a gate electrode, and a spacer. The insulating layer has a first region and a second region. The second region encloses the first region. The dummy structure is formed on the second region. The dummy structure has an inner wall defining an opening exposing the first region. The first source/drain structure is formed on the first region. The first source/drain structure is in contact with a first portion of the inner wall. The second source/drain structure is formed on the first region. The second source/drain structure is in contact with a second portion of the inner wall to be spaced apart from the first source/drain structure. The second portion faces the first portion. The channel structure is formed on the first region. The channel structure is formed between the first and second source/drain structures. The gate dielectric layer pattern is formed on top surfaces of the channel structures. The gate electrode is formed on the gate dielectric layer pattern. The gate electrode has a spacer at a sidewall of the gate electrode.

In one embodiment, the spacer is in contact with one of the first and second source/drain structures.

In another embodiment, the transistor can further comprise a silicon substrate formed under the insulating layer.

In another aspect, the present invention is directed to a method of manufacturing a transistor. An insulating layer having a first region and a second region enclosing the first region is provided. An active pattern is formed on the insulating layer in the first region. A dummy structure is formed on the second region. A gate dielectric layer is formed on the active pattern. A gate electrode pattern is formed on the gate dielectric layer. A spacer is formed on a sidewall of the gate electrode. The spacer covers a part of the gate dielectric layer. The part of the gate dielectric layer that is not covered by the spacer can be removed. An epitaxial growth structure is formed on the first region to form a source/drain structure. The epitaxial growth structure is in contact with the active pattern.

In one embodiment of the present invention, the method can further comprise injecting impurities into the active patterns to form a channel region after forming the gate dielectric layer.

In another embodiment, the epitaxial growth structure is in contact with the spacer.

In another embodiment, the dummy structure can be formed by forming a first dummy layer on the insulating layer and on the active pattern, forming a second dummy layer on the first dummy layer, forming a second dummy layer pattern by partially removing the second dummy layer formed on the first region, forming a first dummy layer pattern using a first etching process for the first dummy layer formed on the first region and a part of it formed on the second region so that an undercut region is formed under the edge of the second dummy layer pattern, forming a third dummy layer on the second dummy layer pattern, the insulating layer, the active patterns, and in the undercut region, and forming a third dummy layer pattern in the undercut region using a second etching process and by removing the third dummy layer formed on the second dummy layer pattern, the insulating layer, and on the active pattern.

In another embodiment, the first etching process is an isotropic etching process and/or the second etching process is an anisotropic etching process.

In another embodiment, the first dummy layer has an etching selectivity with respect to the second dummy layer.

In another embodiment, the dummy structure can be formed by forming a first dummy layer on the insulating layer and on the active pattern, forming a second dummy layer on the first dummy layer, and forming a second dummy layer pattern and a first dummy layer pattern by substantially etching the second and first dummy layers formed on the first region.

In another embodiment, the first dummy layer has an etching selectivity with respect to the second dummy layer.

In another aspect of the present invention, a transistor can be formed by providing a semiconductor substrate, forming an insulating layer having a first region and a second region enclosing the first region, on the semiconductor substrate, forming a active pattern on the insulating layer in the first region, forming a dummy structure on the second region, forming a gate dielectric layer on the active pattern, forming a gate electrode pattern on the gate dielectric layer, forming a spacer on a sidewall of the gate electrode, wherein the spacer covers a part of the gate dielectric layer, removing the part of the gate dielectric layer that is not covered by the spacer, and forming an epitaxial growth structure on the first region to form a source/drain structure. The epitaxial growth structure is in contact with the active pattern and the spacer.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIGS. 2A, 3A, 4A, 5A, 6A, 7A, 8A, 9A, 10A, 11A, 12A, 13A, 14A, 15A, 16A, 17A and 18A are plan views illustrating a method of manufacturing the transistor in FIGS. 1A to 1C.

DETAILED DESCRIPTION OF PREFERRED EMBODIMENTS

Figure 1A:
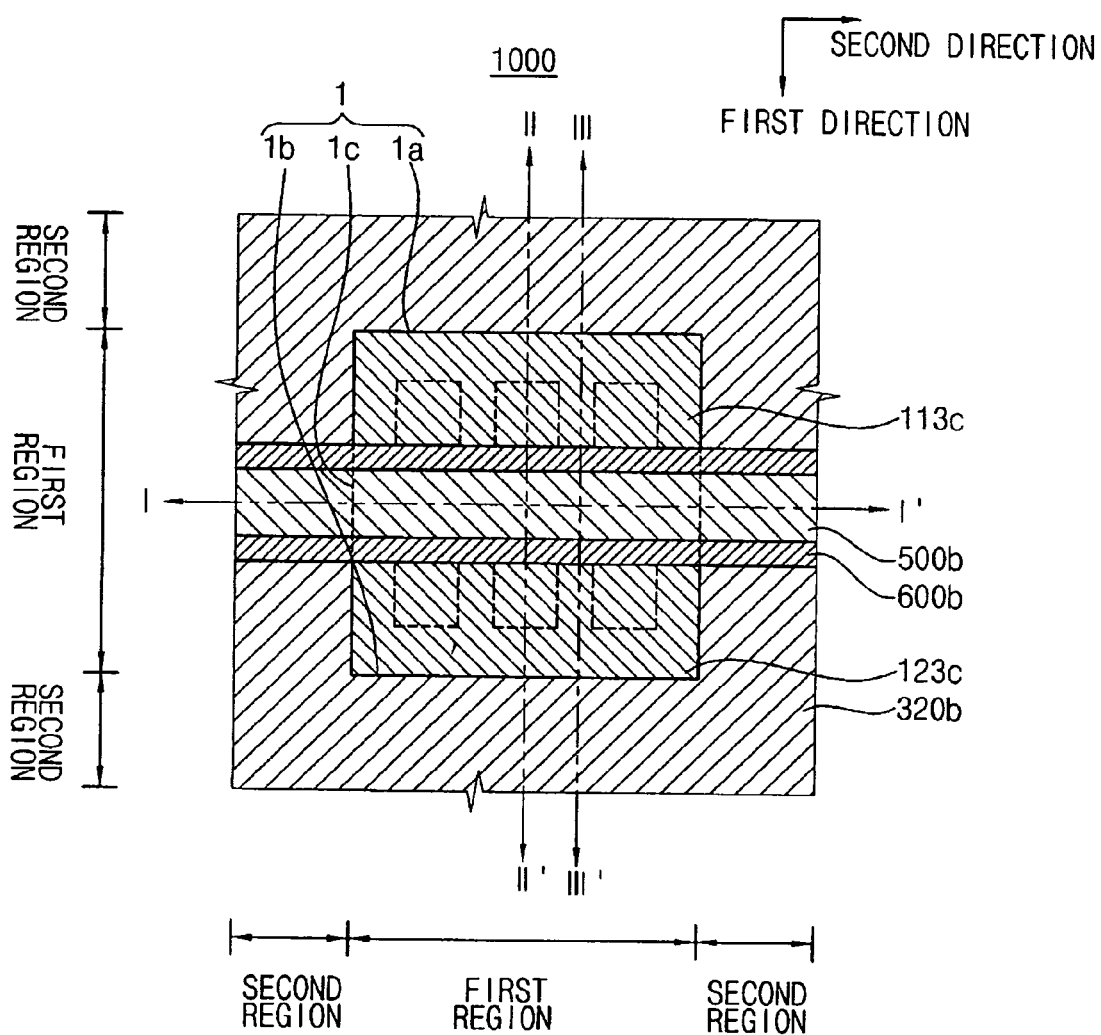
FIG. 1A is a plan view illustrating a transistor in accordance with one embodiment of the present invention.

Embodiments of the present invention will be described with reference to the accompanying drawings. The present invention may, however, be embodied in many different forms and should not be construed as limited to the embodiments set forth herein. Rather, the embodiments are provided so that disclosure of the present invention will be thorough and complete, and will fully convey the scope of the present invention to those skilled in the art. The principles and features of this invention may be employed in varied and numerous embodiments without departing from the scope of the present invention.

It will be understood that when an element or layer is referred to as being "on" and/or "connected to" another element or layer, the element or layer may be directly on and/or connected to the other element or layer or intervening elements or layers may be present. In contrast, when an element is referred to as being "directly on," and/or "directly connected to" another element or layer, there may be no intervening elements or layers present. As used herein, the term "and/or" may include any and all combinations of one or more of the associated listed items.

It will be understood that, although the terms first, second, etc. may be used herein to describe various elements, components, regions, layers and/or sections. These elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of the relevant art and will not be interpreted in an idealized and/or overly formal sense unless expressly so defined herein.

Embodiments of the present invention are described with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature of a device and are not intended to limit the scope of the present invention.

Figure 1B:
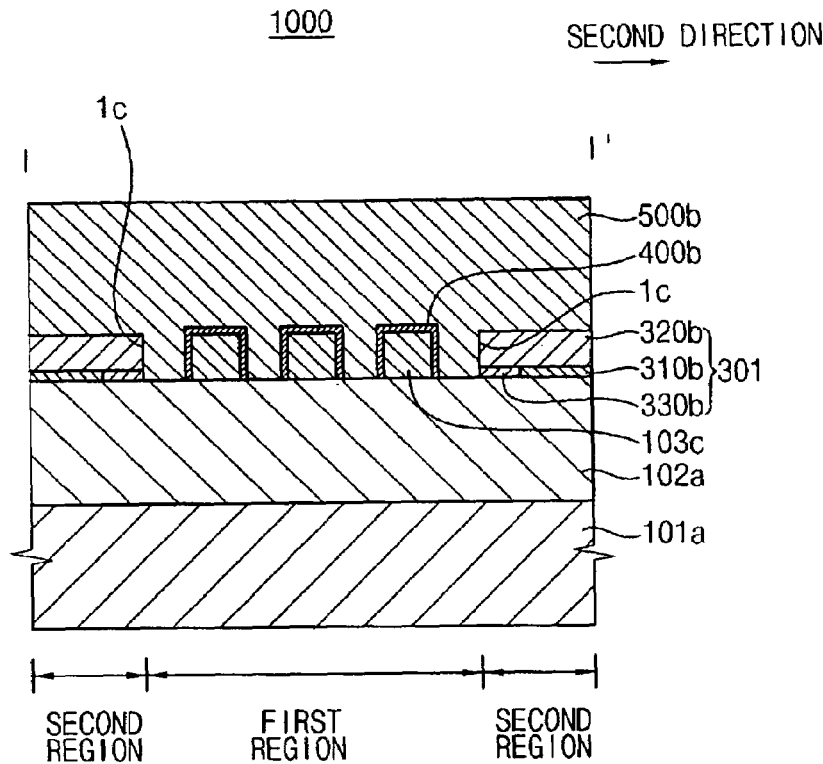
FIG. 1B is a cross-sectional view taken along line I-I' in FIG. 1A.
Figure 1C:
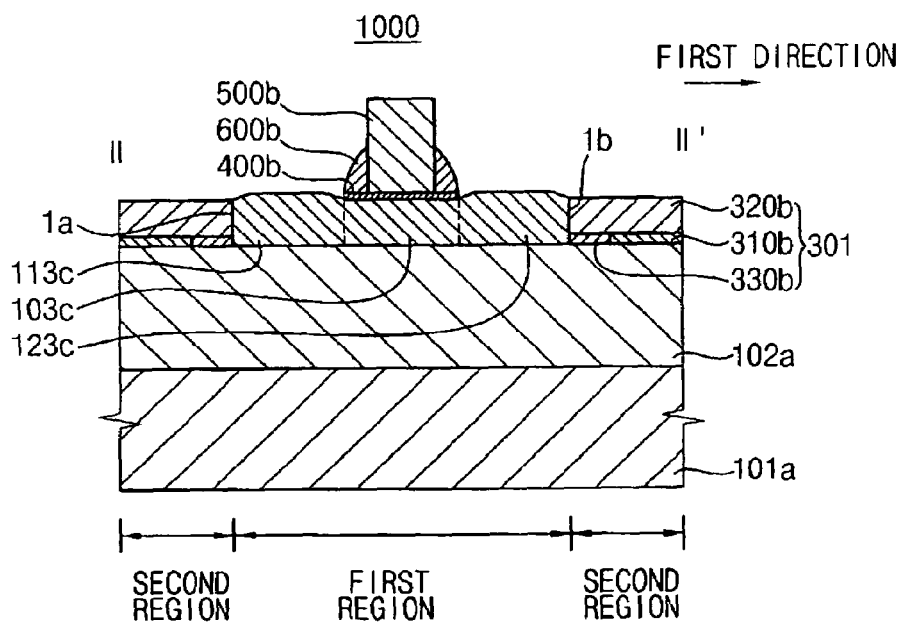
FIG. 1C is a cross-sectional view taken along line II-II' in FIG. 1A.
Figure 1D:
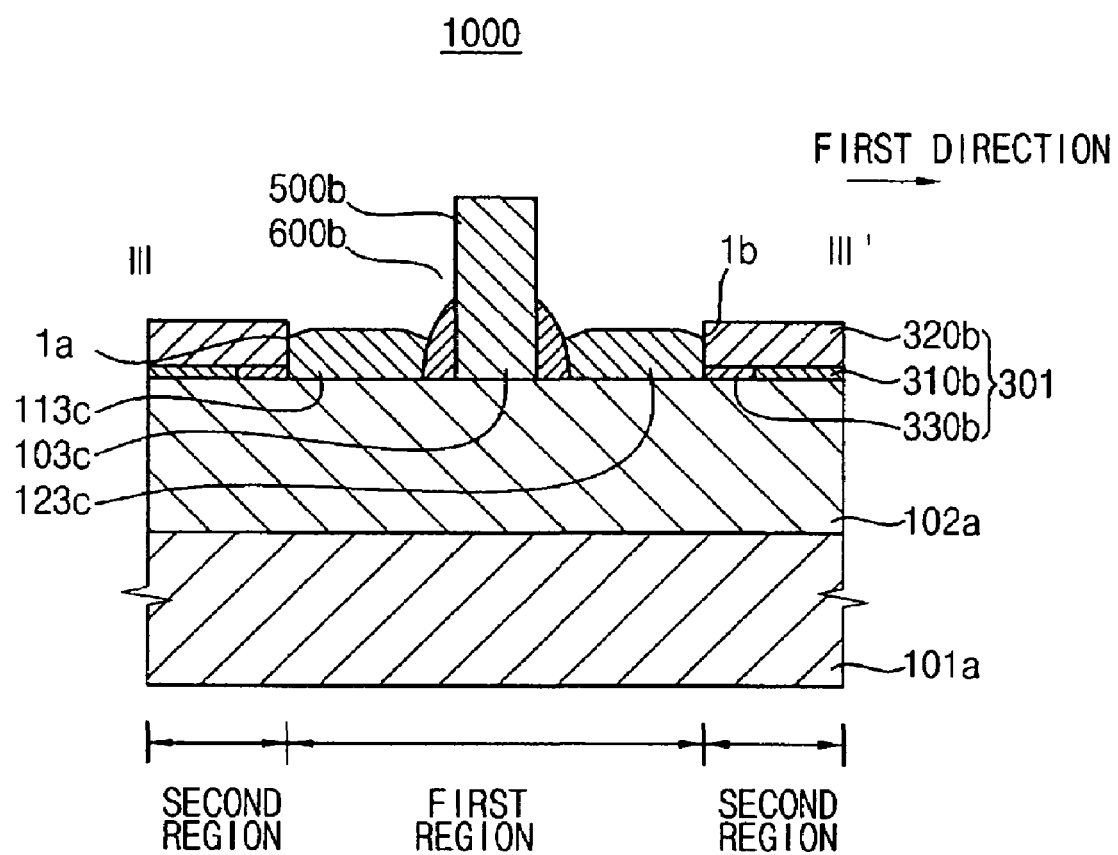
FIG. 1D is a cross-sectional view taken along line III-III' in FIG. 1A.

FIG. 1A is a plan view illustrating transistors in accordance with some embodiments of the present invention. FIG. 1B is a cross-sectional view taken along line I-I' in FIG. 1A. FIG. 1C is a cross-sectional view taken along line II-II' in FIG. 1A. FIG. 1D is a cross-sectional view taken along line III-III' in FIG. 1A.

Referring to FIGS. 1A to 1D, a transistor 1000 includes an insulating layer 102a, a dummy structure 301, a first source/drain structure 113c, a second source/drain structure 123c, a channel structures 103c, gate dielectric layer patterns 400b and a gate electrode 500b.

The insulating layer 102a is formed on a lower silicon layer 101a. The insulating layer 102a may be divided into a first region and a second region. The second region encloses the first region. The insulating layer 102a may be formed using an oxide such as silicon oxide.

The dummy structure 201 is formed on the second region so that the dummy structure 201 may have an inner wall 1 defining an opening exposing the first region. The dummy structure 301 includes a first dummy layer pattern 310b, a second dummy layer pattern 320b and a third dummy layer pattern 330b.

The third dummy layer pattern 330b is partially formed on the second region to enclose the first region. The first dummy layer pattern 310b is partially formed on the second region to enclose the third dummy layer pattern 330b. The second dummy layer pattern 320b is formed on the third dummy layer pattern 330b and the first dummy layer pattern 310b.

The first source/drain structure 113c is formed on the first region. In addition, the first source/drain structure 113c makes contact with a first portion 1a of the inner wall 1.

The second source/drain structure 123c is formed on the first region. In addition, the second source/drain structure 123c makes contact with a second portion 1b of the inner wall 1. The second portion 1b may face the first portion 1a.

The channel structures 103c are formed on the first region. The channel structure 103c extends in a first direction between the first source/drain structure 113c and the second source/drain structure 123c such that the channel structure 103c may connect the first source/drain structure 113c to the second source/drain structure 123c. In addition, the channel structures 103c are spaced apart from one another in a second direction substantially perpendicular to the first direction. The channel structures 103c are spaced apart from a third portion 1c of the inner wall 1. The third portion 1c may be connected between the first portion 1a and the second portion 1b.

The gate dielectric layer patterns 400b are formed on the channel structures 103c. That is, the gate dielectric layer patterns 400b enclose respective surfaces of the channel structure 103c. The gate dielectric layer patterns 400b may be formed using an oxide such as a silicon oxide.

The gate electrode 500b is formed on the dummy structure 301, the first region and the gate dielectric layer patterns 400b. The gate electrode 500b extends in the second direction to enclose central portions of the gate dielectric layer patterns 400b. Thus, the gate electrode 500b may selectively contact the third portion 1c of the inner wall 1.

Hereinafter, methods of manufacturing the transistor 1000 will be described.

FIGS. 2A, 3A, 4A, 5A, 6A, 7A, 8A, 9A, 10A, 11A, 12A, 13A, 14A, 15A, 16A, 17A and 18A are plan views illustrating the methods of manufacturing the transistor 1000. FIGS. 2B, 3B, 4B, 5B, 6B, 7B, 8B, 9B, 10B, 11B, 12B, 13B, 14B, 15B, 16B, 17B and 18B are cross-sectional views taken along line I-I' in FIGS. 2A, 3A, 4A, 5A, 6A, 7A, 8A, 9A, 10A, 11A, 12A, 13A, 14A, 15A, 16A, 17A and 18A, respectively. FIGS. 2C, 3C, 4C, 5C, 6C, 7C, 8C, 9C, 10C, 11C, 12C, 13C, 14C, 15C, 16C, 17C and 18C are cross-sectional views taken along line II-II' in FIGS. 2A, 3A, 4A, 5A, 6A, 7A, 8A, 9A, 10A, 11A, 12A, 13A, 14A, 15A, 16A, 17A and 18A, respectively. FIG. 18D is a cross-sectional view taken along line III-III' in FIG. 18A.

Figure 2A:
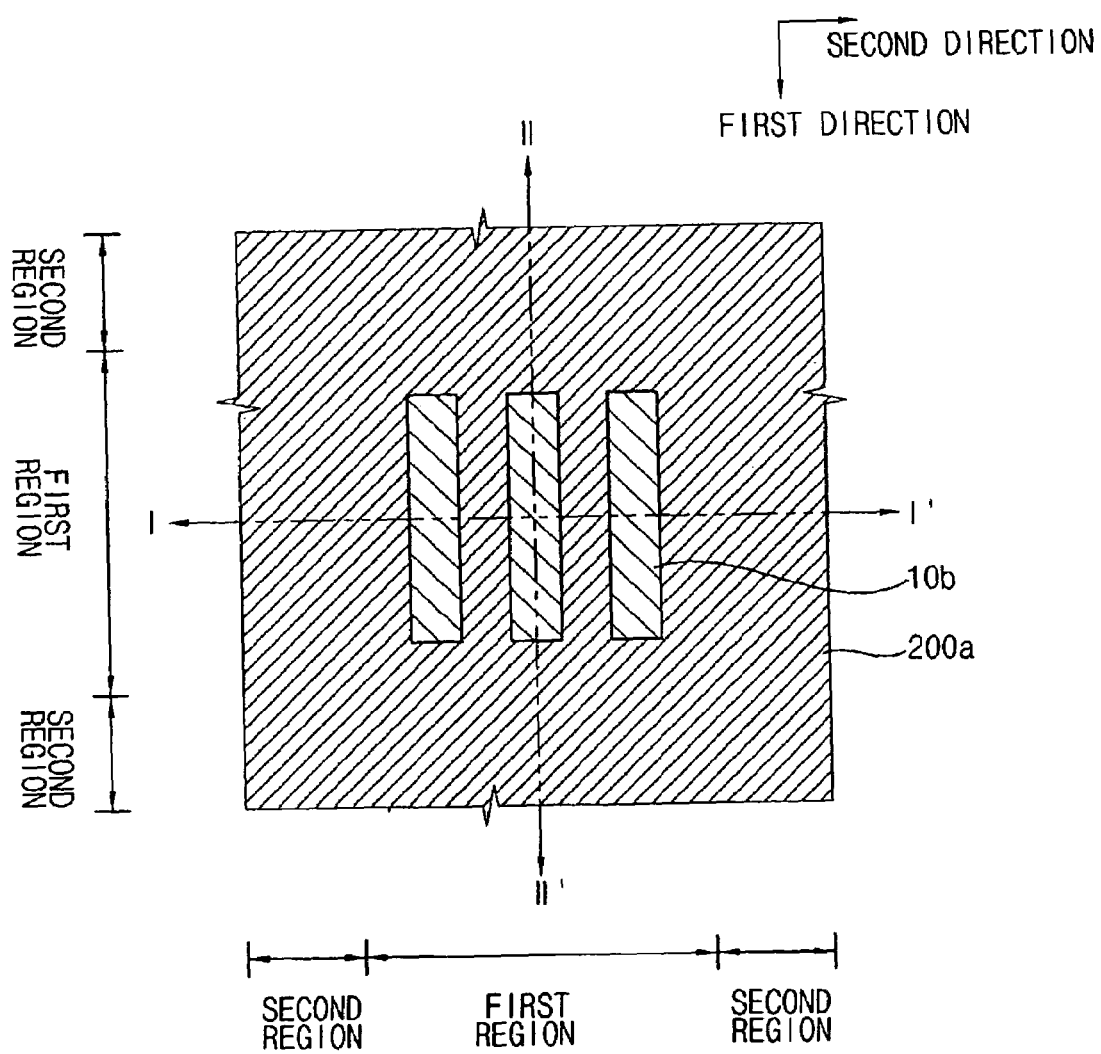
Figure 2B:
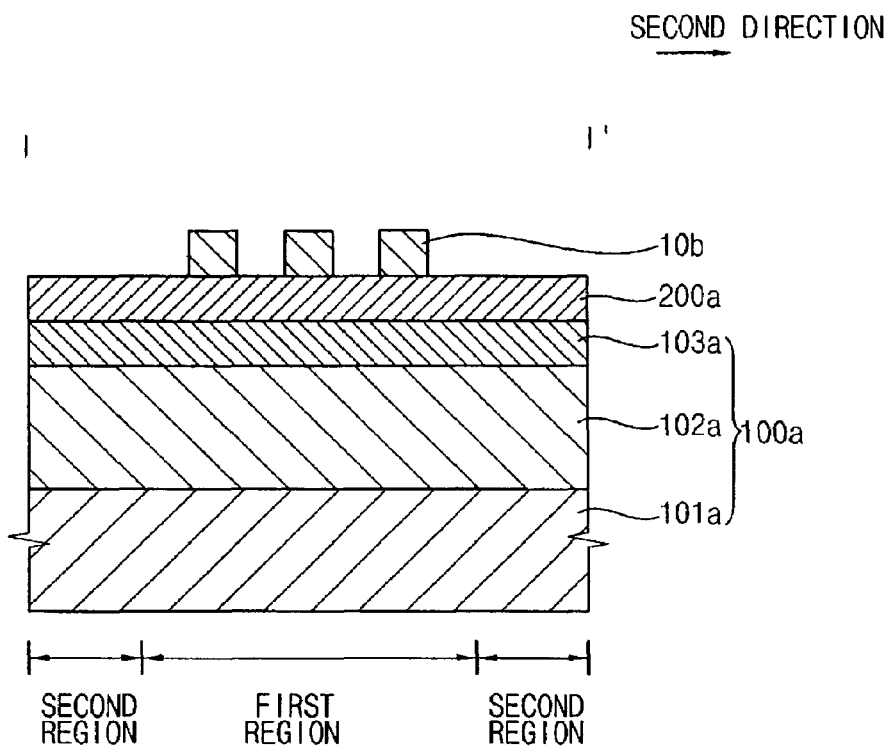
FIGS. 2B, 3B, 4B, 5B, 6B, 7B, 8B, 9B, 10B, 11B, 12B, 13B, 14B, 15B, 16B, 17B and 18B are cross-sectional views taken along lines I-I' of FIGS. 2A, 3A, 4A, 5A, 6A, 7A, 8A, 9A, 10A, 11A, 12A, 13A, 14A, 15A, 16A, 17A and 18A, respectively.
Figure 2C:
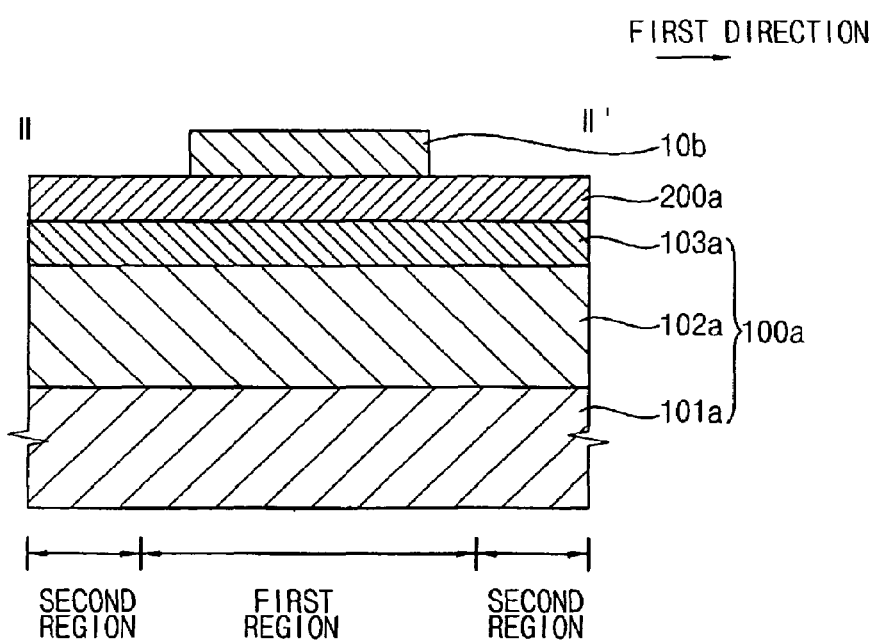
FIGS. 2C, 3C, 4C, 5C, 6C, 7C, 8C, 9C, 10C, 11C, 12C, 13C, 14C, 15C, 16C, 17C and 18C are cross-sectional views taken along lines II-II' of FIGS. 2A, 3A, 4A, 5A, 6A, 7A, 8A, 9A, 10A, 11A, 12A, 13A, 14A, 15A, 16A, 17A and 18A, respectively.

Referring to FIGS. 2A to 2C, a hard mask layer 200a is formed on a silicon-on-insulator (SOI) substrate 100a. The SOI substrate 100a includes a lower silicon layer 101a, an insulating layer 102a and an upper silicon layer 103a. The insulating layer 102a is formed on the lower silicon layer 101a. The upper silicon layer 103a is formed on the insulating layer 102a. The insulating layer 102a may be formed using an oxide such as silicon oxide.

The hard mask layer 200a may include a material having an etching selectivity with respect to silicon include in the upper silicon layer 103a. For example, the hard mask layer 200a may include silicon oxynitride (SiON).

First photoresist patterns 10b are formed on the hard mask layer 200a. The first photoresist patterns 10b extend in a first direction. The first photoresist patterns 10b are spaced apart from one another in a second direction substantially perpendicular to the first direction.

Figure 3A:
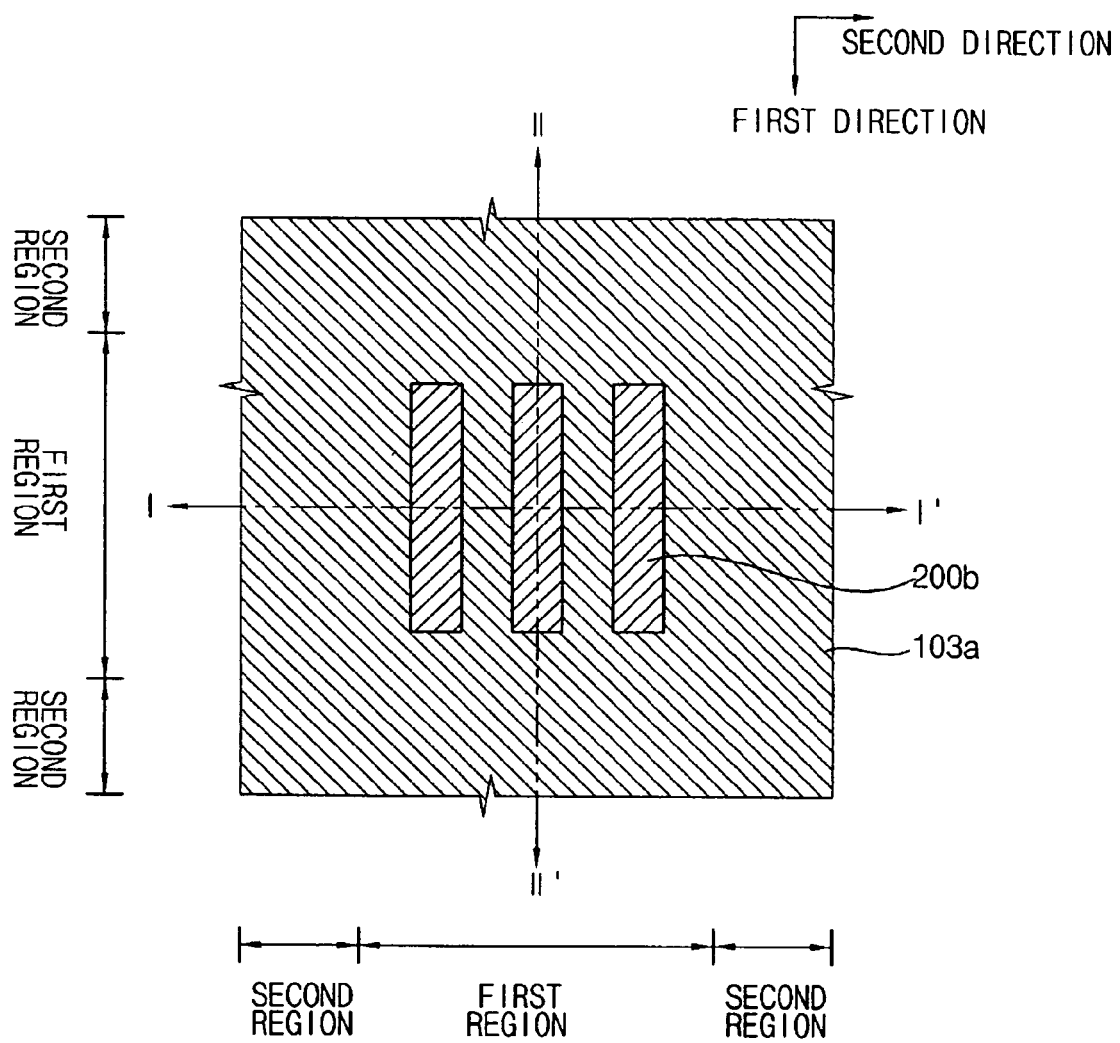
Figure 3B:
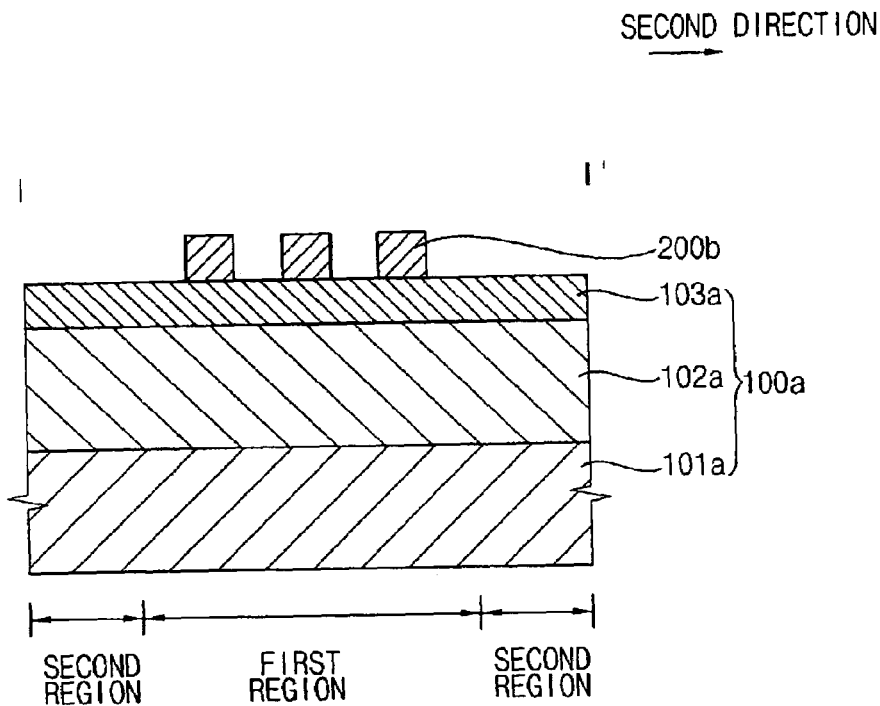
Figure 3C:
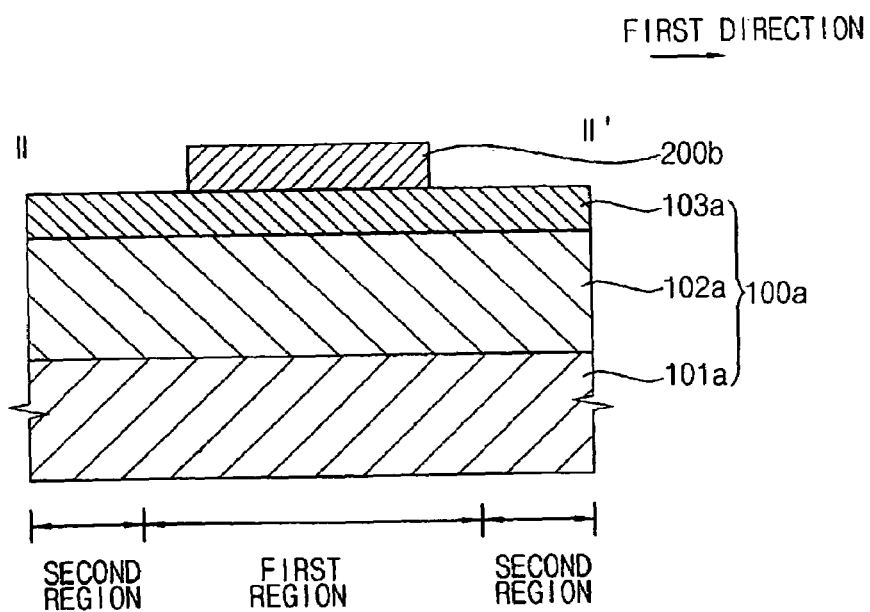

Referring to FIGS. 3A to 3C, the hard mask layer 200a is etched using the first photoresist layer patterns 10b together as an etching mask. Thus, hard mask patterns 200b are formed on the upper silicon layer 103a. Thereafter, the first photoresist layer patterns 10b are removed.

Shapes of the hard mask layer patterns 200b may be substantially the same as those of the first photoresist layer patterns 10b. Particularly, the mask layer patterns 200b extend in the first direction. In addition, the mask layer patterns 200b are spaced apart from one another in the second direction.

Figure 4A:
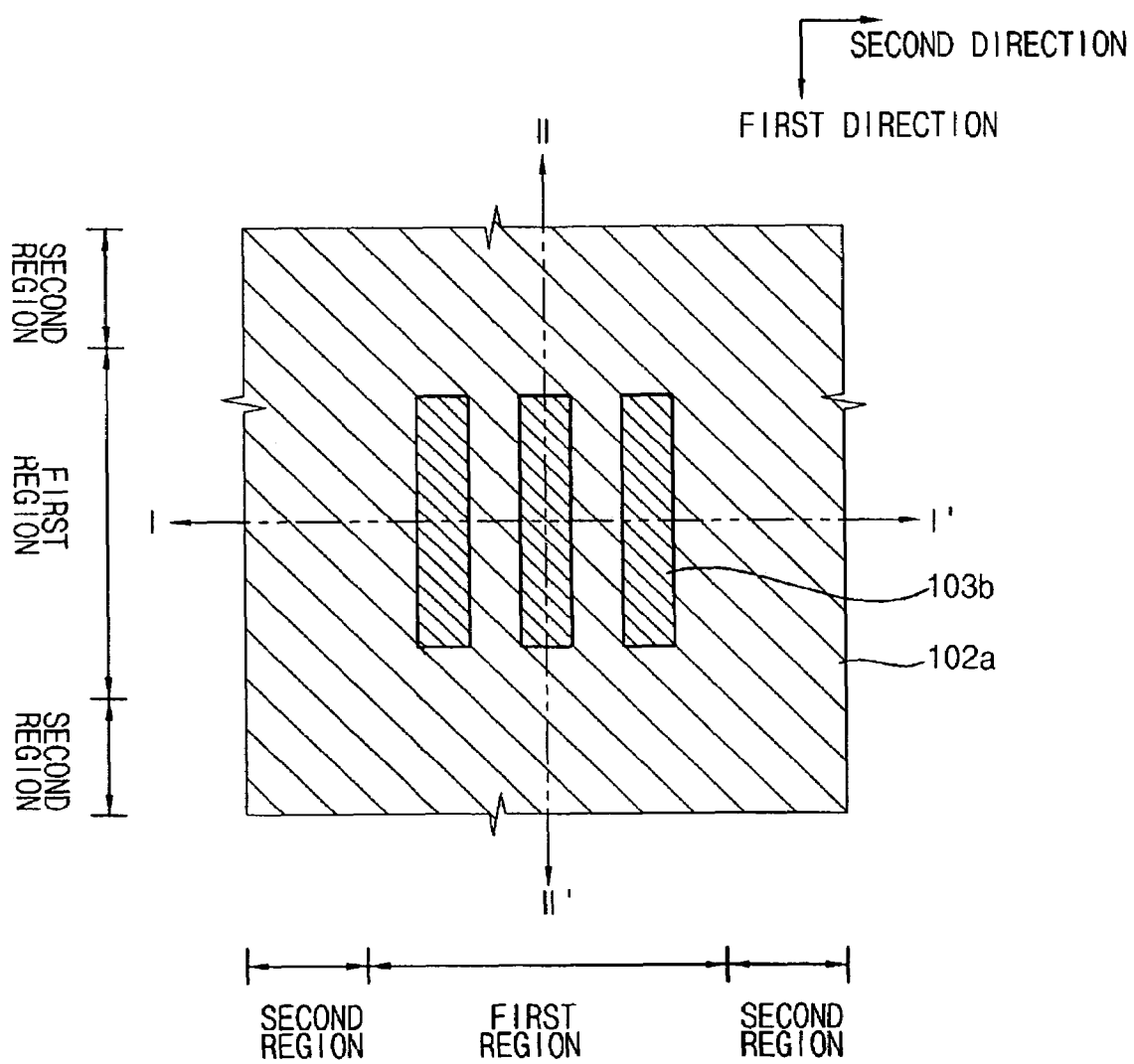
Figure 4B:
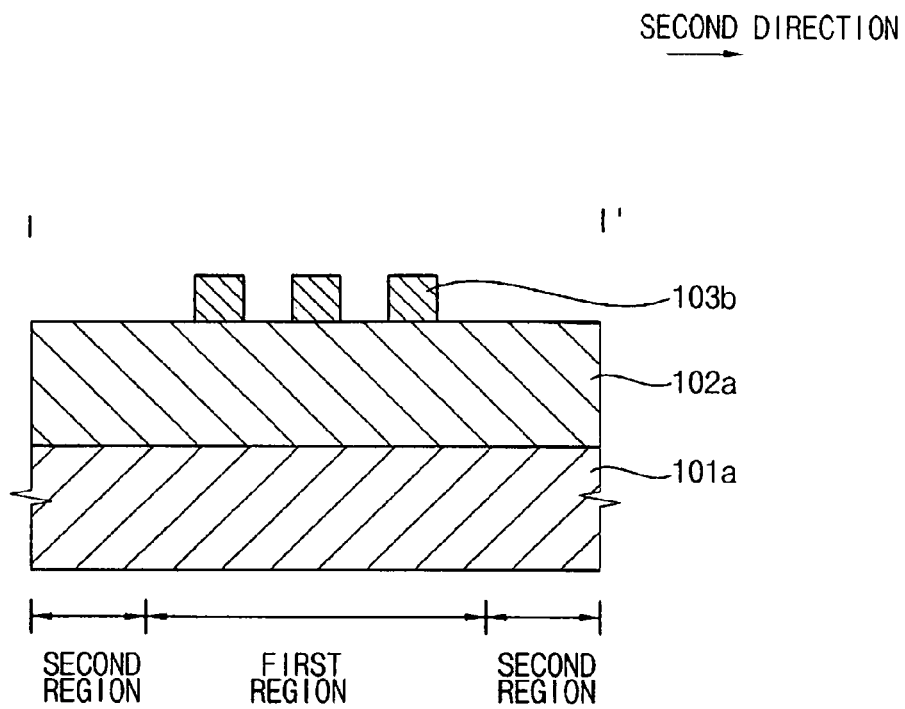
Figure 4C:
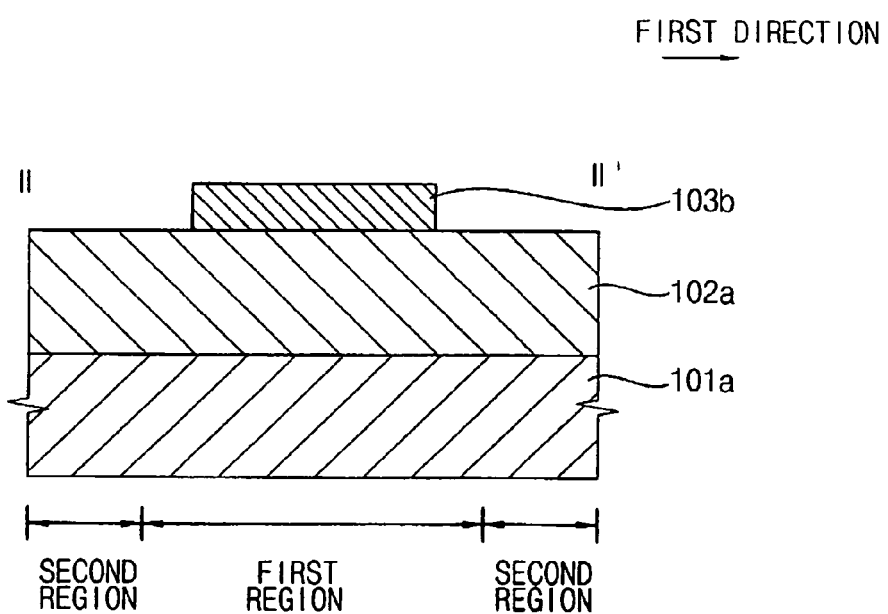

Referring to FIGS. 4A to 4C, the upper silicon layer 103a is etched using the first hard mask layer patterns 200b together as an etching mask so that active patterns 103b may be formed on the insulating layer 102a. Thereafter, the first hard mask layer patterns 200b are removed.

Shapes of the active patterns 103b may be substantially the same as those of the hard mask layer patterns 200b. Particularly, the active patterns 103b extend in the first direction. In addition, the active patterns are spaced apart from one another in the second direction.

As illustrated in FIG. 4B, a cross section of the active pattern 103b taken along line I-I' may have a first quadrangle shape. For example, the first quadrangle shape may be a square shape. However, many apparent variations of the first quadrangle shape are possible in accordance with a channel subsequently formed in a channel structure 103c (See FIG. 18C).

In addition, as illustrated in FIG. 4C, a cross section of the active pattern 103b taken along line II-II' may have a second quadrangle shape. For example, the second quadrangle shape may be a square shape.

Figure 5A:
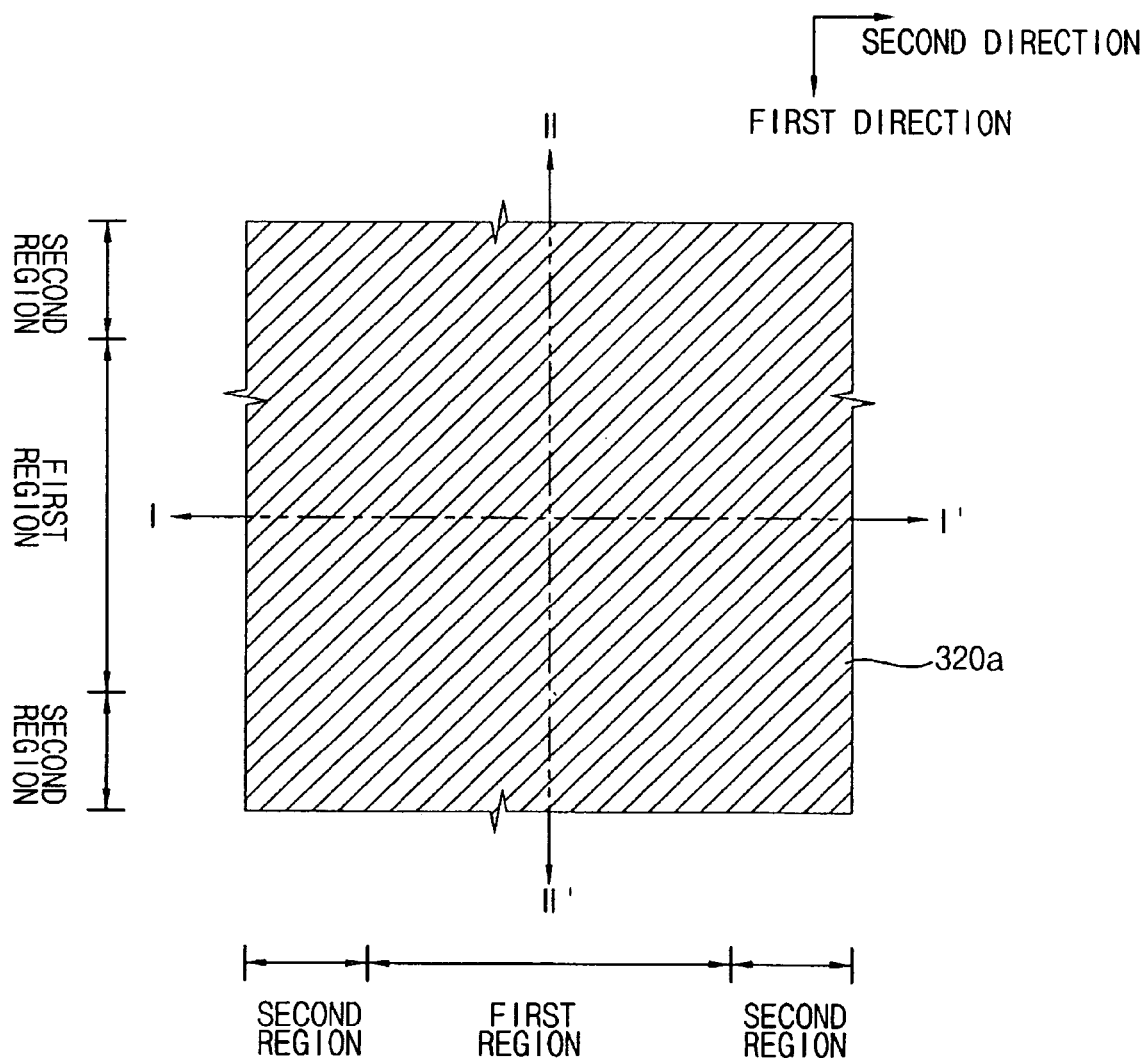
Figure 5B:
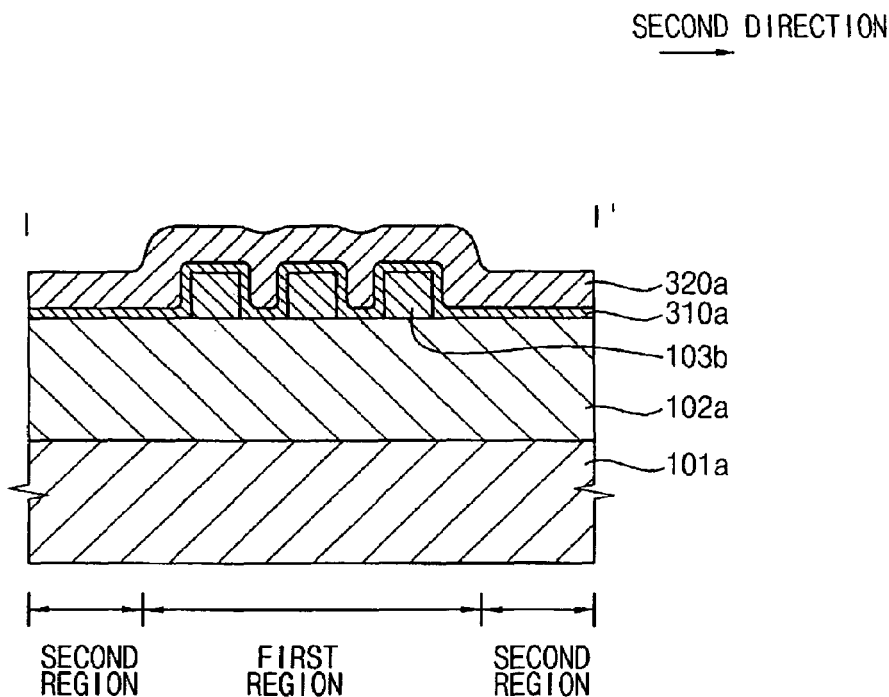
Figure 5C:
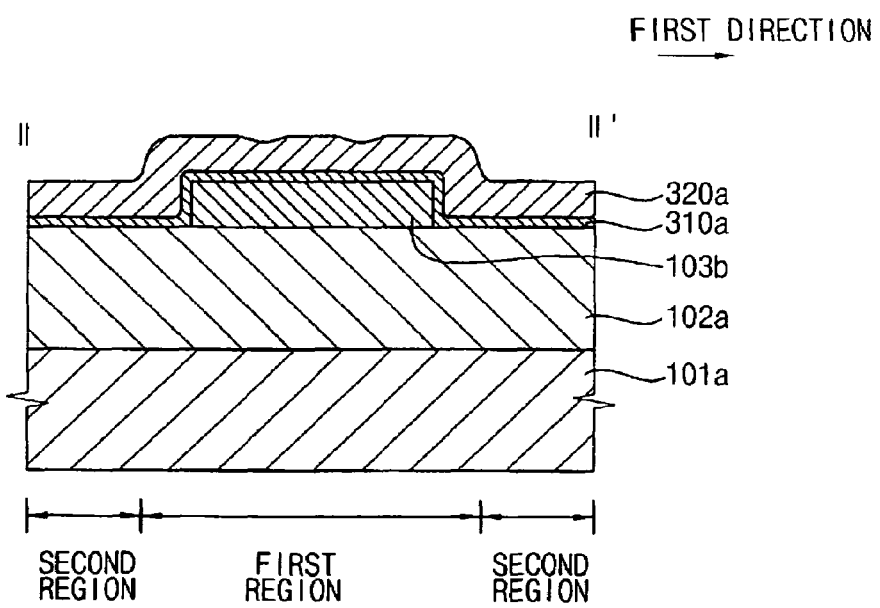

Referring to FIGS. 5A to 5C, a first dummy layer 310a and a second dummy layer 320a are subsequently formed on the insulating layer 102a and the active patterns 103b.

The first dummy layer 310a may include a material having an etching selectivity with respect to that included in the second dummy layer 320. Particularly, in case that the second dummy layer 320 includes silicon oxide, the first dummy layer 310a may include silicon nitride and/or silicon oxynitride.

In case that the first dummy layer 310a includes the material having etching selectivity with respect to that including in the second dummy layer 320, the first dummy layer 310a may be used as an etch stop layer in an etching process for partially etching the second dummy layer 320.

Figure 6A:
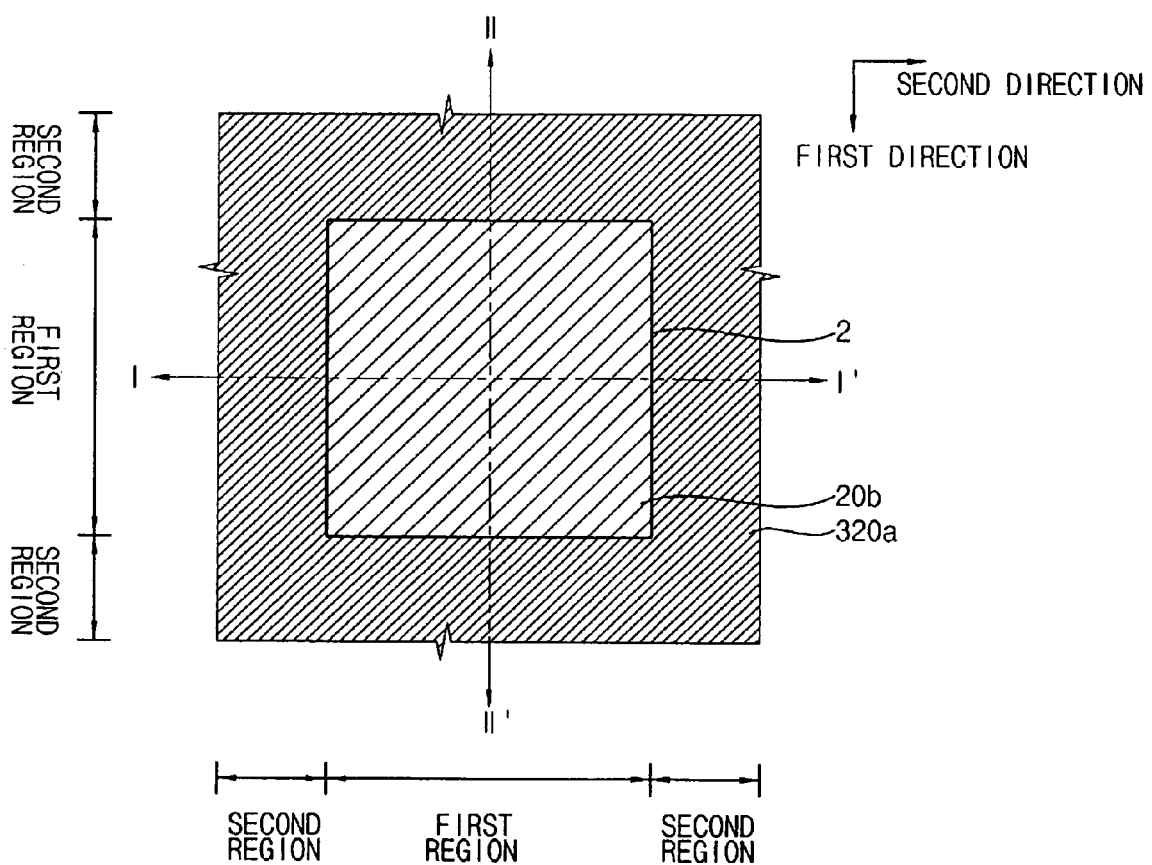
Figure 6B:
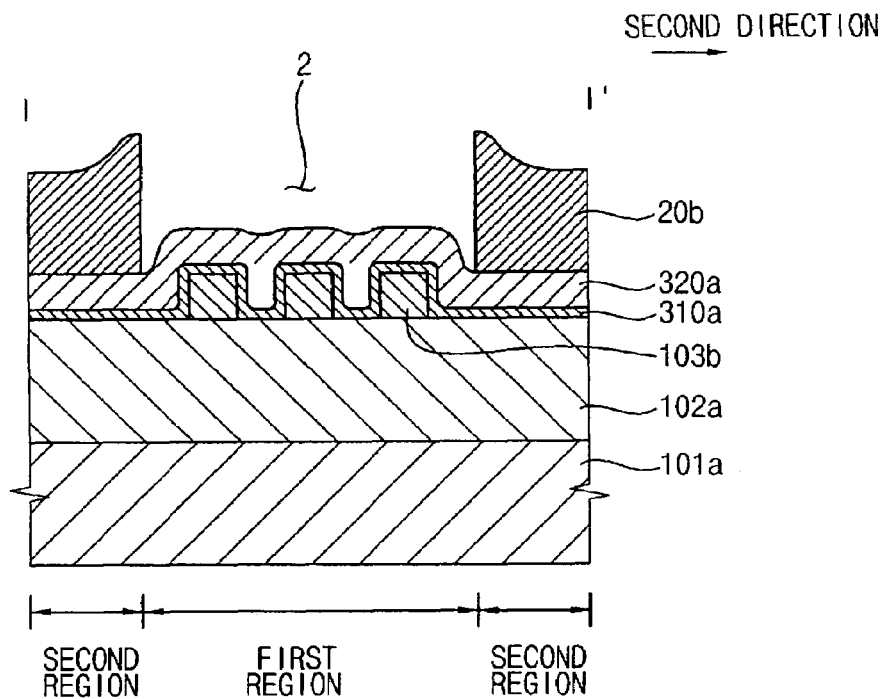
Figure 6C:
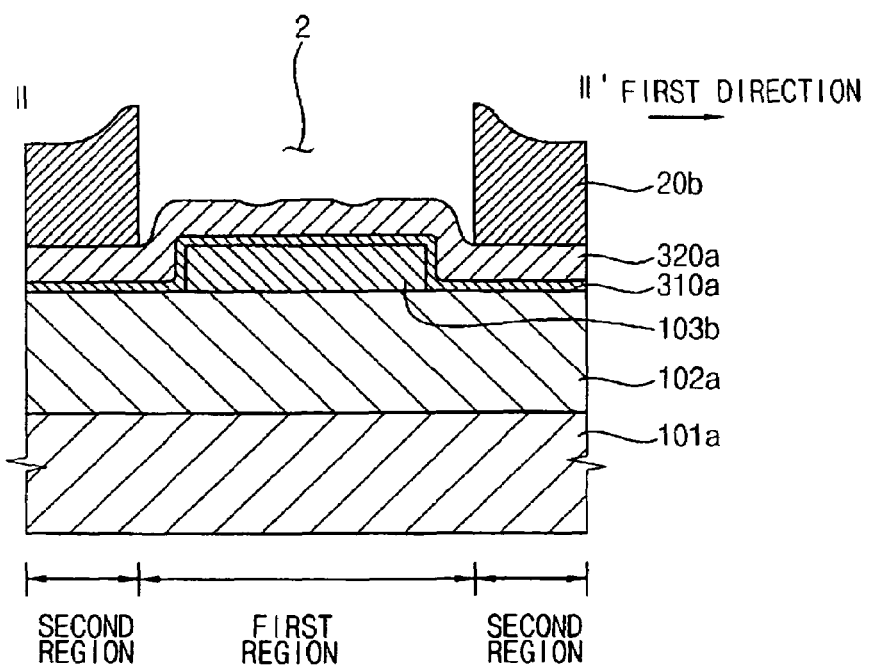

Referring to FIGS. 6A to 6C, a second photoresist layer pattern 20b is formed on the second dummy layer 320. The second photoresist layer pattern 20b has a second opening 2 exposing a portion of the dummy layer 320, the portion being located over the active patterns 103.

Figure 7B:
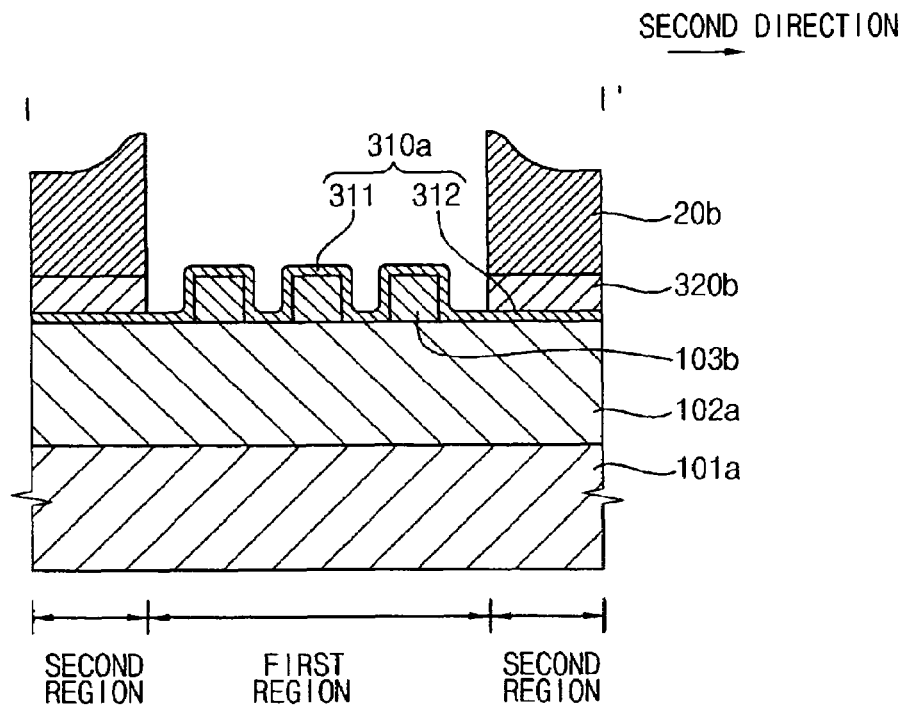
Figure 7C:
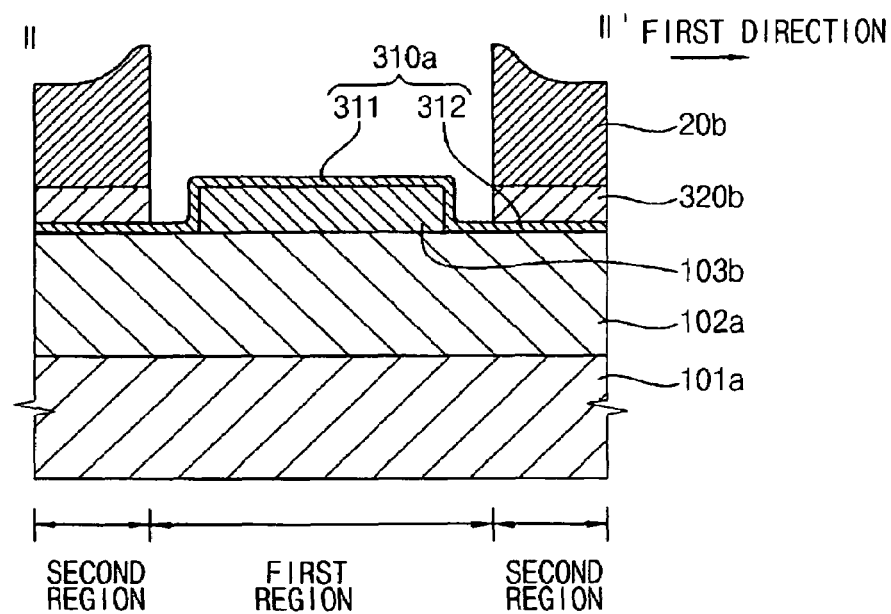

Referring to FIGS. 7A to 7C, the portion of the second dummy layer 320a is etched by the etching process. In the etching process, the second photoresist pattern 20b and the first dummy layer 310a are used as an etching mask and the etch stop layer, respectively.

Thus, a second dummy layer pattern 320b is formed between the first dummy layer 310a and the second photoresist layer pattern 20b. In addition, a first portion 311 of the first dummy layer 310, the first portion being located over the active patterns 103b, may be exposed. On the other hand, a second portion 312 of the first dummy layer pattern 310, the second portion 312 being connected to the second portion 311 of the dummy layer 310, may be covered with the second dummy layer pattern 320b. The etching process may be an anisotropic etching process. For example, the anisotropic etching process may be a dry etching process.

Figure 8A:
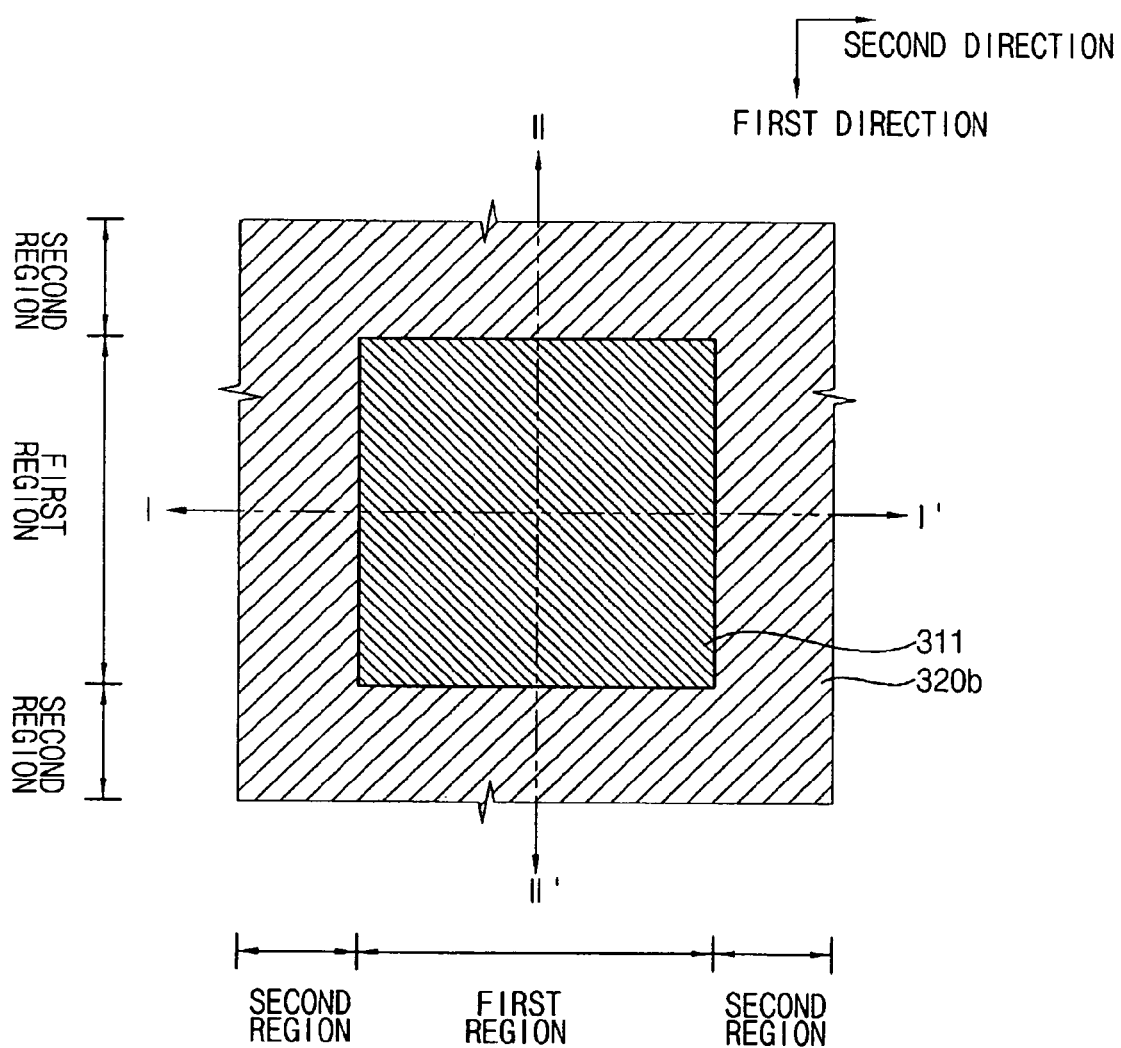
Figure 8B:
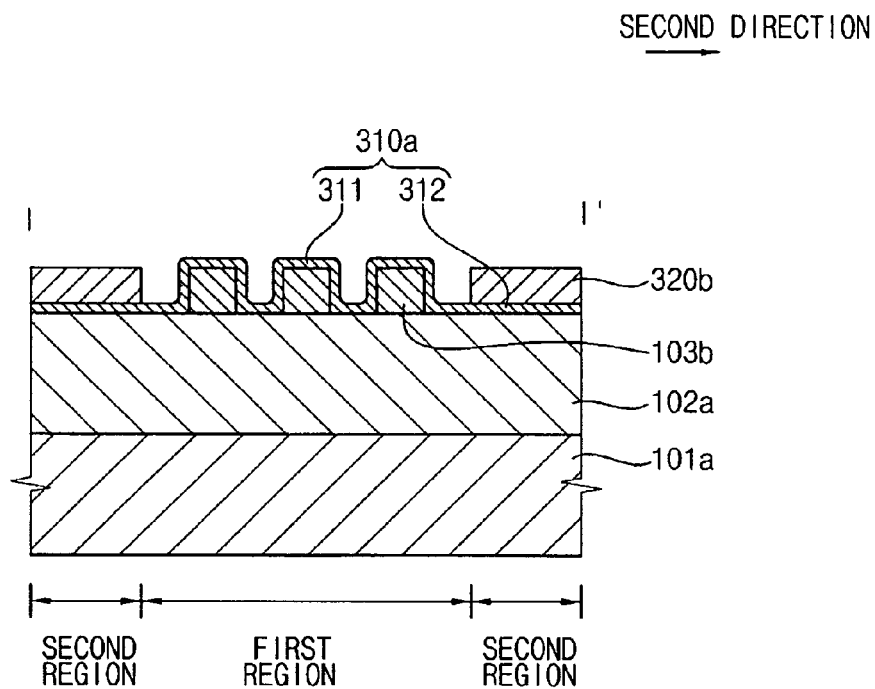
Figure 8C:
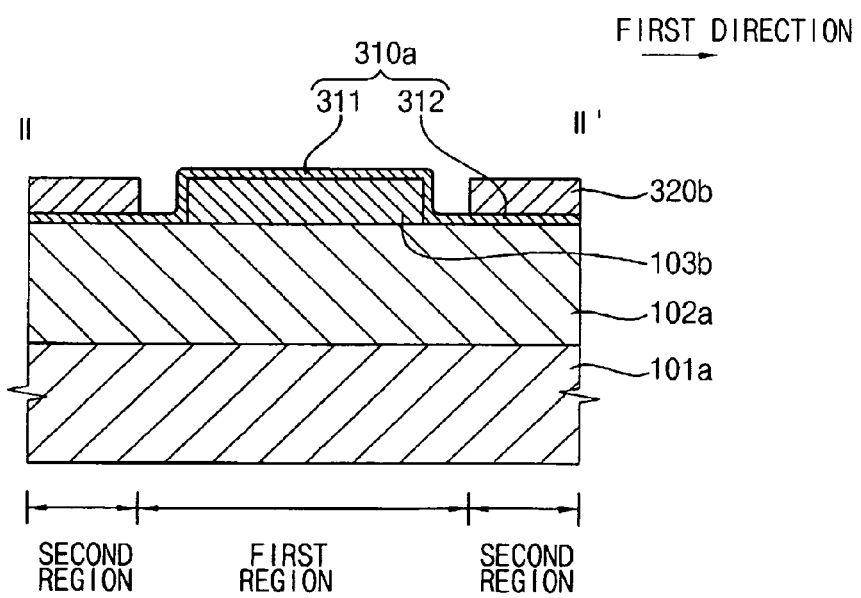

Referring to FIGS. 8A to 8C, the second photoresist layer pattern 20b is removed so that the second dummy pattern 320b may be exposed. The second photoresist layer pattern 20b may be removed by an ashing process and/or a strip process.

Figure 9A:
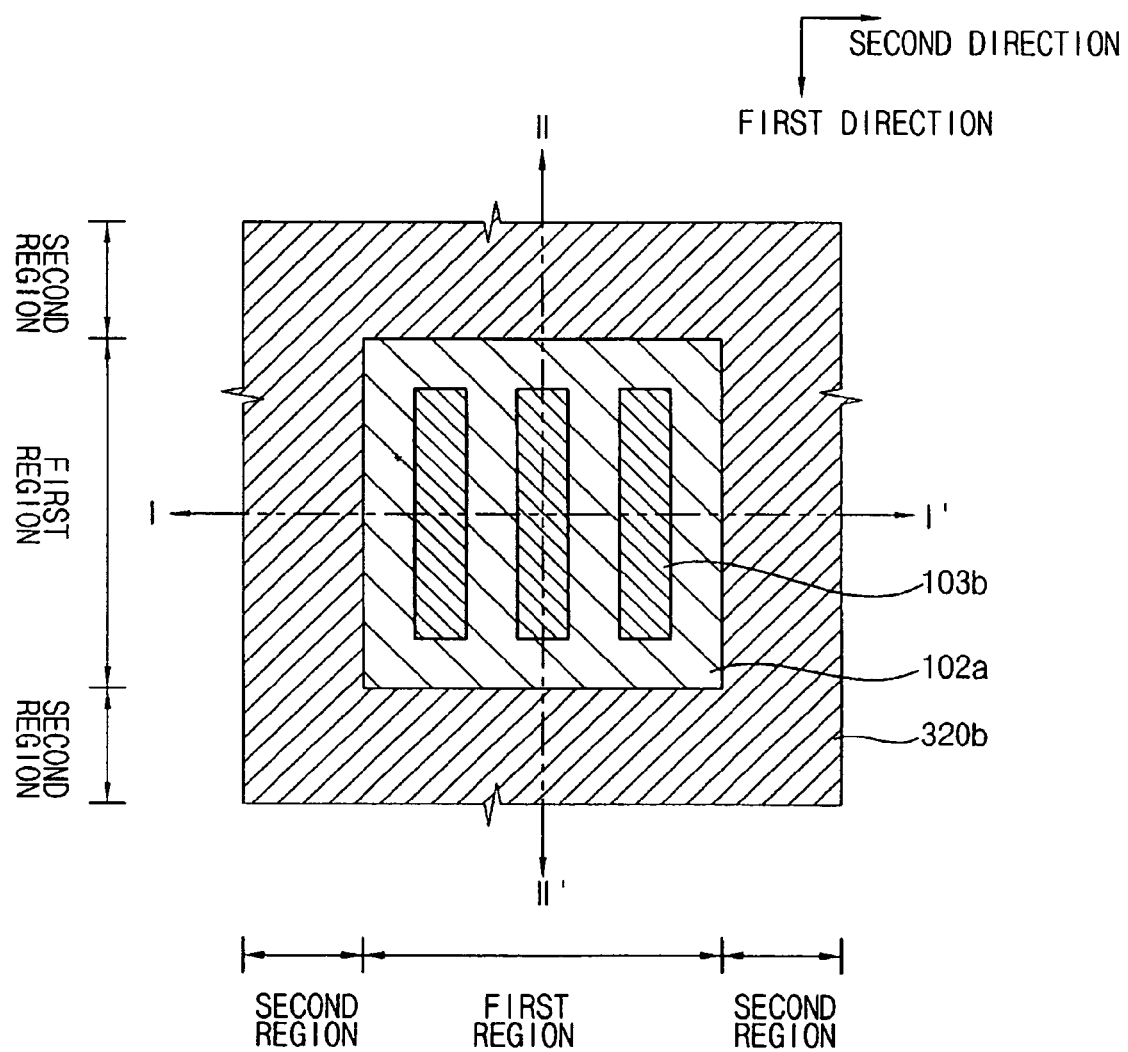
Figure 9B:
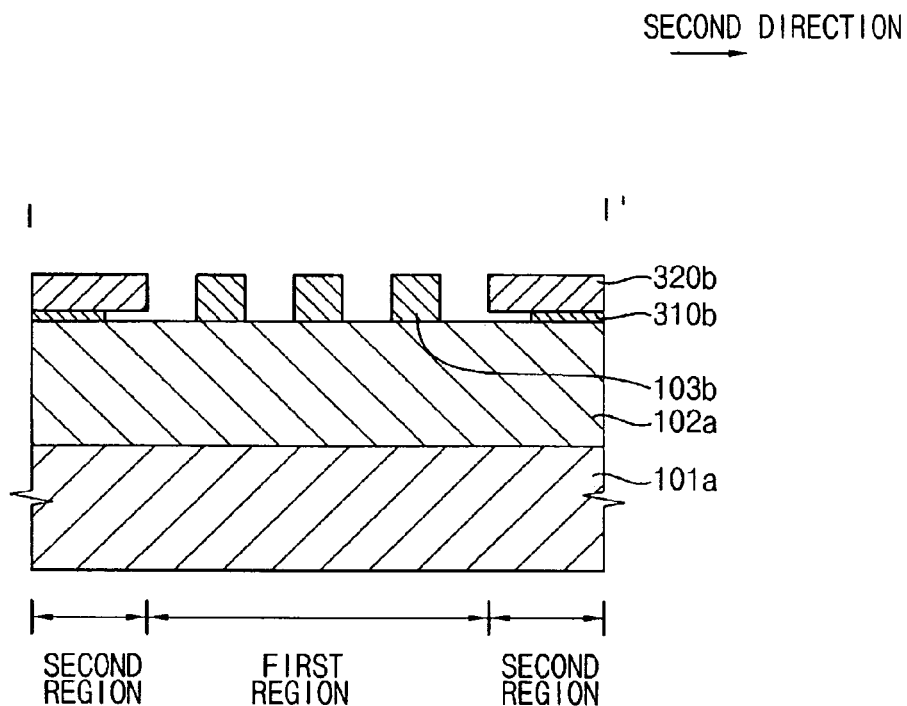
Figure 9C:
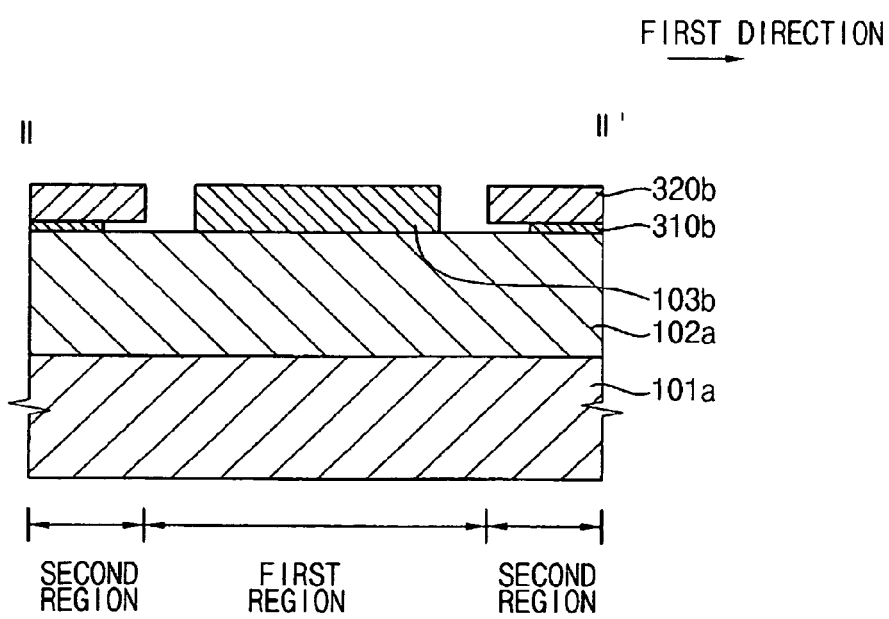

Referring to FIGS. 9A to 9C, an etching process is performed on the first dummy layer so that the first portion 311 of the first dummy layer 310 and an inner wall portion of the second portion 312 of the first dummy layer 310 may be removed. The second portion 312 of the first dummy layer 310 may be located under the second dummy layer pattern 320b.

Thus, a first dummy layer pattern 310b is formed between the insulating layer 102a and the second dummy layer pattern 320b. Here, the inner wall portion of the second portion 312 of the first dummy layer 310 may be intentionally removed to fully remove the first portion 311 of the first dummy insulating layer 102a. The etching process may be an isotropic etching process. For example, the isotropic etching process may be a wet etching process.

Figure 10A:
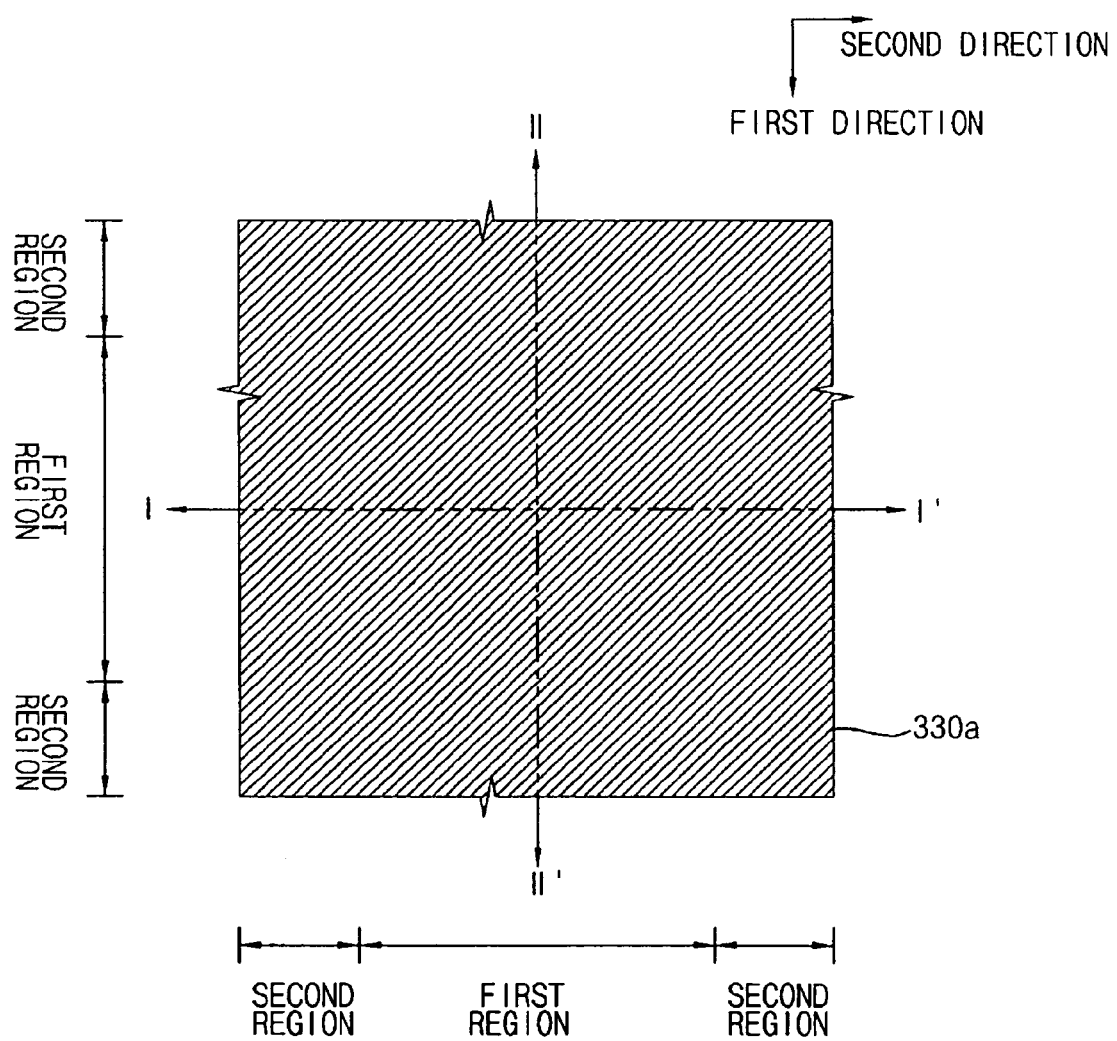
Figure 10B:
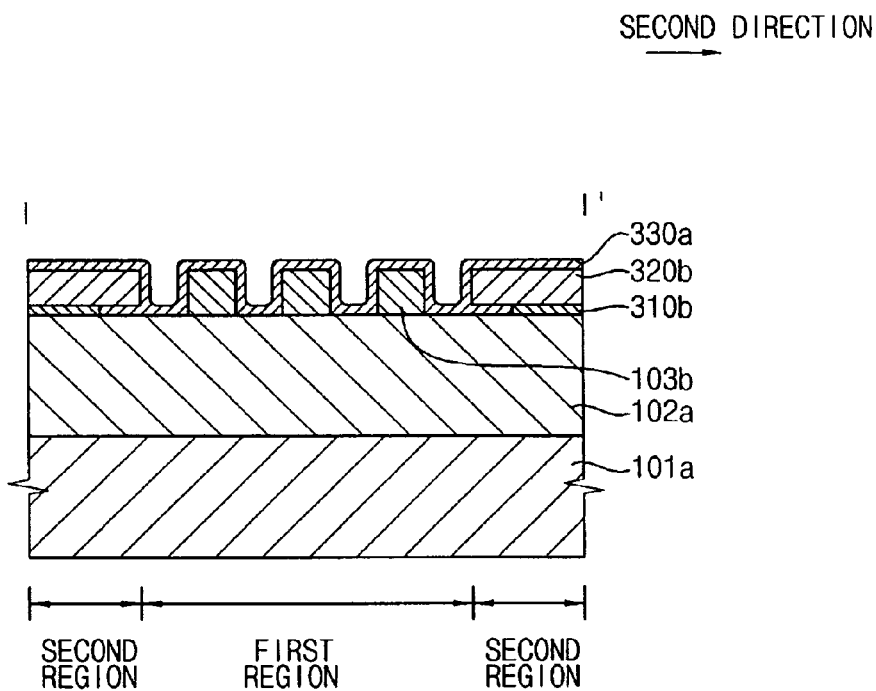
Figure 10C:
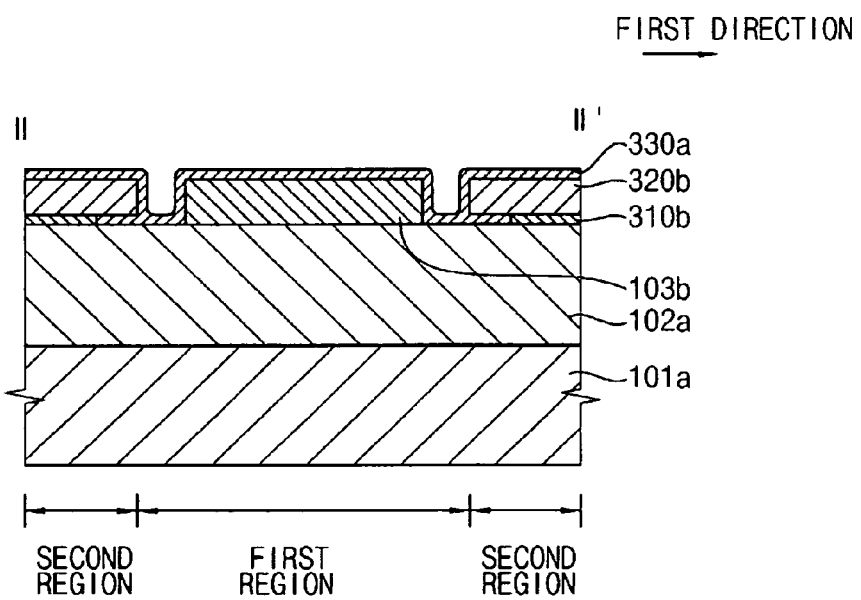

Referring to FIGS. 10A to 10C, a third dummy layer pattern 330a is formed on the second dummy layer pattern 320b, the first dummy layer pattern 310b, the insulating layer 102a and the active patterns 103b.

A space between the second dummy layer pattern 320b and the insulating layer 102a may be fully filled with the first dummy layer pattern 310b and the second dummy layer 330a. For example, the third dummy layer 330a may include a material substantially the same as that included in the second dummy layer pattern 320b.

Figure 11A:
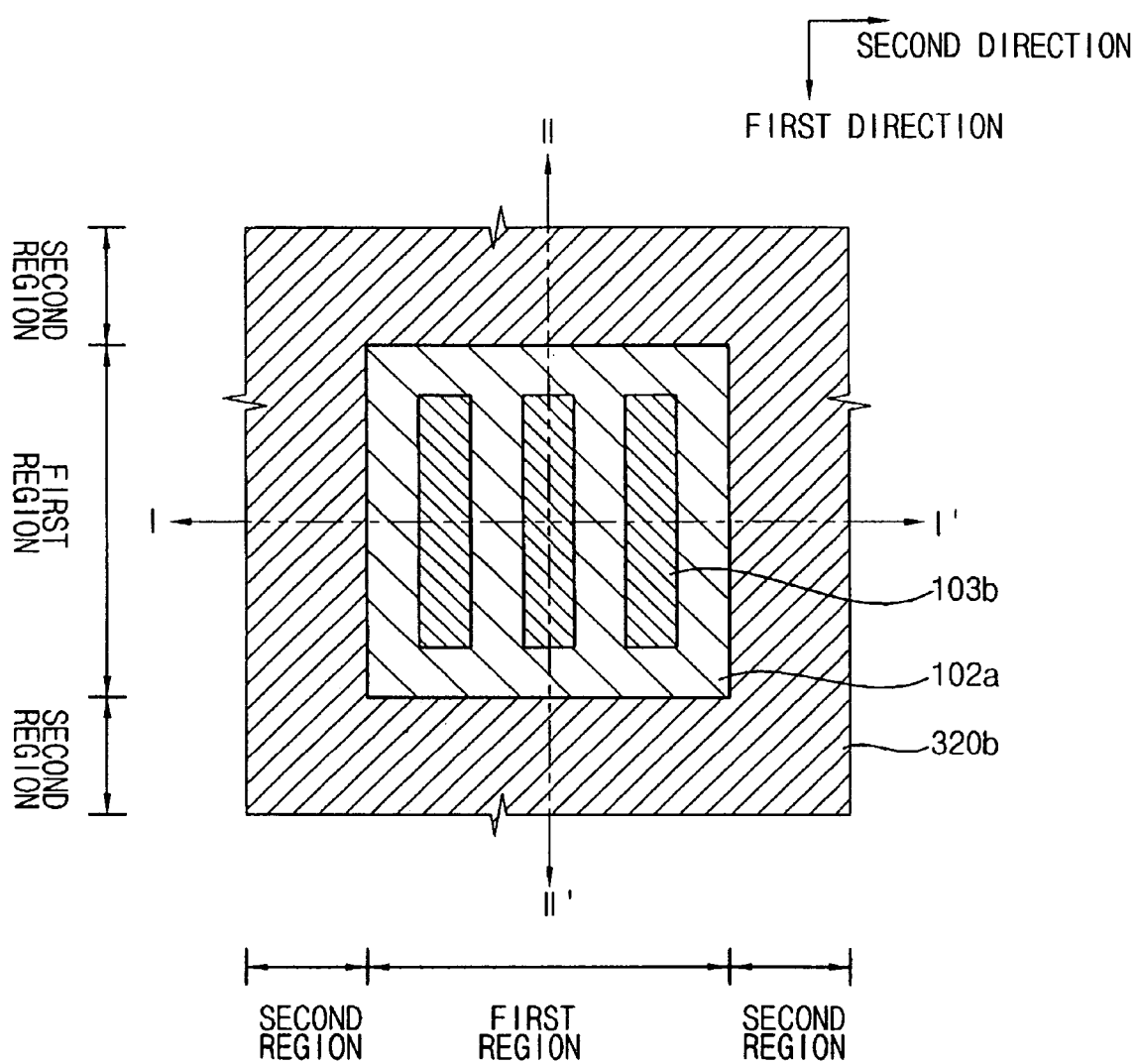
Figure 11B:
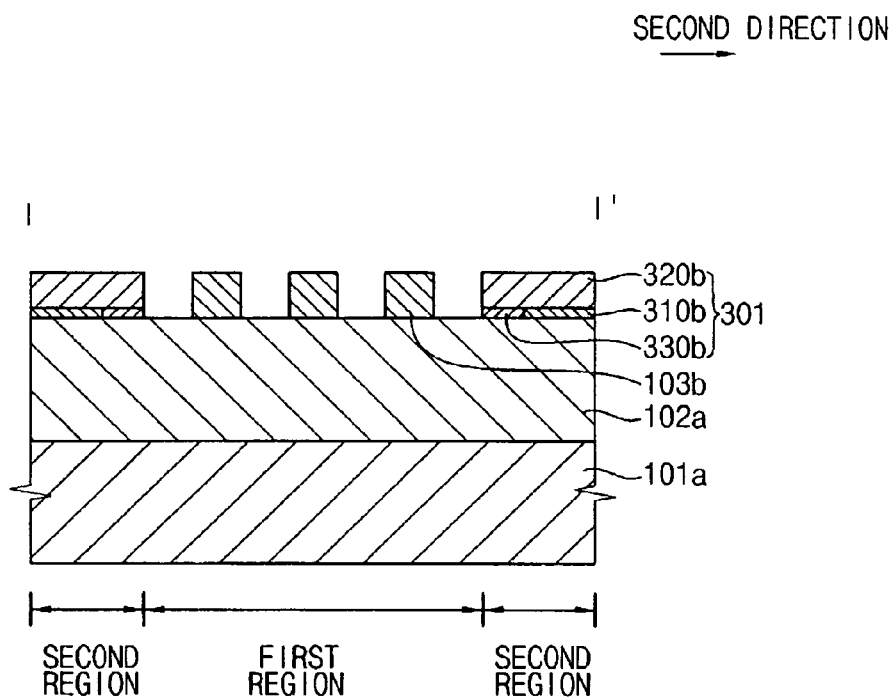
Figure 11C:
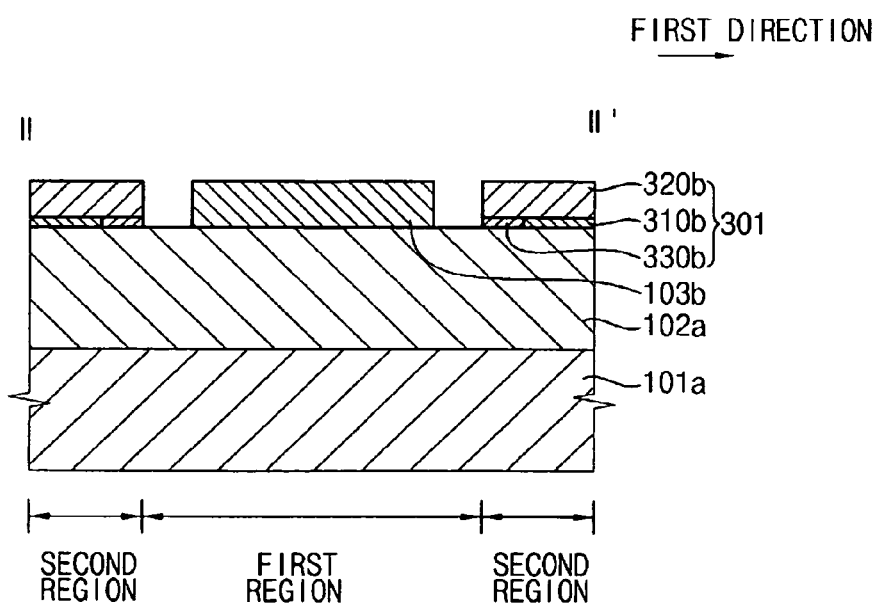

Referring to FIGS. 11A to 11C, an etching process is performed on the third dummy layer 330a so that the third dummy layer pattern 330b located between the second dummy layer pattern 320b and the insulating layer 102a may be formed.

Thus, a dummy structure 301 including the first dummy layer pattern 310a, the second dummy layer pattern 320a and the third dummy layer pattern 330a may be formed on the insulating layer 102a. The dummy structure 301 is spaced apart from the active patterns 103b. The etching process may be an isotropic etching process. For example, the isotropic etching process may be a wet etching process.

Although it is not particularly illustrated in FIGS. 11A to 11C, the second dummy layer pattern 320b and the insulating layer 102a may be partially etched in performing the etching process on the second dummy layer 330a.

Figure 12A:
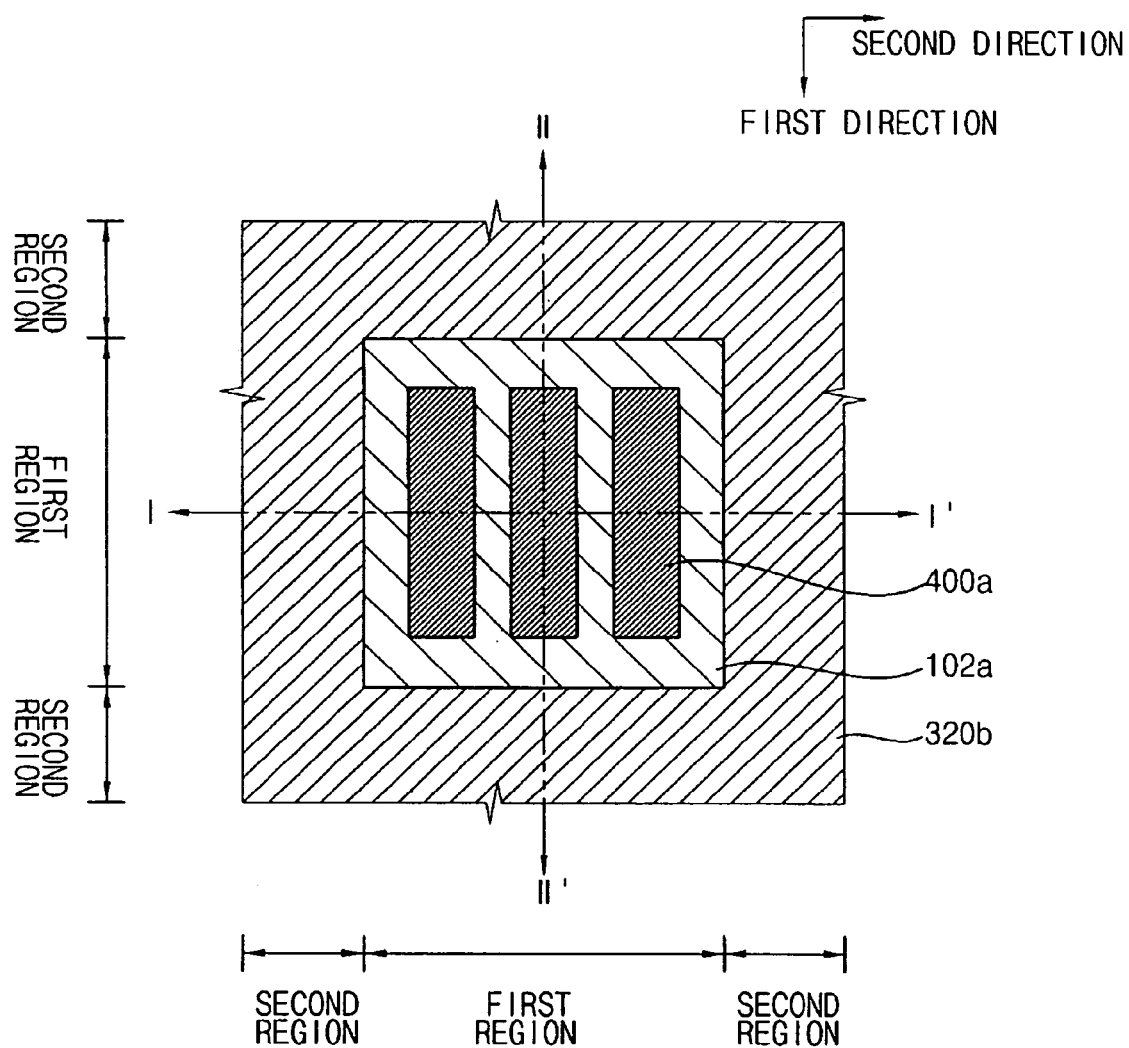
Figure 12B:
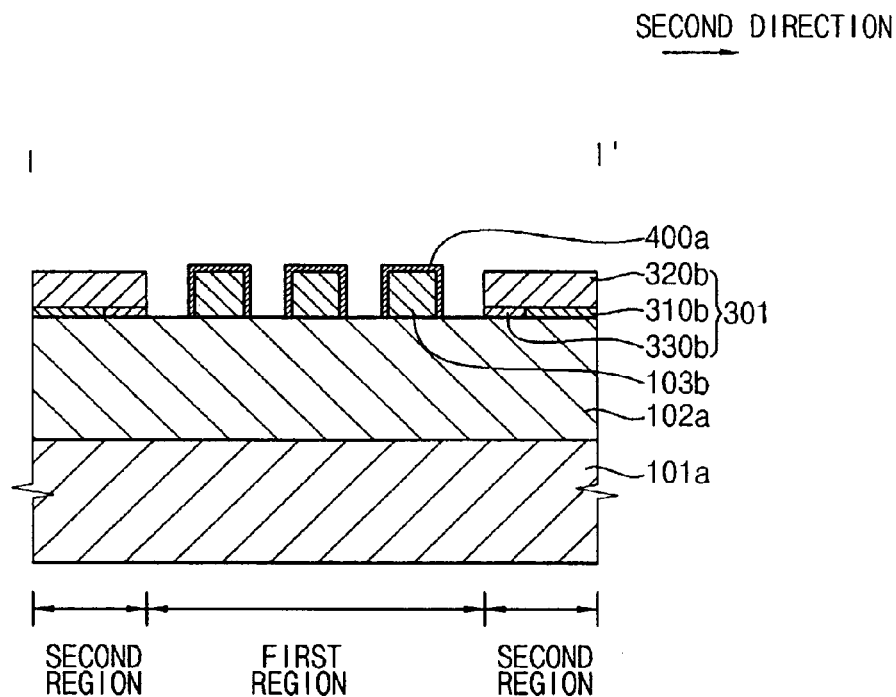
Figure 12C:
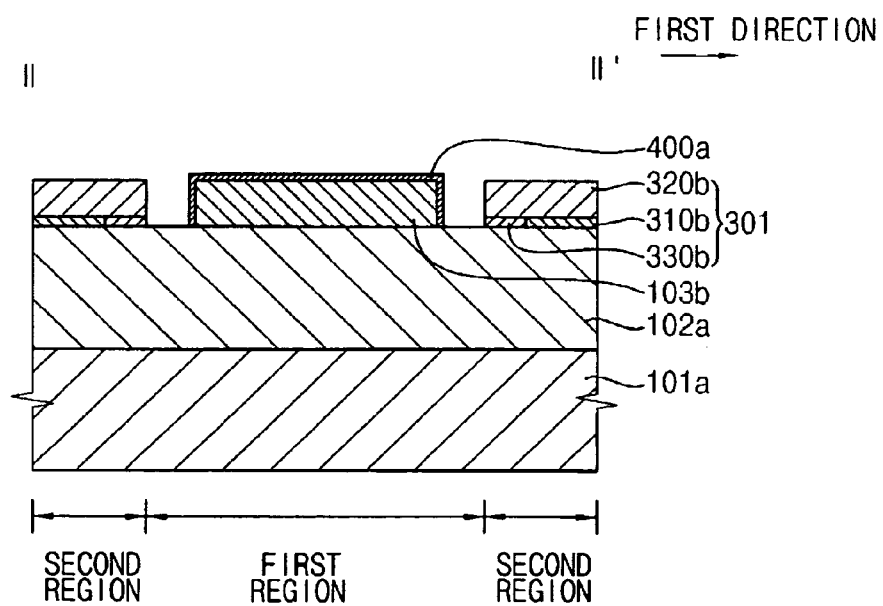

Referring to FIGS. 12A to 12C, a gate dielectric layer 400a is formed on a surface of the active pattern 103b. The gate dielectric layer 400a may be formed by a thermal oxidation process or a chemical vapor deposition process. The gate dielectric layer 400a may include an oxide as a silicon oxide.

An upper face of the dummy structure 301 and upper faces of the gate dielectric layers 400a may be substantially coplanar so that a planarity of a conductive layer 500a (See FIGS. 13A to 13C) subsequently formed may be improved.

Figure 13A:
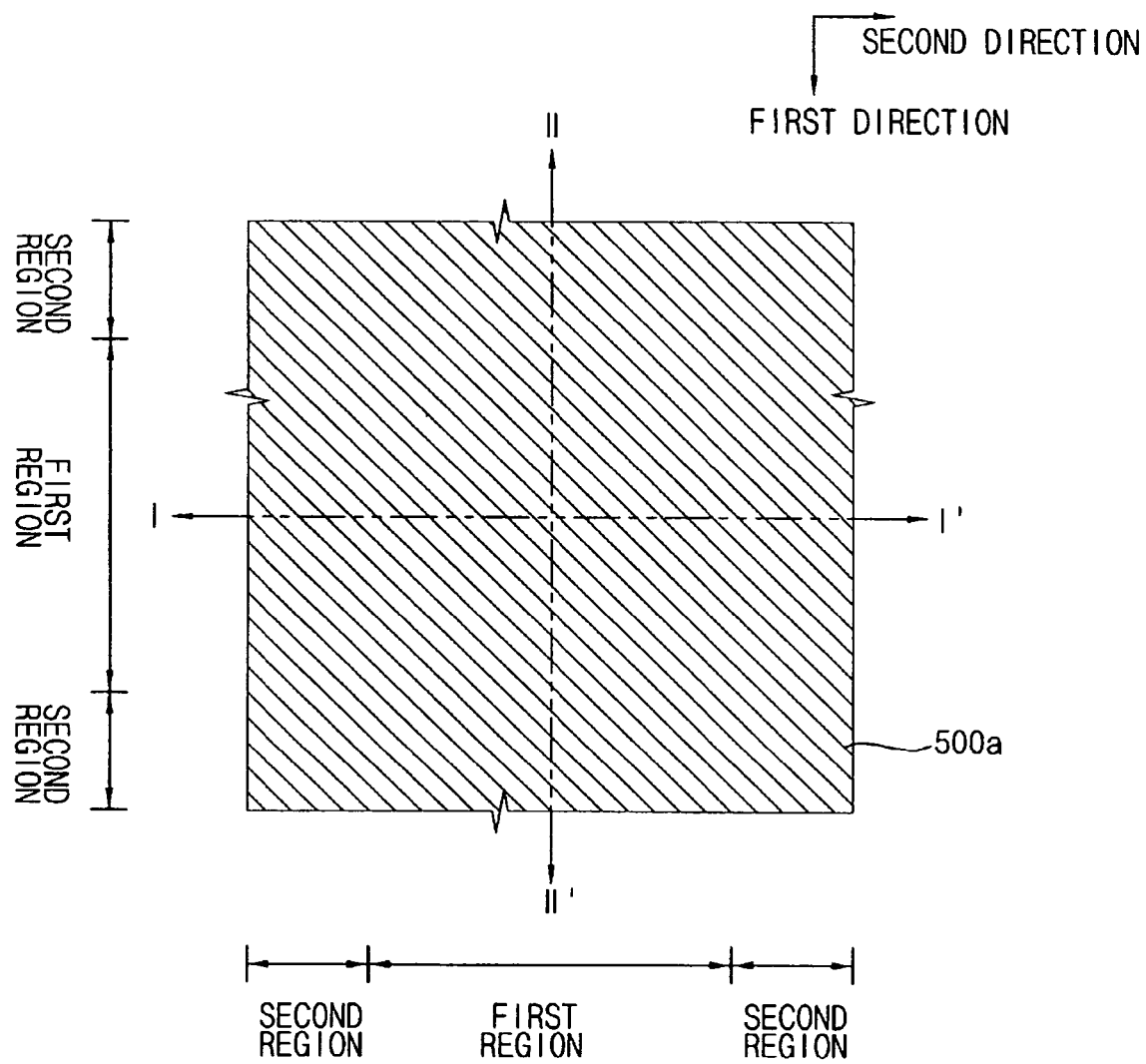
Figure 13B:
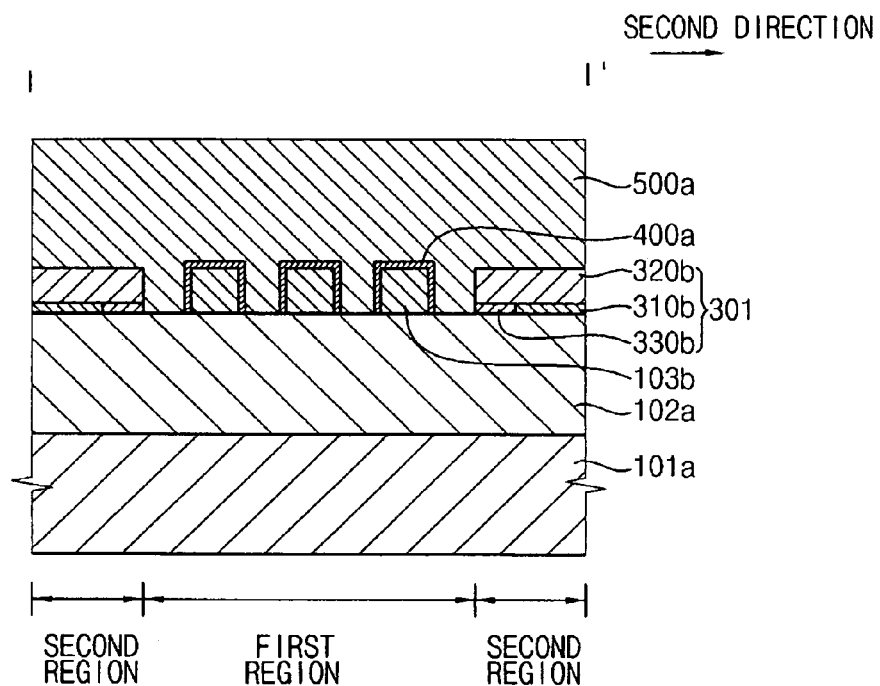
Figure 13C:
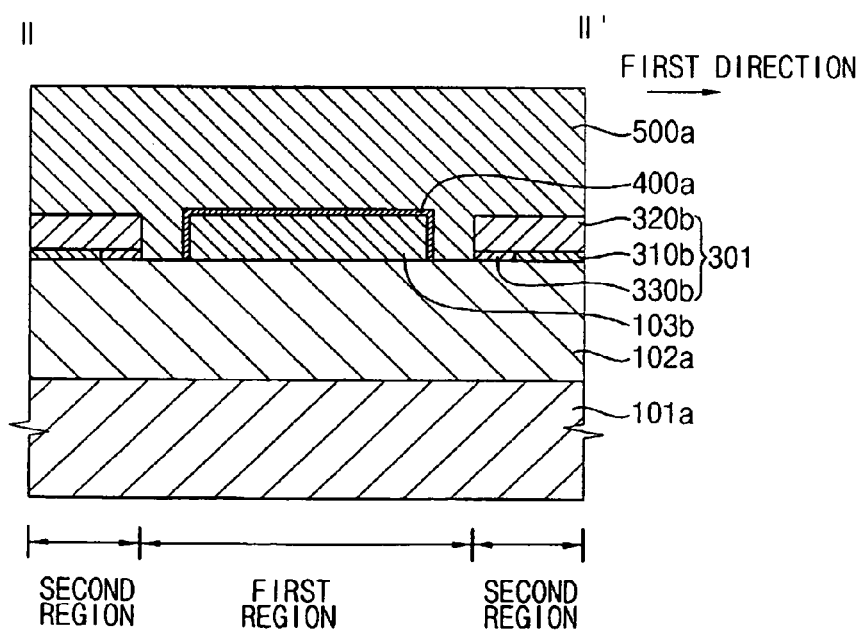

Referring to FIGS. 13A to 13C, the conductive layer 500*a* is formed on the dummy structure 301, a insulating layer 102*a* and the gate dielectric layers 400*a*. The conductive layer 500*a* may include a conductive material such as polysilicon doped with impurities.

Because the conductive layer 500*a* is formed on the dummy structure 301 as well as the gate dielectric layers 400*a*, an upper face of the dummy structure 301 may be relatively flat.

In case that the upper face of the dummy structure 301 is relatively flat, a margin of a photolithography process subsequently performed on the conductive layer 500*a* may efficiently increase.

Figure 14A:
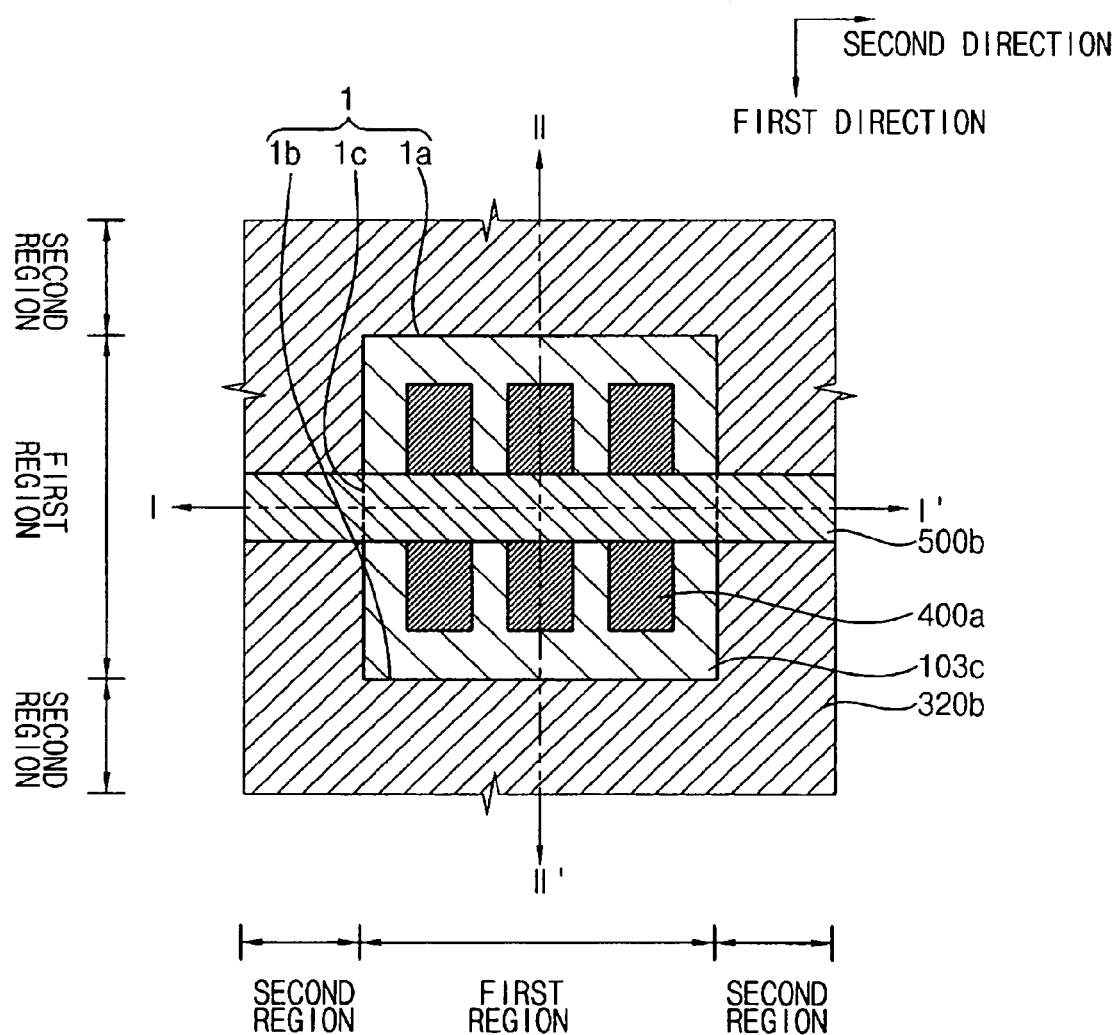
Figure 14B:
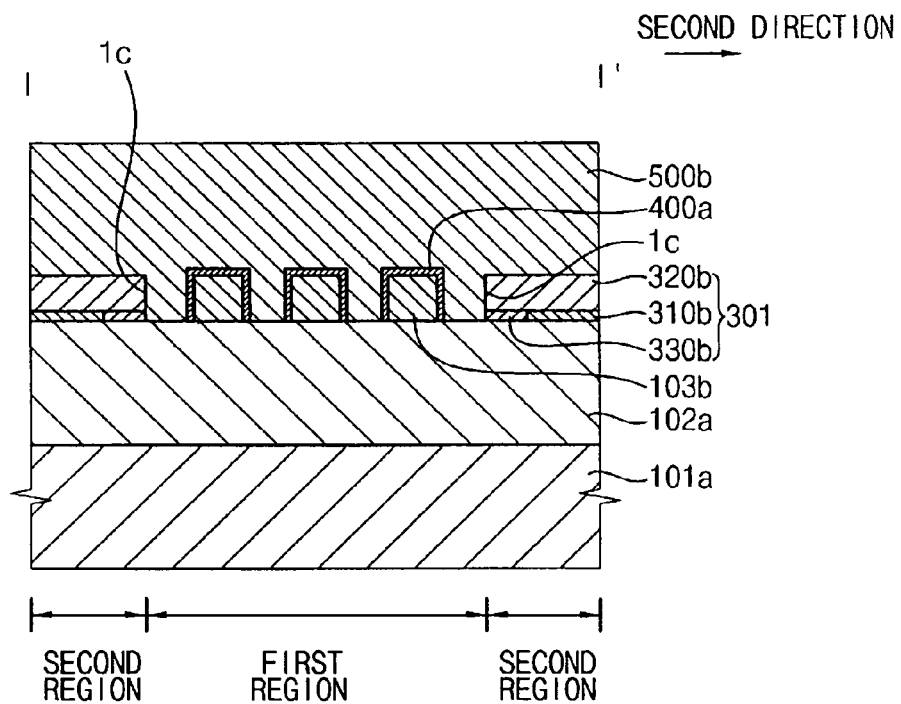
Figure 14C:
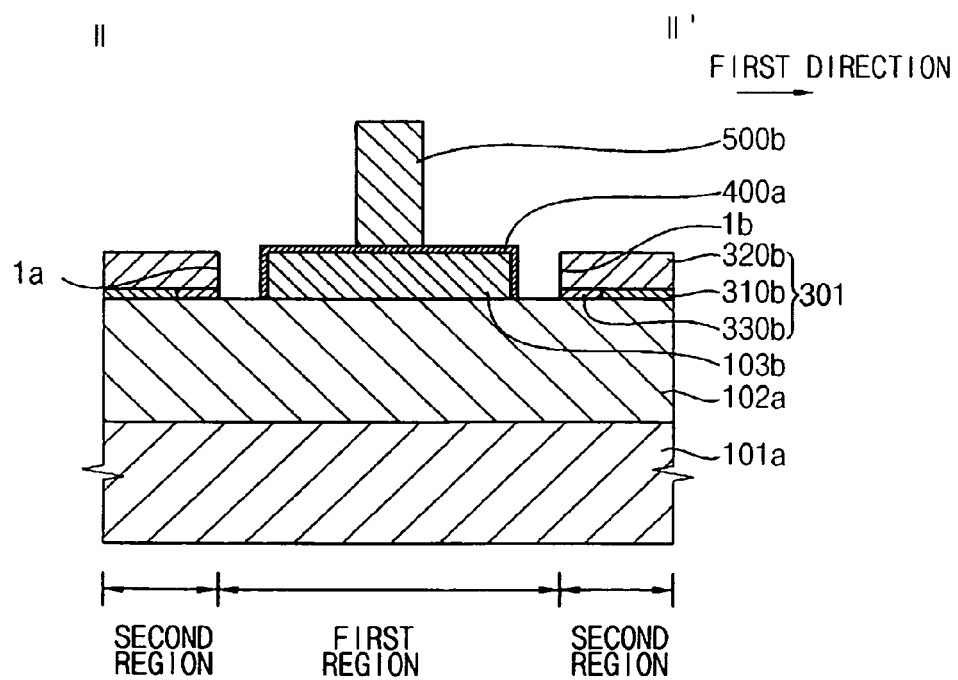

Referring to FIGS. 14A to 14C, the photolithography process is performed on the conductive layer 500*a* so that a gate electrode 500*b* extending in the second direction may be formed on the second dummy layer pattern 320*b*, the third dummy layer pattern 330*b*, the insulating layer 102*a* and the gate dielectric layers 400*a*.

An inner wall 1 of the dummy structure 301 may be divided by a gate electrode 500*b*. Particularly, the inner wall 1 may include a first portion 1*a*, a second portion 1*b* and a third portion 1*c*. The first portion 1*a* may face the second portion 1*b*. The third portion 1*c* makes contact with the gate electrode 500*b*. The third portion 1*c* connects the first portion 1*a* to the second portion 1*b*.

Figure 15A:
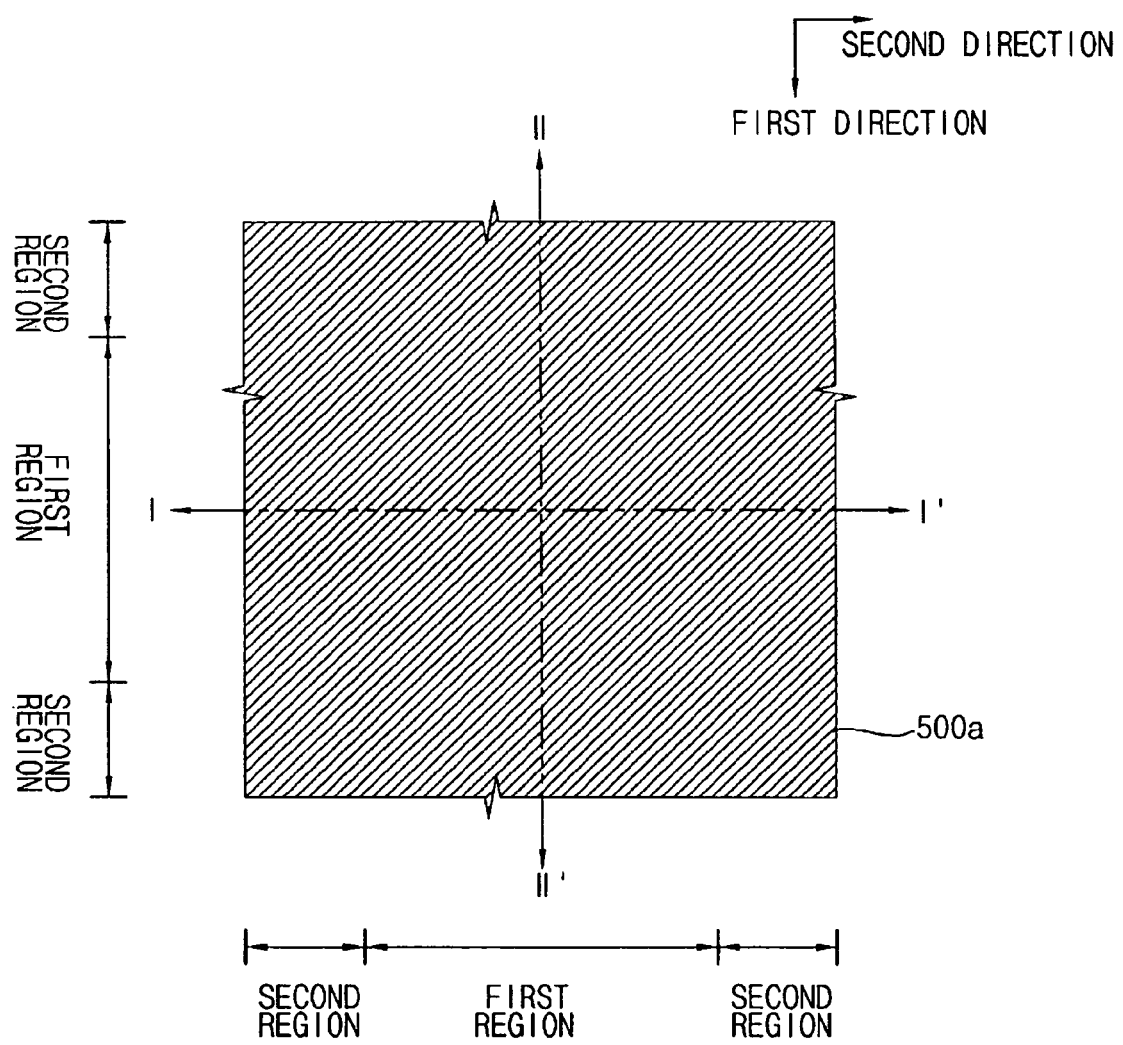
Figure 15B:
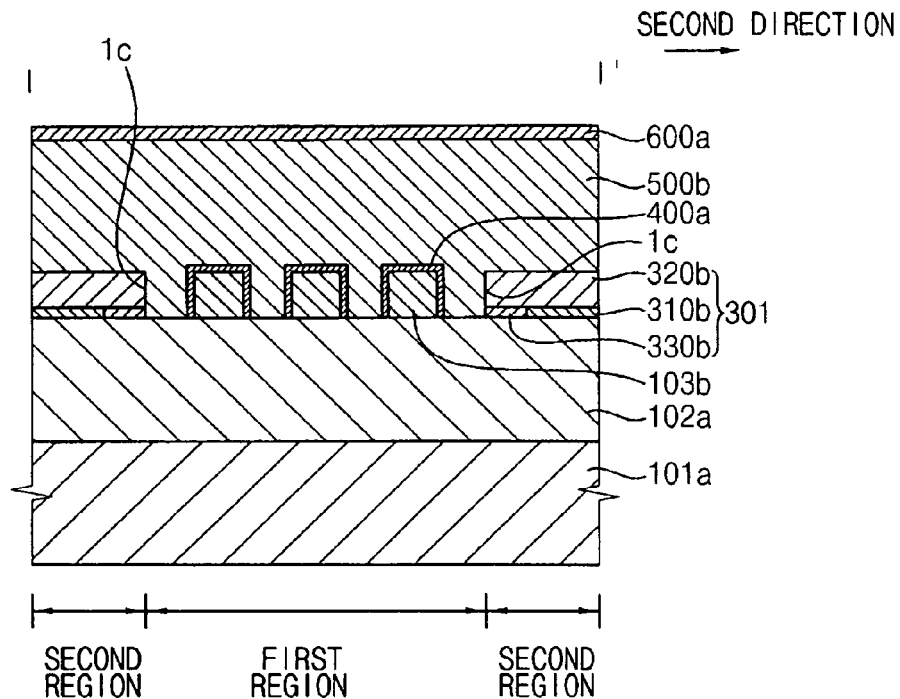
Figure 15C:
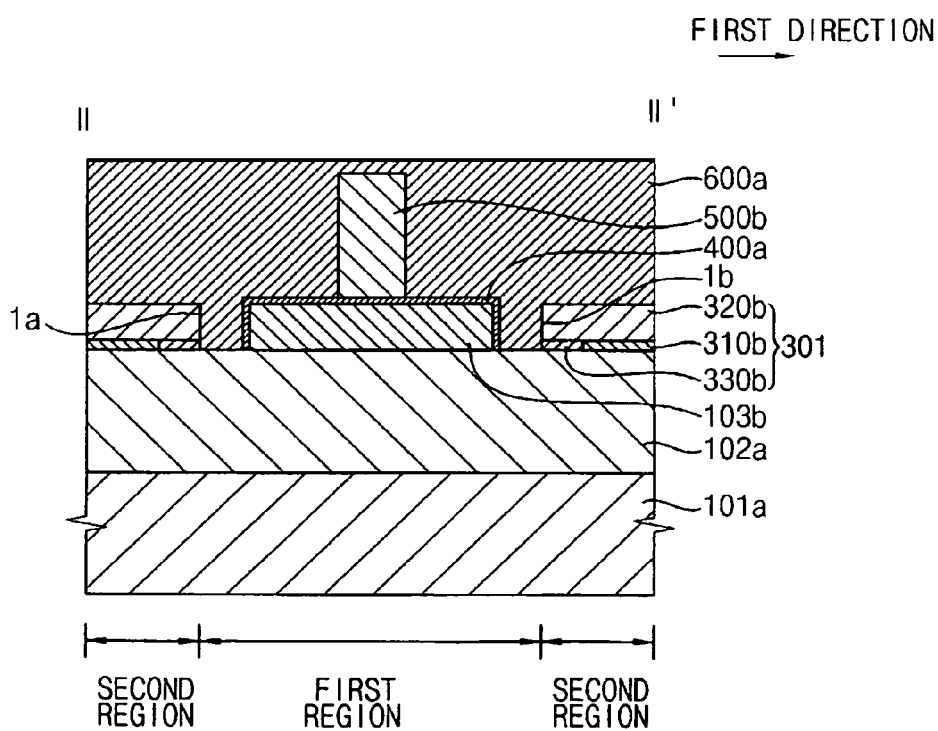

Referring to FIGS. 15A to 15C, an insulation layer 600*a* is formed on the second dummy layer pattern 320*b*, the third dummy layer pattern, the insulating layer 102*a*, the gate dielectric layers 400*a* and the gate electrode 500*b*. The insulation layer 600*a* may include an insulation material such as silicon nitride. The insulation layer 600*a* may be formed by a chemical vapor deposition process.

Figure 16A:
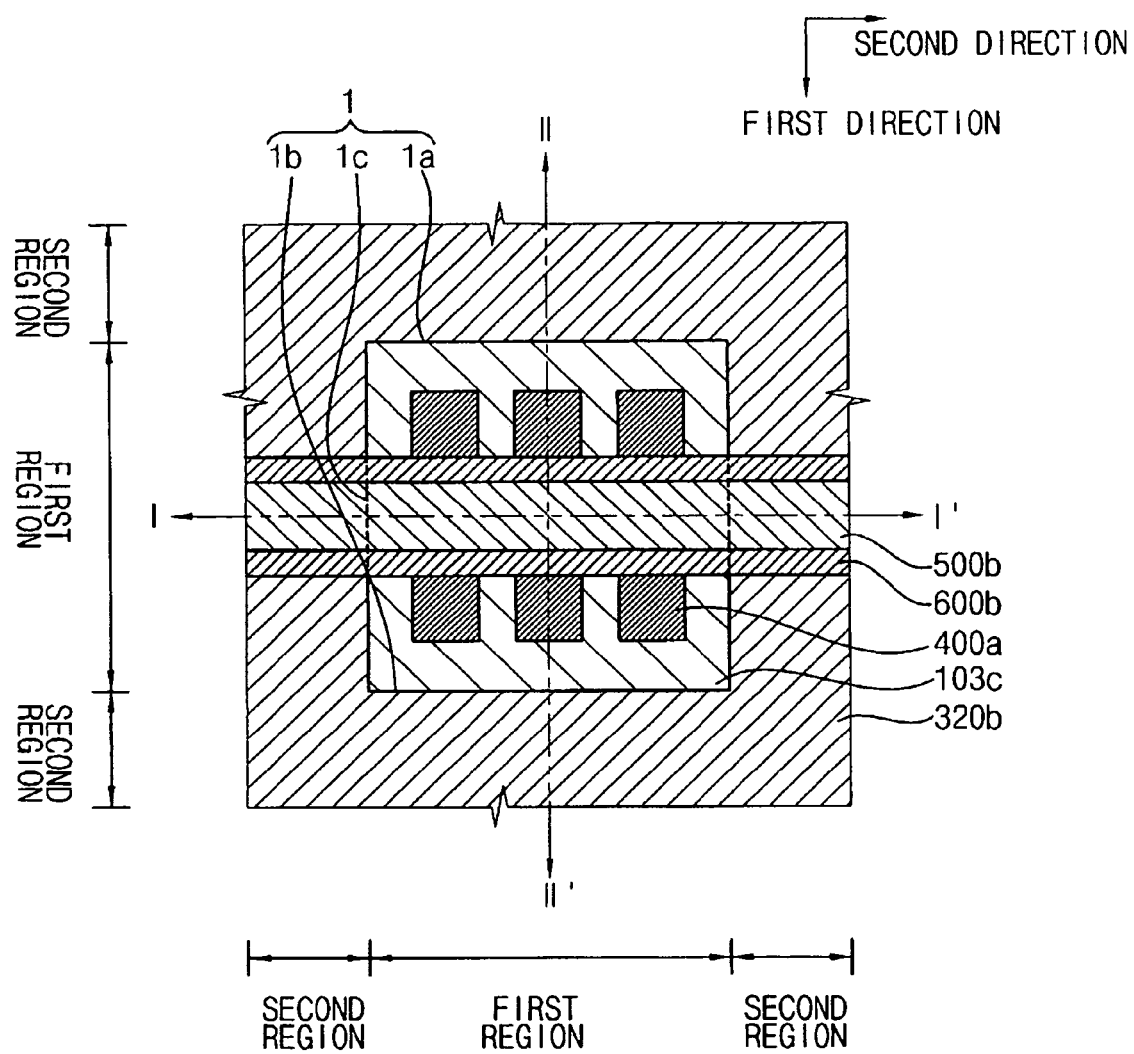
Figure 16B:
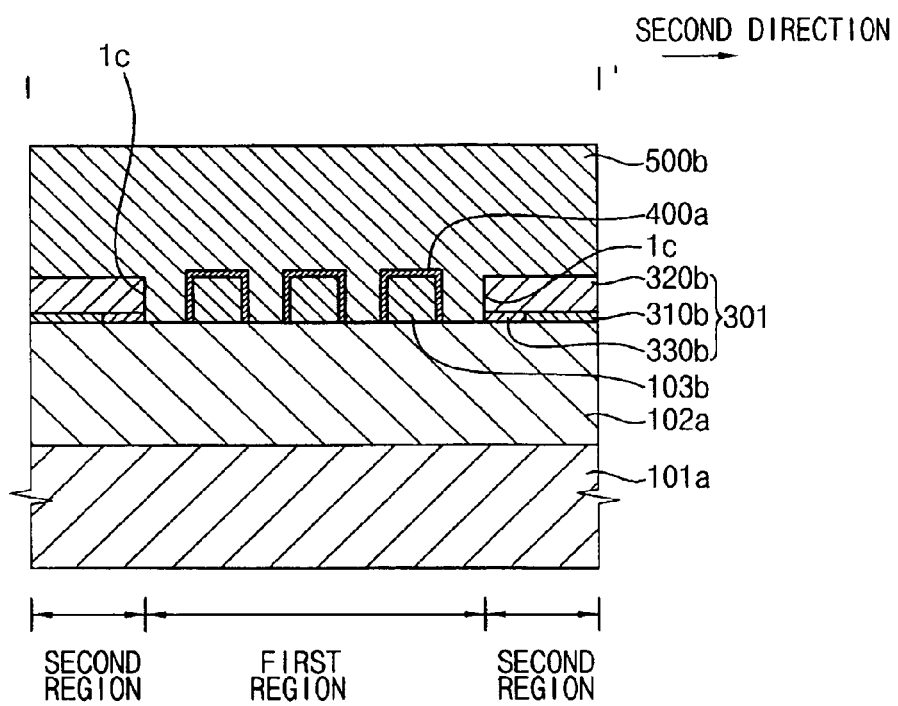
Figure 16C:
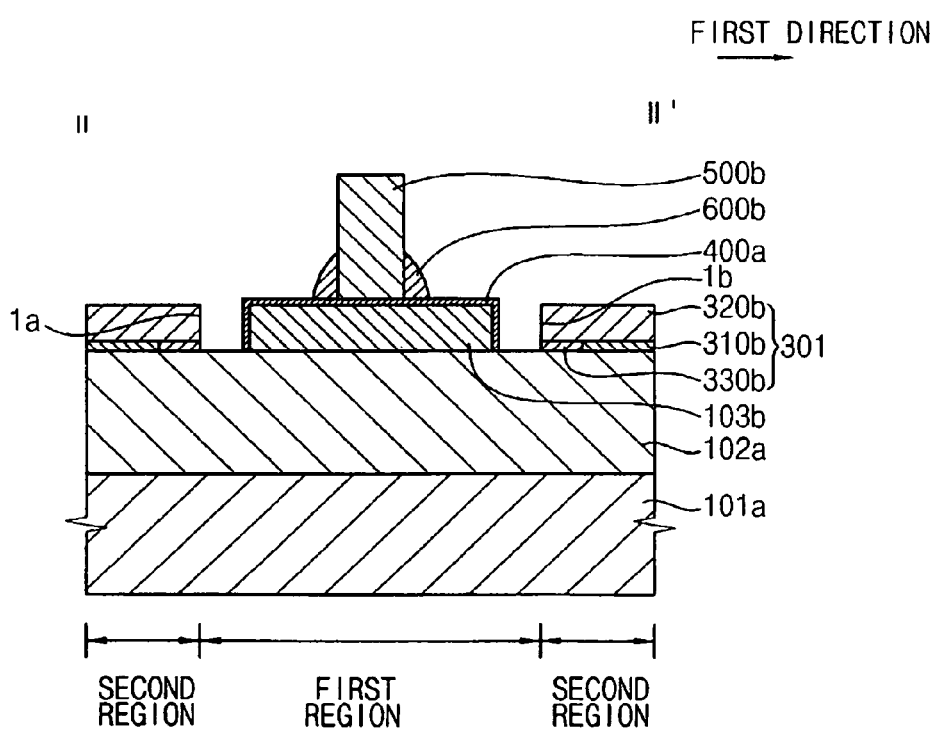

Referring to FIGS. 16A to 16C, the insulation layer 600*a* is partially etched so that spacer 600*b* may be formed on a sidewall of the gate electrode 500*b*.

Figure 17A:
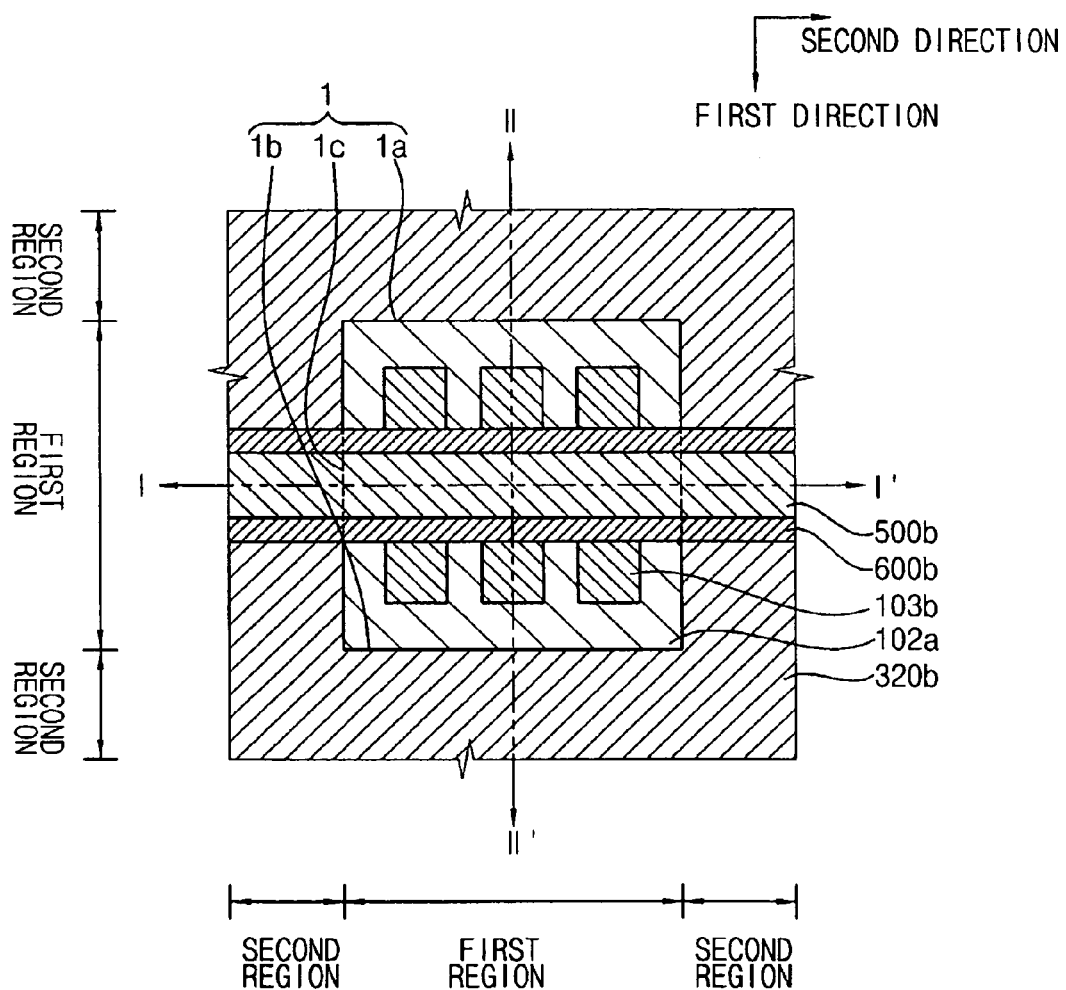
Figure 17B:
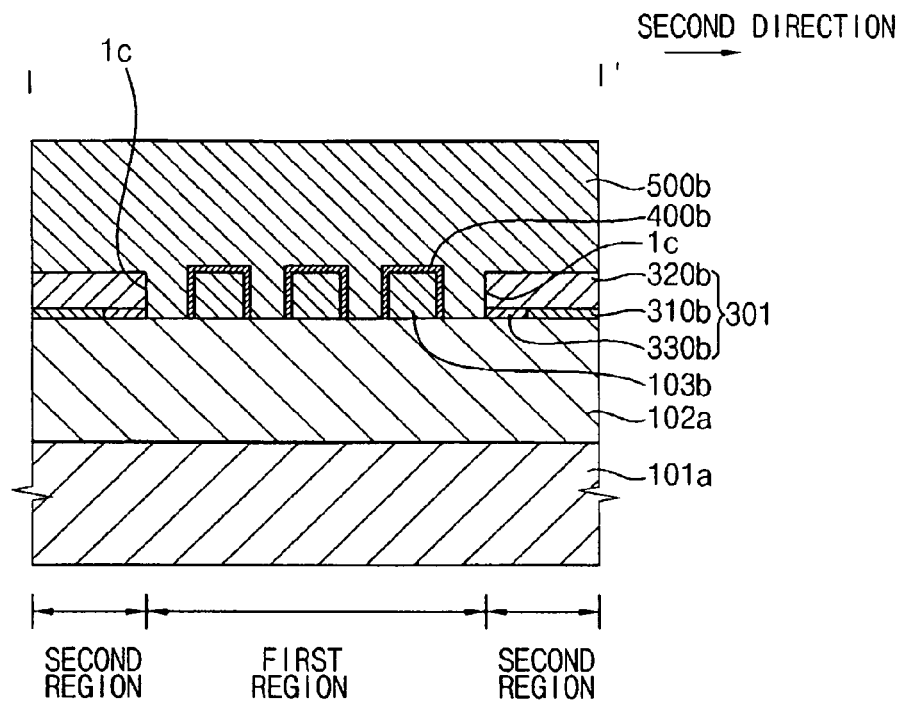
Figure 17C:
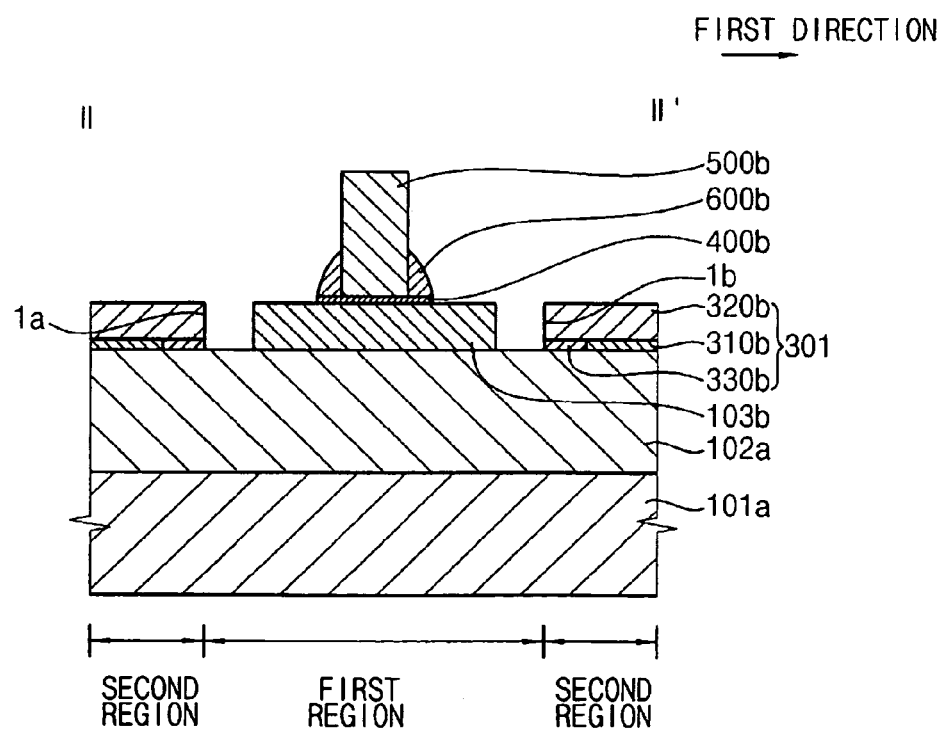
Figure 18A:
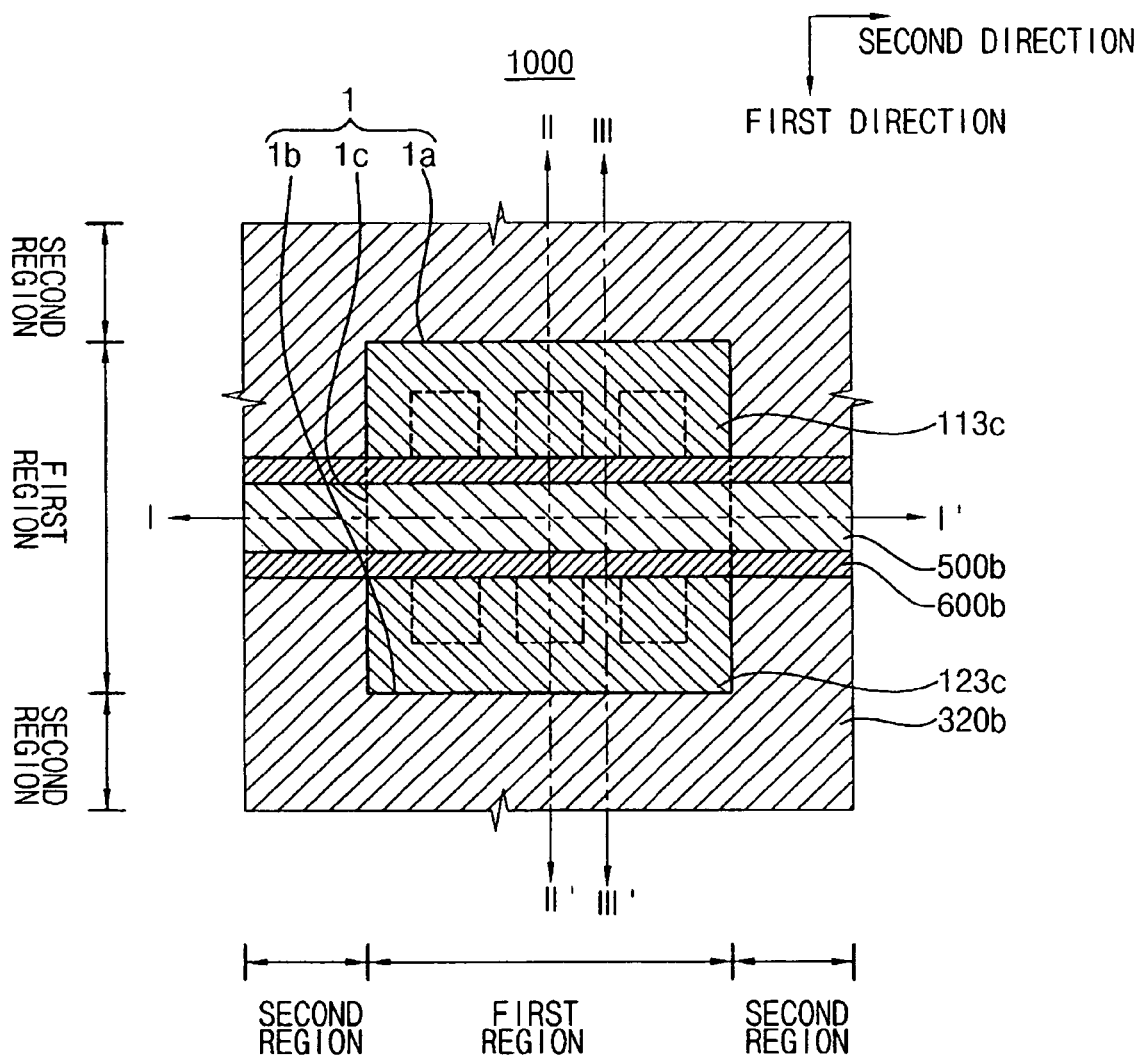
Figure 18B:
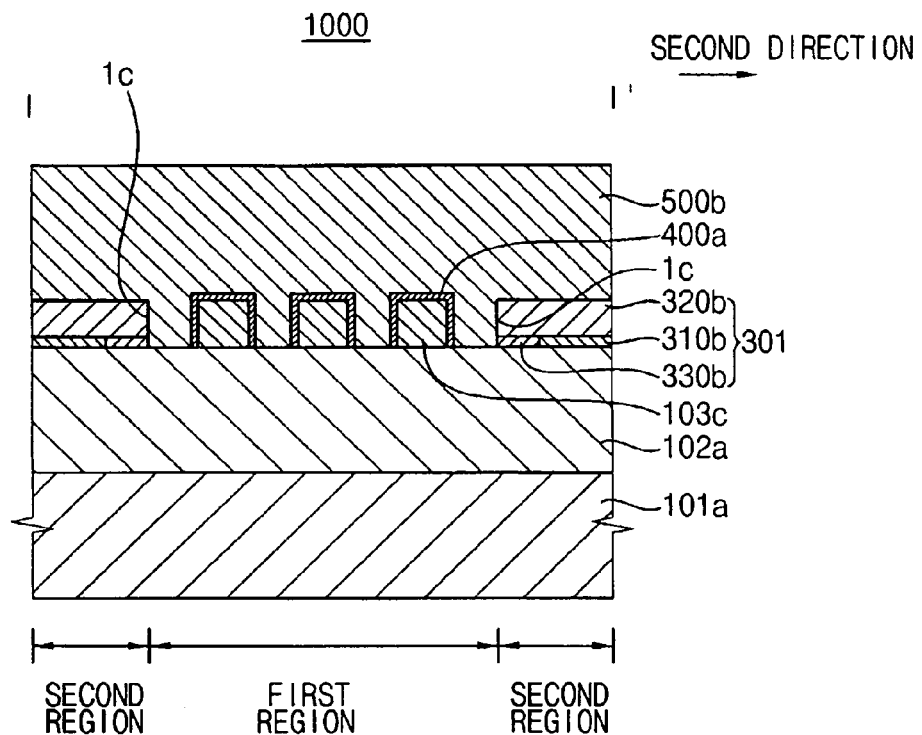
Figure 18C:
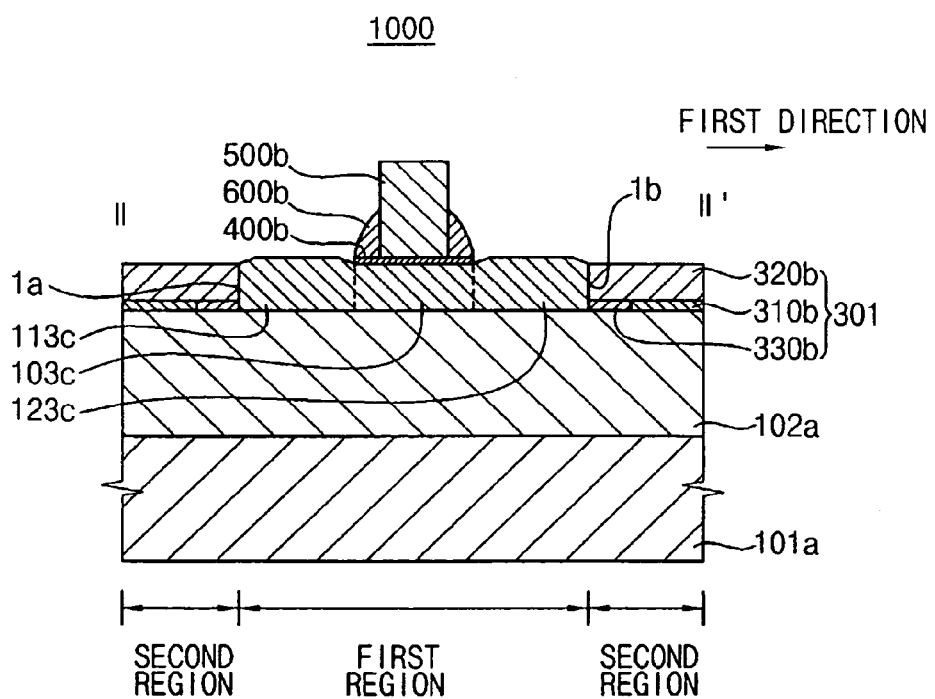
Figure 18D:
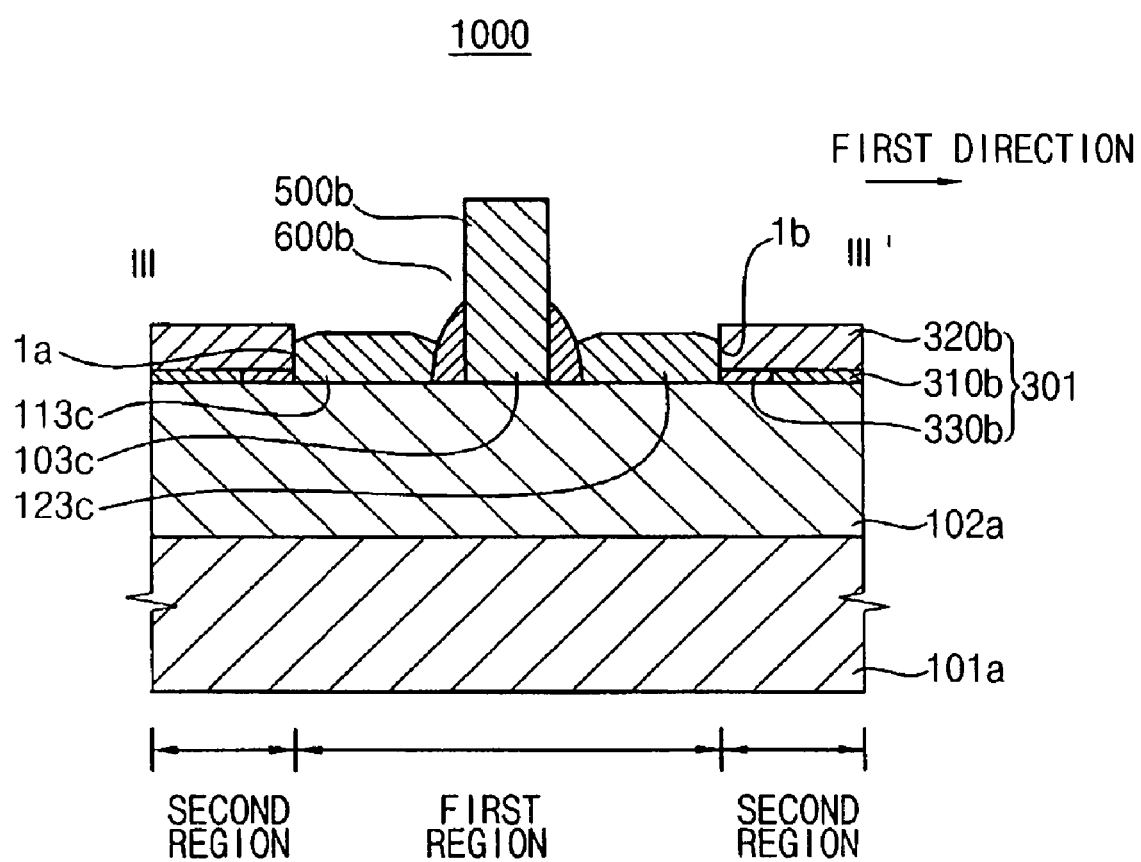
FIG. 18D is a cross-sectional view taken along line III-III' of FIG. 18A.

Referring to FIGS. 17A to 17C, portions of the gate dielectric layers 400*a*, the portions being exposed by the spacer 600*b*, are removed so that gate dielectric patterns 40*b* located under the gate electrode 500*b* and the spacer 600*b* may be formed.

End portions of the active patterns 103*b* may be exposed by the gate dielectric layer patterns 400*b*. On the other hand, central portions of the active patterns 103*b*, the central portions being connected between the end portions, may be covered with the gate dielectric layer patterns 400*b*. The central portions of the active patterns 103*b* may correspond to channel structures 103*c*.

Thereafter, an implantation process may be performed so that impurities may be implanted into the end portions of the active patterns 103*b*. However, the implantation process may be optional such that the implantation process may be omitted.

Referring to FIGS. 18A to 18D, an epitaxial process is performed using the end portions of the active patterns 103*b* as seeds so that a predetermined first source/drain structure (not shown) and a predetermined second source/drain structure (not shown) may be formed. Here, the dummy structure 301 may serve as a barrier preventing the preliminary first and second source/drain structures from being exceedingly grown.

The channel structures 103*c* are connected between the preliminary first source/drain structure and the preliminary second source/drain structure. The preliminary first and second source/drain structures contact the dummy structure 301, the insulating layer 102*a*, the spacer 600*b* and the channel structures 103*c*.

Impurities are doped into the preliminary first and second source/drain structures so that the first and second source/drain structures 113*c* and 123*c* may be formed. Thus, a transistor 1000 may be manufactured.

The impurities may be doped into the preliminary first and second source/drain structure while the epitaxial process is performed. Alternatively, the impurities may be doped into the preliminary first and second source/drain structure after the epitaxial process is performed.

Figure 19A:
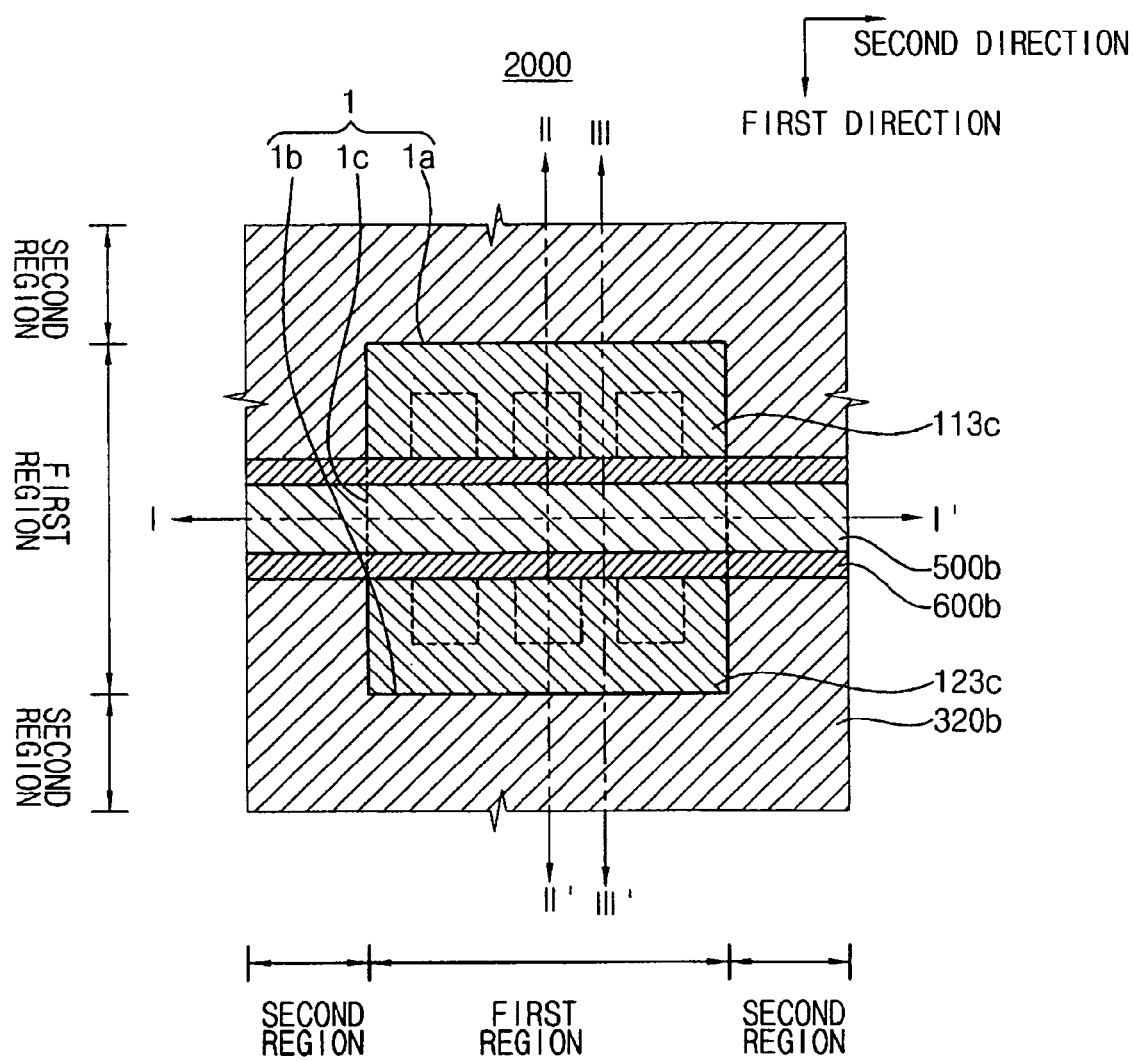
FIG. 19A is a plan view illustrating a transistor in accordance with an embodiment of the present invention.
Figure 19B:
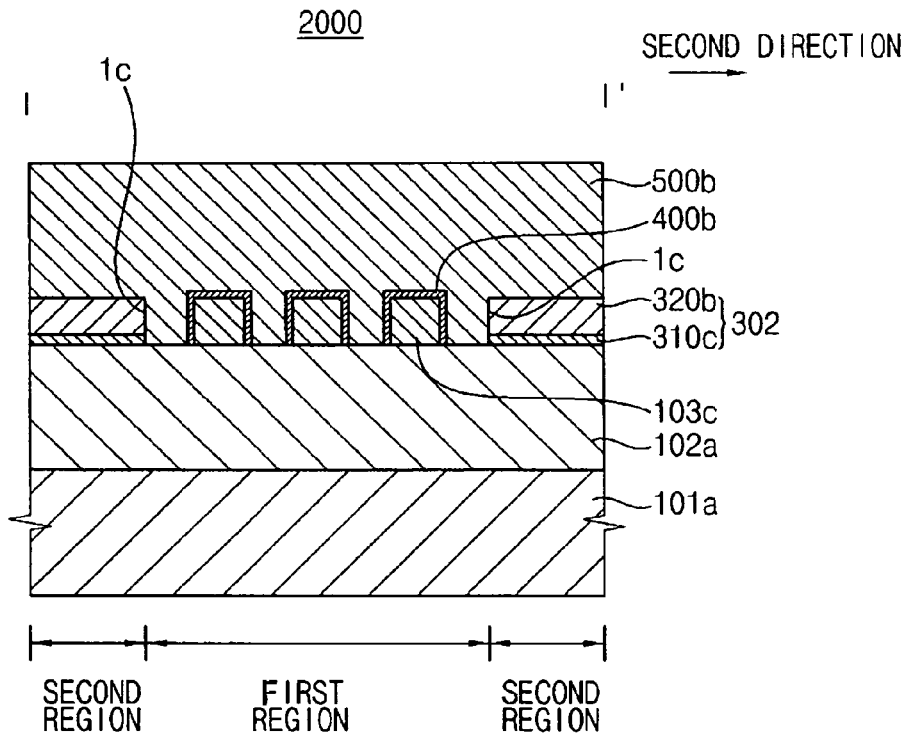
FIG. 19B is a cross-sectional view taken along line I-I' in FIG. 19A.
Figure 19C:
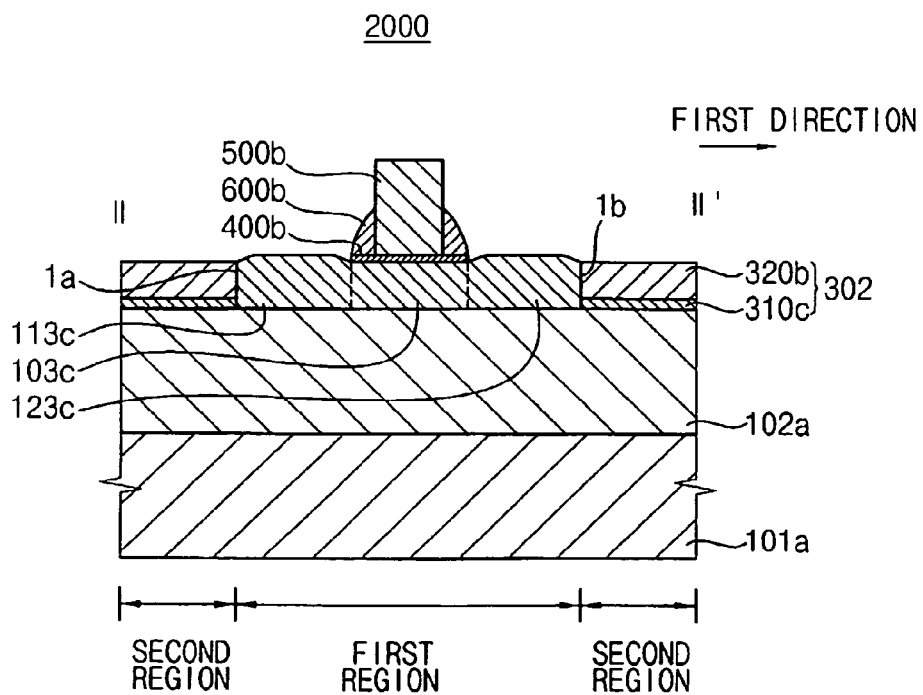
FIG. 19C is a cross-sectional view taken along line II-II' in FIG. 19A.
Figure 19D:
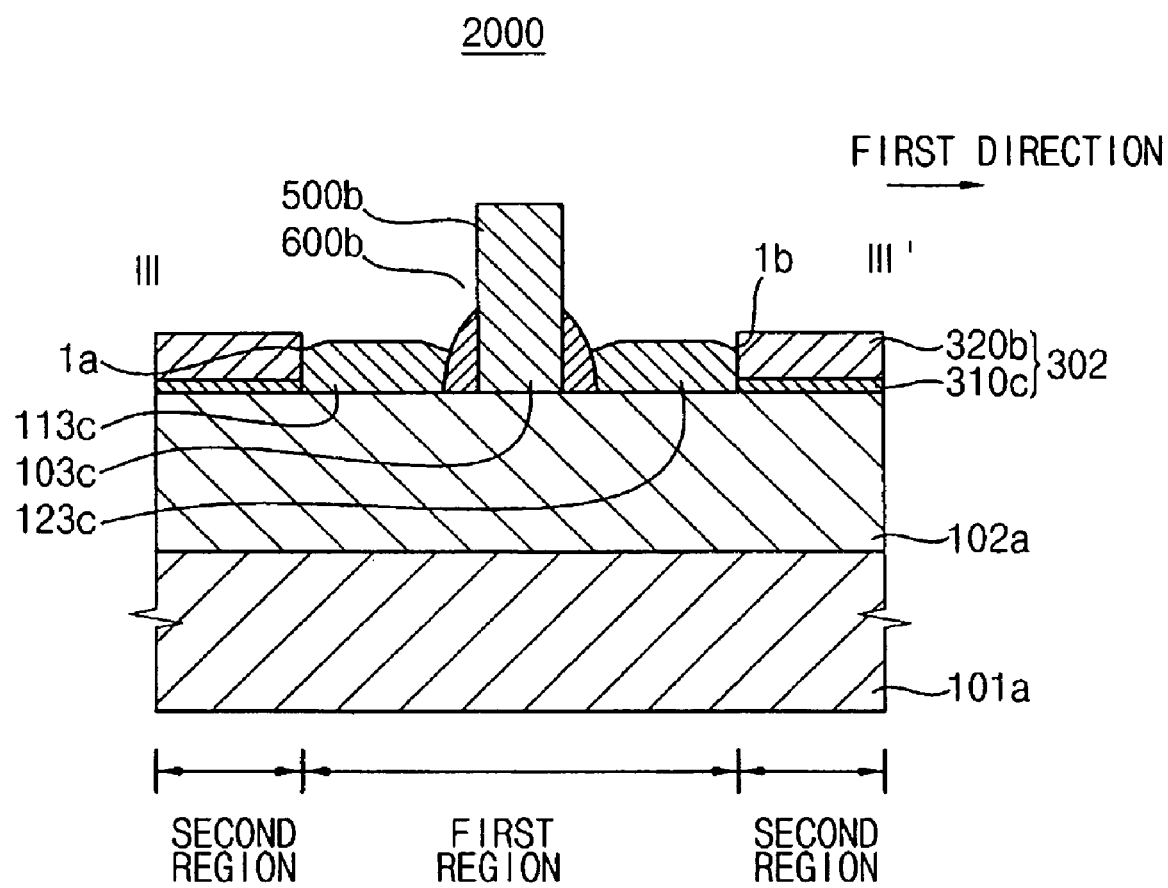
FIG. 19D is a cross-sectional view taken along line III-III' in FIG. 19A.

FIG. 19A is a plan view illustrating transistors in accordance with some embodiments of the present invention. FIG. 19B is a cross-sectional view taken along line I-I' in FIG. 19A. FIG. 19C is a cross-sectional view taken along line II-II' in FIG. 19A. FIG. 19D is a cross-sectional view taken along line III-III' in FIG. 19A.

The transistor 2000 in FIGS. 19A to 19D is substantially the same as the transistor 1000 illustrated in FIGS. 1A to 1D except for a dummy structure 302. Thus, any repetitive description will be omitted. In addition, the same reference numerals will be used to refer to the same parts as those described in FIGS. 1A to 1D.

Referring to FIGS. 19A to 19D, the transistor 2000 includes an insulating layer 102*a*, a dummy structure 302, a first source/drain structure 113*c*, a second source/drain structure 123*c*, a channel structure 103*c*, a gate dielectric layer pattern 400*b* and a gate electrode 500*b*.

The dummy structure 302 includes a first dummy layer pattern 310*c* and a second dummy layer pattern 320*c*. The first dummy layer pattern 310*c* is formed on the second region so that the first dummy layer pattern 310*c* may enclose the first region. The second dummy layer pattern 310*b* may be formed on the first dummy layer pattern 310*c*.

Hereinafter, methods of manufacturing the transistor 2000 will be described.

FIGS. 20A, 21A, 22A, 23A, 24A, 25A, 26A and 27A are plan views illustrating the methods of manufacturing transistor 2000. FIGS. 20B, 21B, 22B, 23B, 24B, 25B, 26B and 27B are cross-sectional views taken along line I-I' in FIGS. 20A, 21A, 22A, 23A, 24A, 25A, 26A and 27A, respectively. FIGS. 20C, 21C, 22C, 23C, 24C, 25C, 26C and 27C are cross-sectional views taken along line II-II' in FIGS. 20A, 21A, 22A, 23A, 24A, 25A, 26A and 27A, respectively. FIG. 27D is a cross-sectional view taken along line III-III' in FIG. 27A.

The transistor 2000 may be manufactured by processes substantially the same as those illustrated in FIGS. 2A to 18D except for forming the dummy structure 302. Thus, any repetitive description will be omitted. In addition, the same reference numerals will be used in FIGS. 20A to 27D to refer to the same parts as those described in FIGS. 2A to 18D.

Figure 20A:
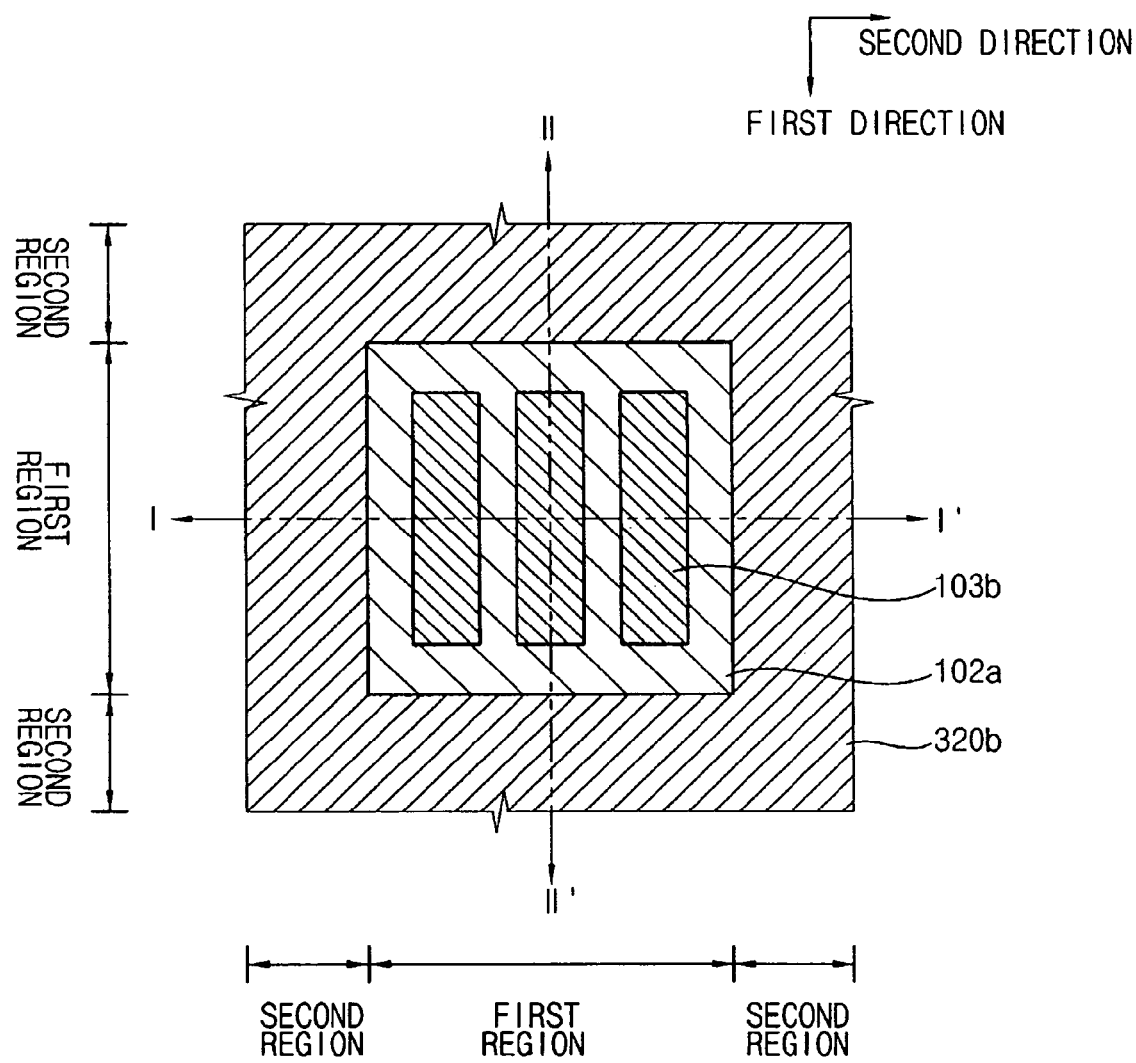
FIGS. 20A, 21A, 22A, 23A, 24A, 25A, 26A and 27A are plan views illustrating a method of manufacturing the transistor in FIGS. 19A to 19D.
Figure 20B:
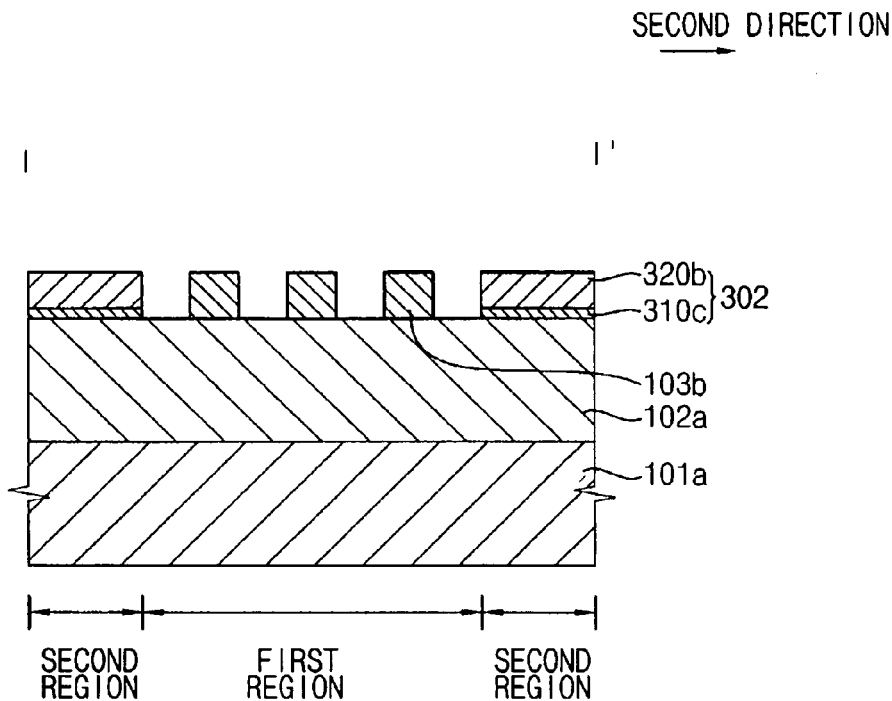
FIGS. 20B, 21B, 22B, 23B, 24B, 25B, 26B and 27B are cross-sectional views taken along lines II-II' of FIGS. 20A, 21A, 22A, 23A, 24A, 25A, 26A and 27A, respectively.
Figure 20C:
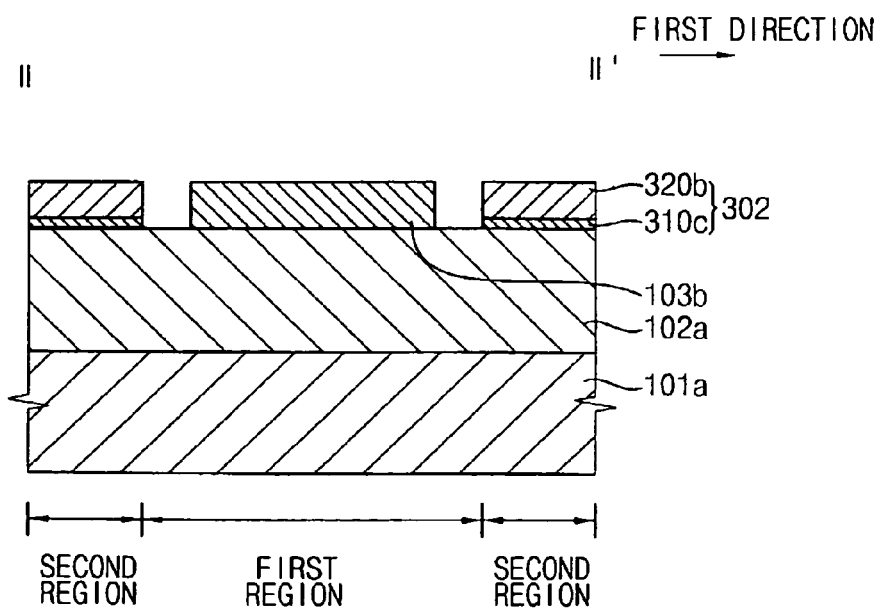
FIGS. 20C, 21C, 22C, 23C, 24C, 25C, 26C and 27C are cross-sectional views taken along lines II-II' of FIGS. 20A, 21A, 22A, 23A, 24A, 25A, 26A and 27A, respectively.

Referring to FIGS. 20A to 20C, an etching process is performed on the first dummy layer 310 so that a first dummy layer pattern 310*c* may be formed between the insulating layer 102*a* and the second dummy layer pattern 320*b*. Thus, a pattern structure 302 including the first dummy layer pattern 310*c* and the second dummy layer pattern 320*b* may be formed on a second region.

Figure 21A:
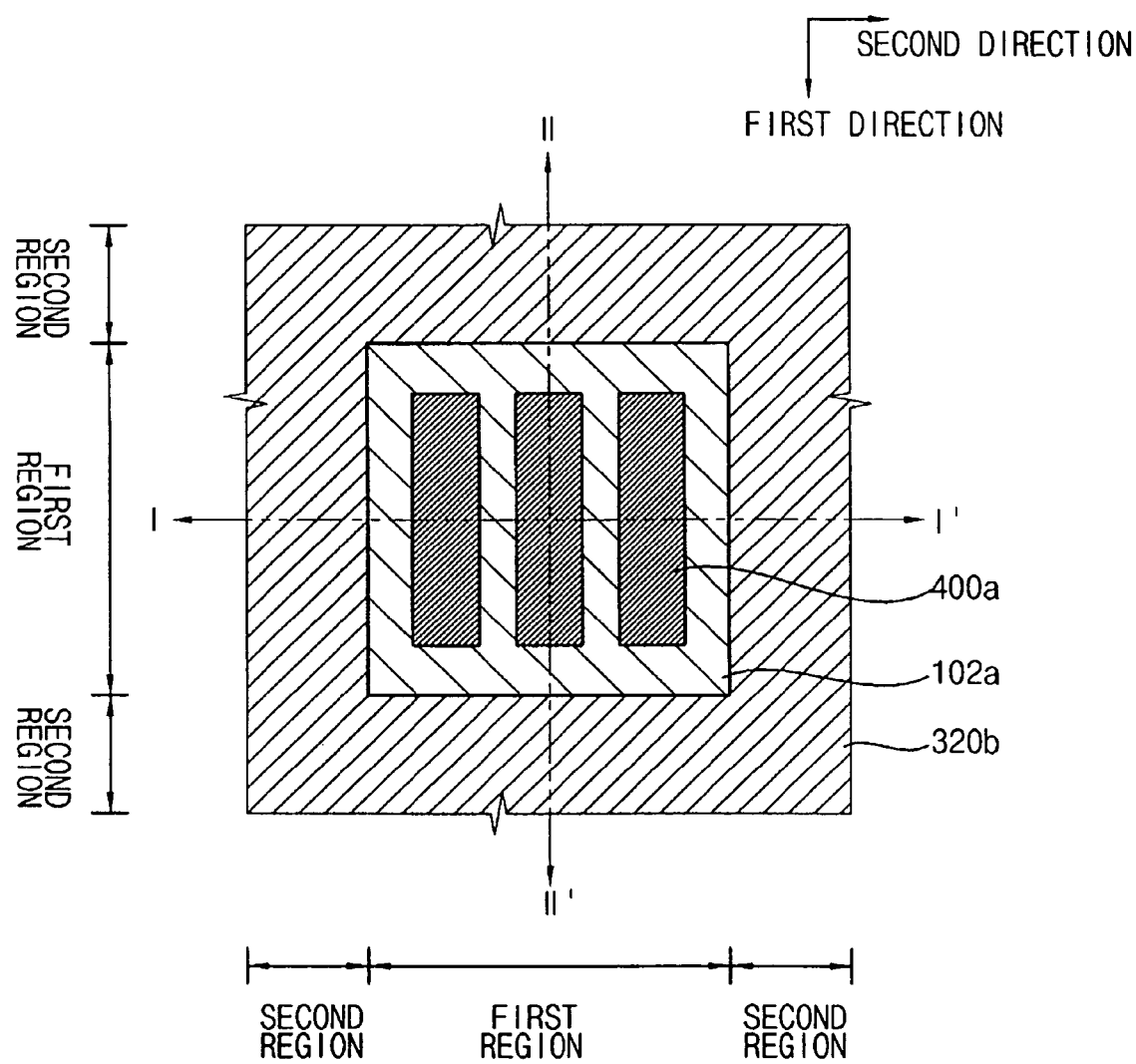
Figure 21B:
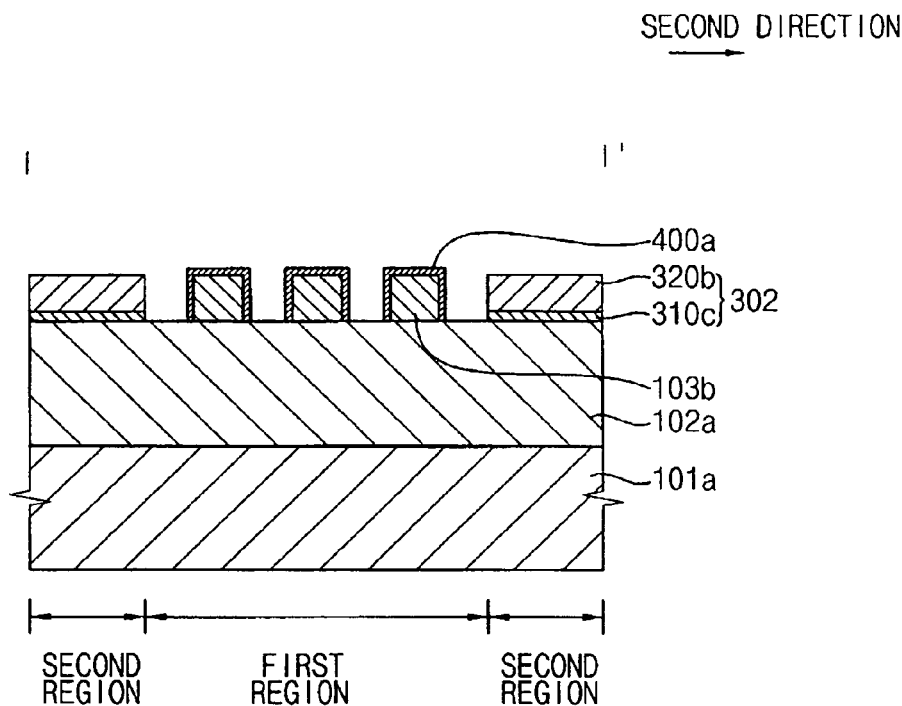
Figure 21C:
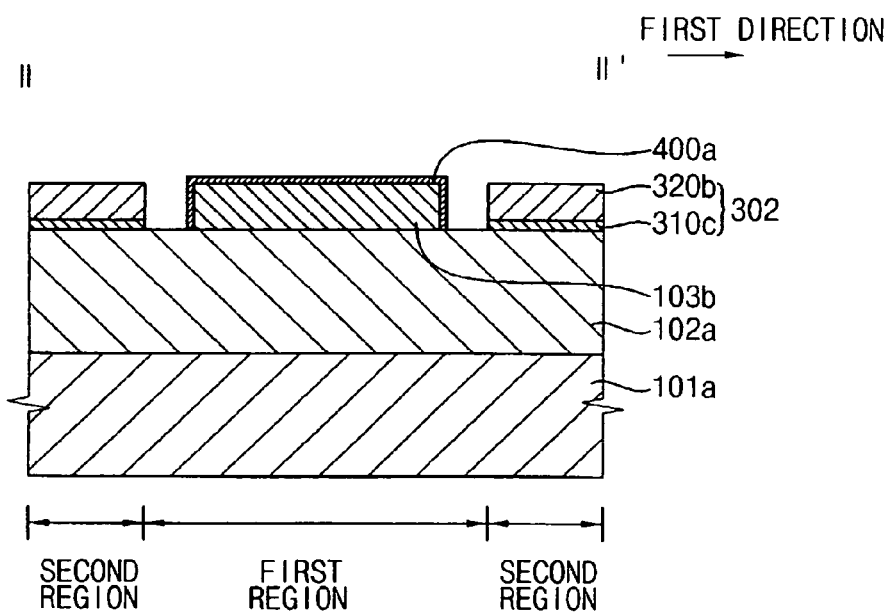

Referring to FIGS. 21A to 21C, a gate dielectric layer 400*a* is formed on a surface of the active patterns 103*b*.

Figure 22A:
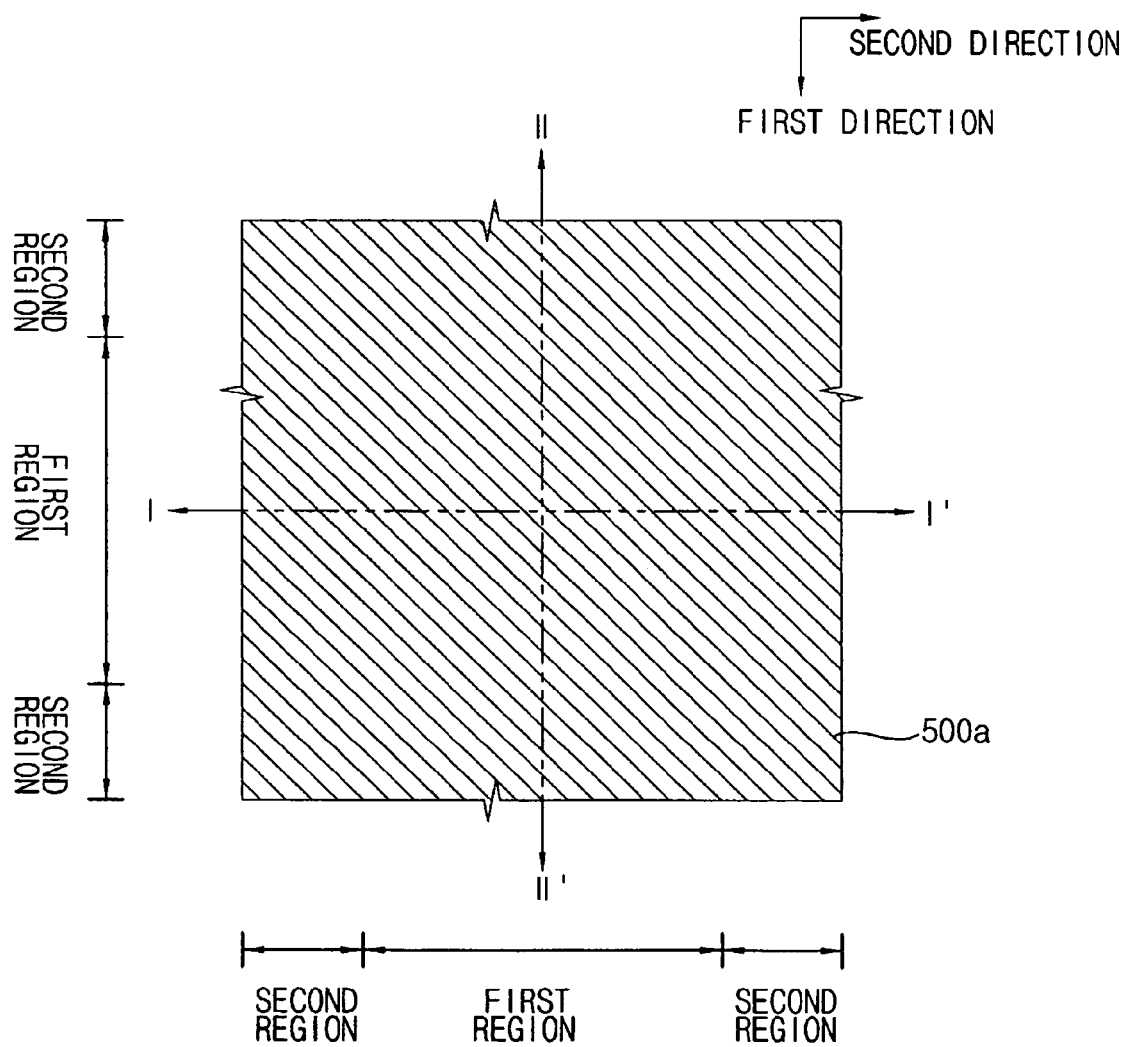
Figure 22B:
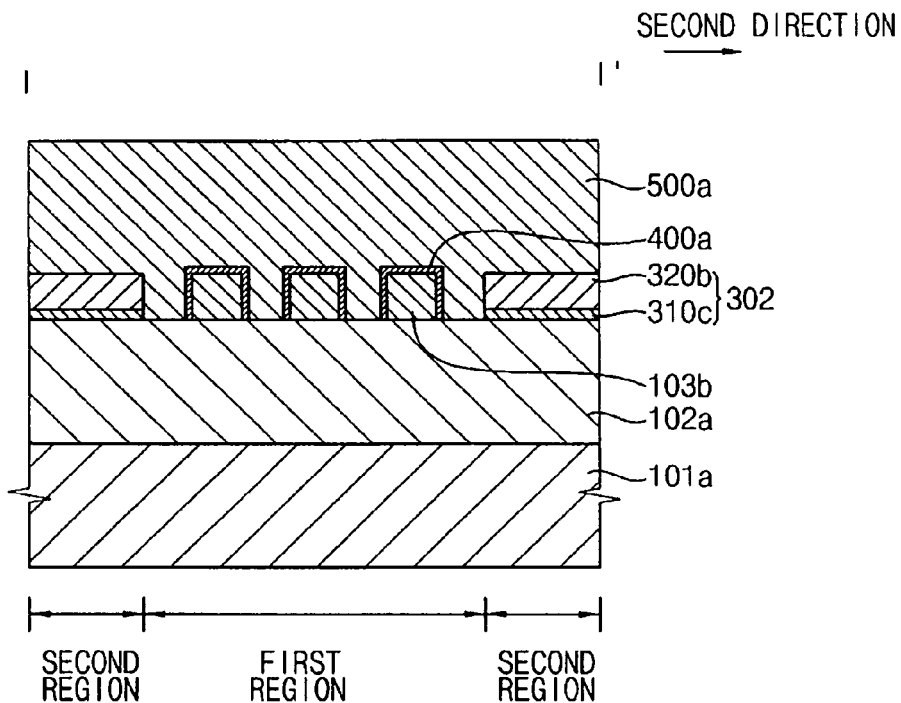
Figure 22C:
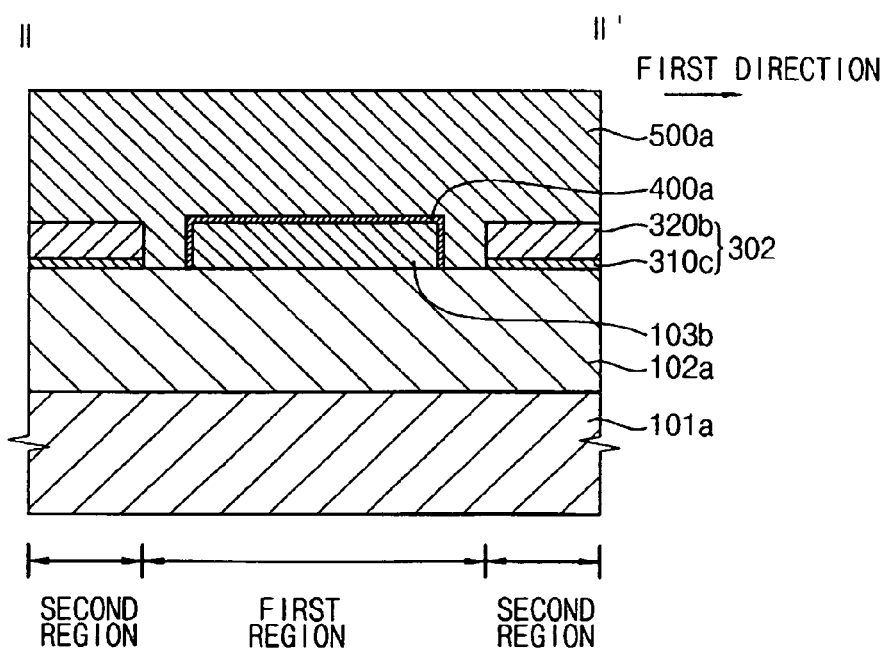

Referring to FIGS. 22A to 22C, a conductive layer 500A is formed on the dummy structure 302, the second oxide layer 102*a* and the gate dielectric layers 400*a*.

Figure 23A:
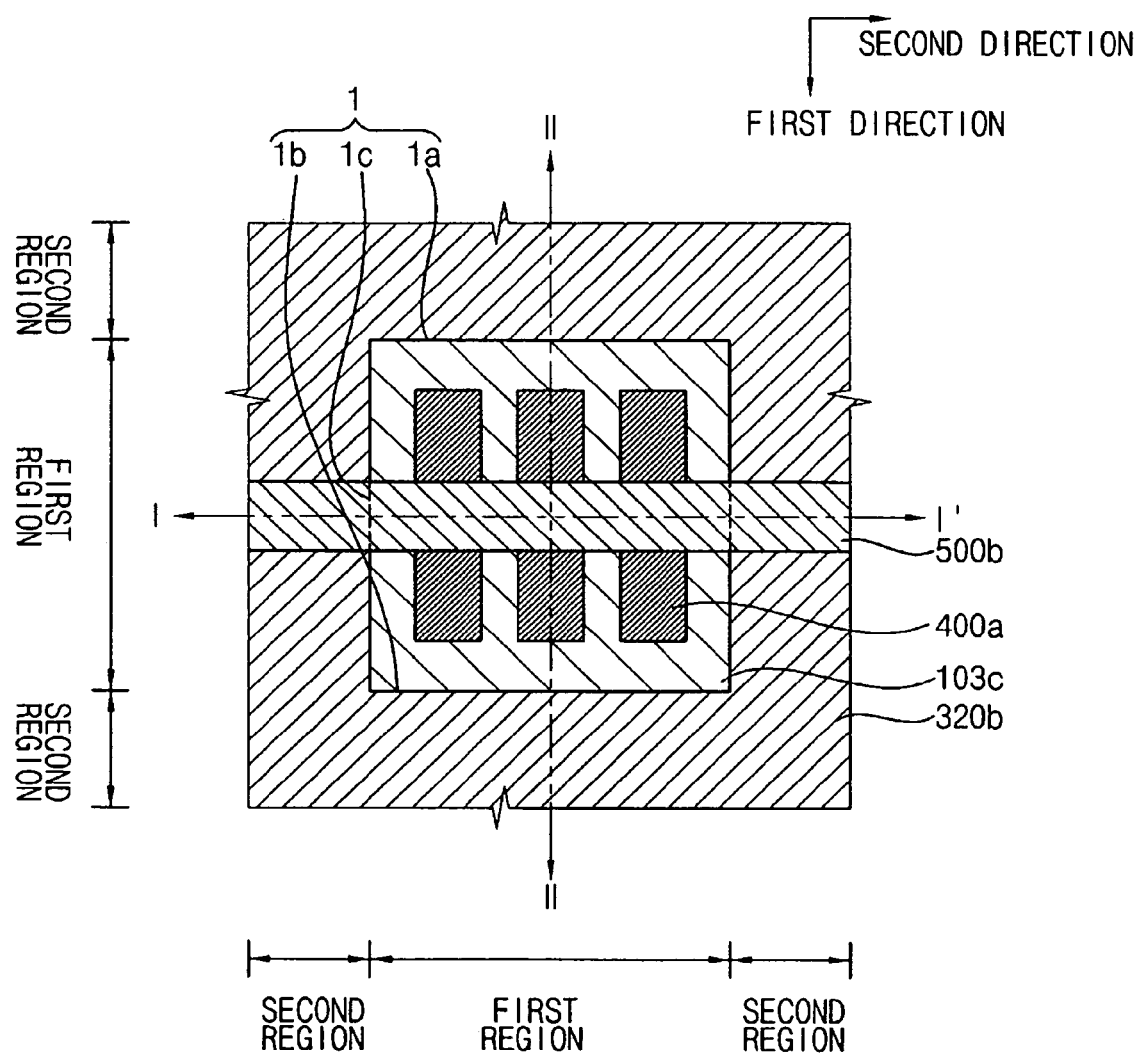
Figure 23B:
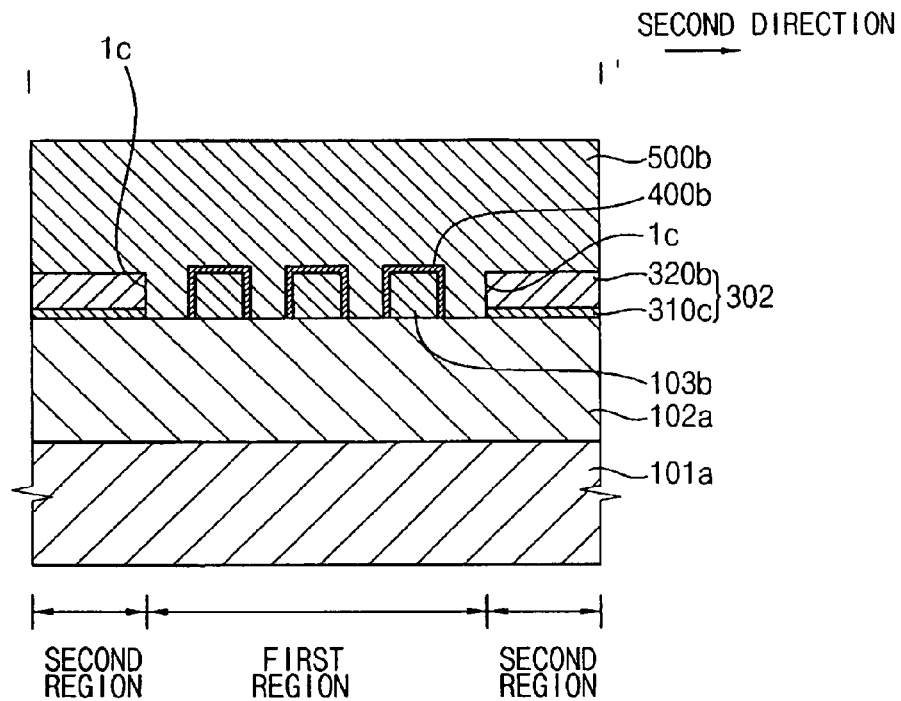
Figure 23C:
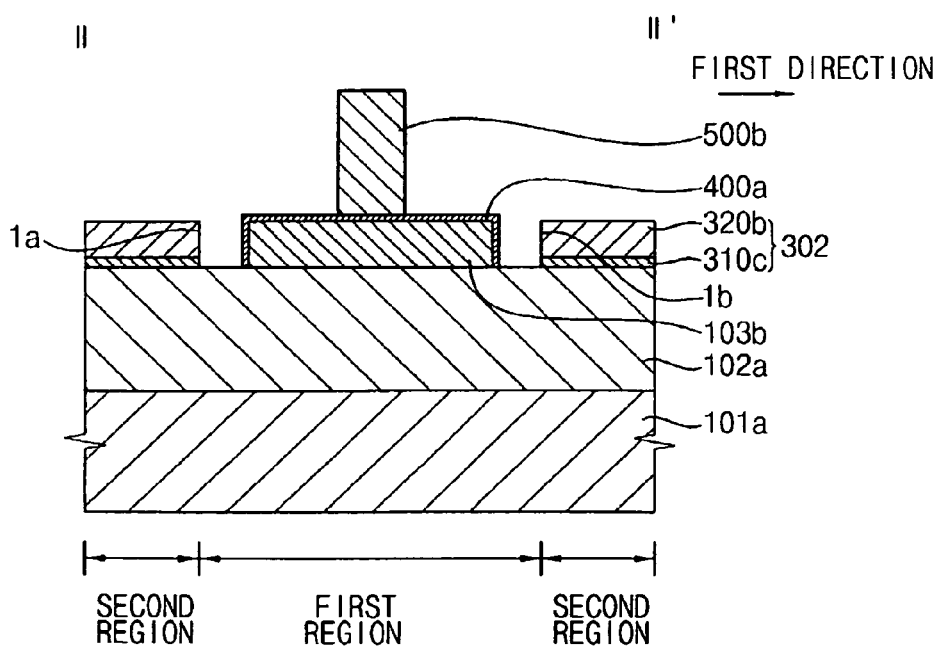

Referring to FIGS. 23A to 23C, a photolithography process is performed on the conductive layer 500*a* so that a gate electrode 500*b* extending in the second direction may be formed on the first dummy layer pattern 310*c*, a second dummy layer pattern 320*b*, an insulating layer 102*a* and gate dielectric layers 400*a*.

Figure 24A:
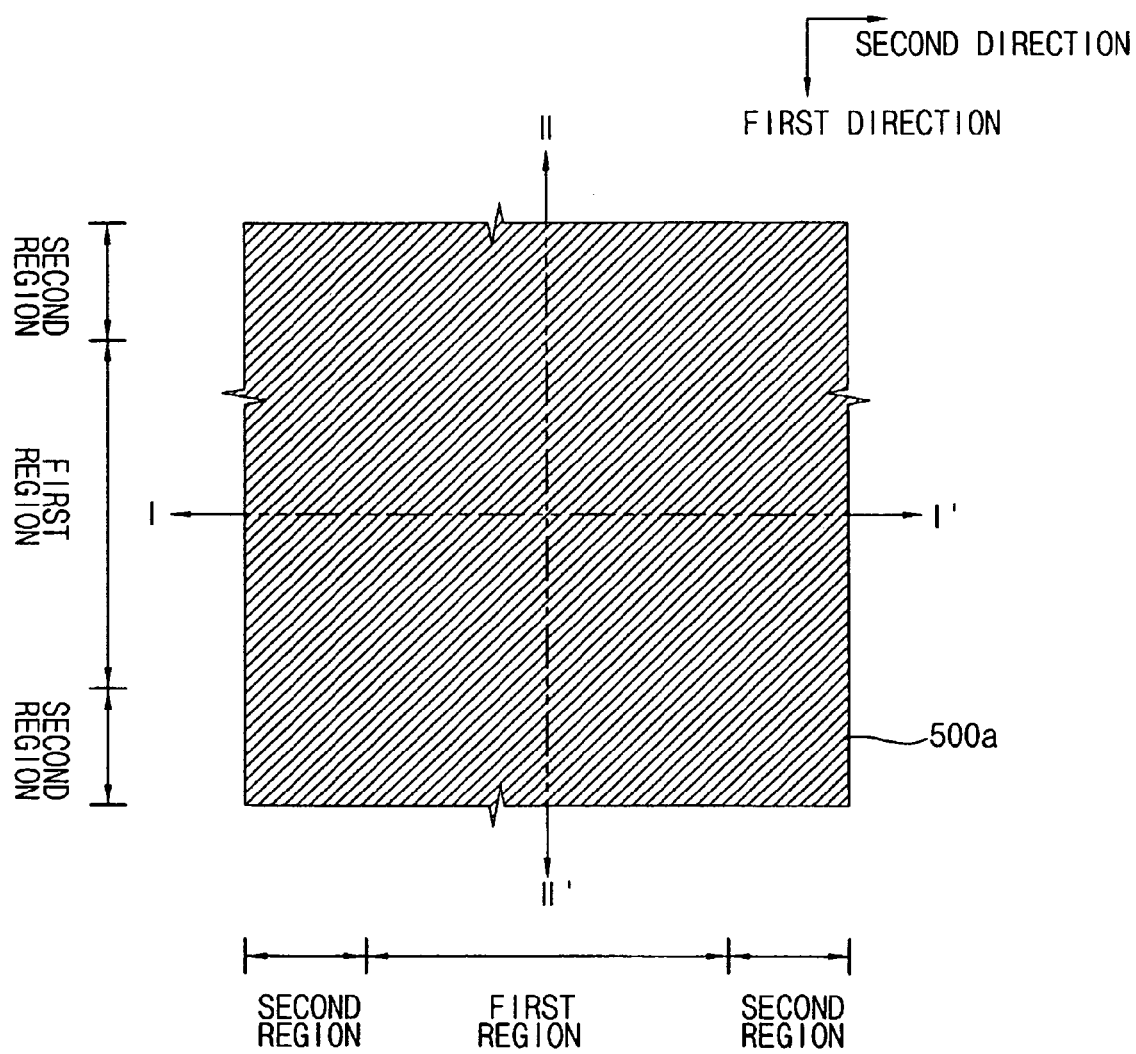
Figure 24B:
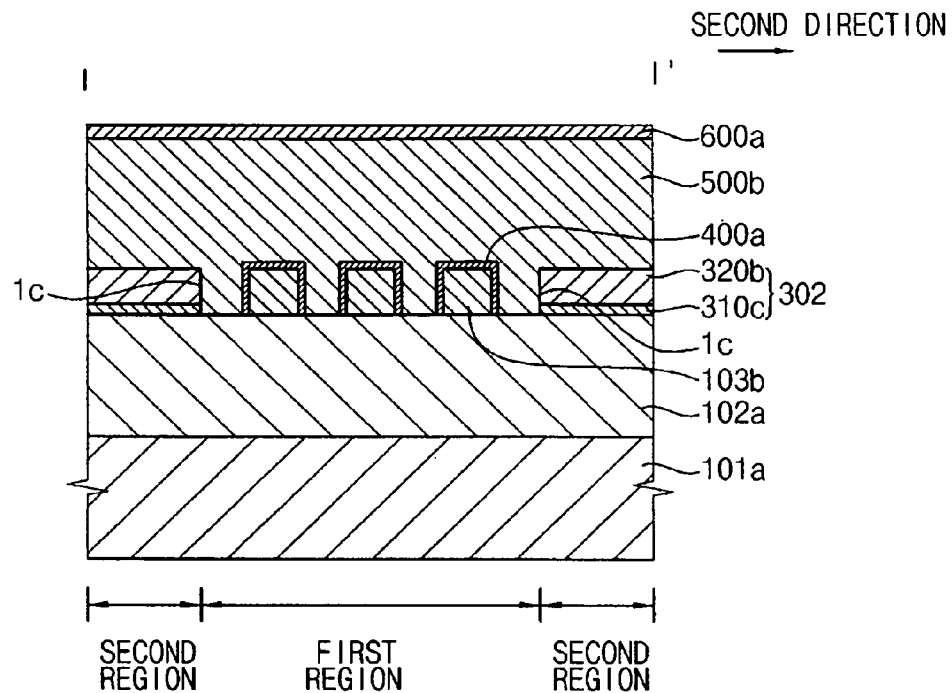
Figure 24C:
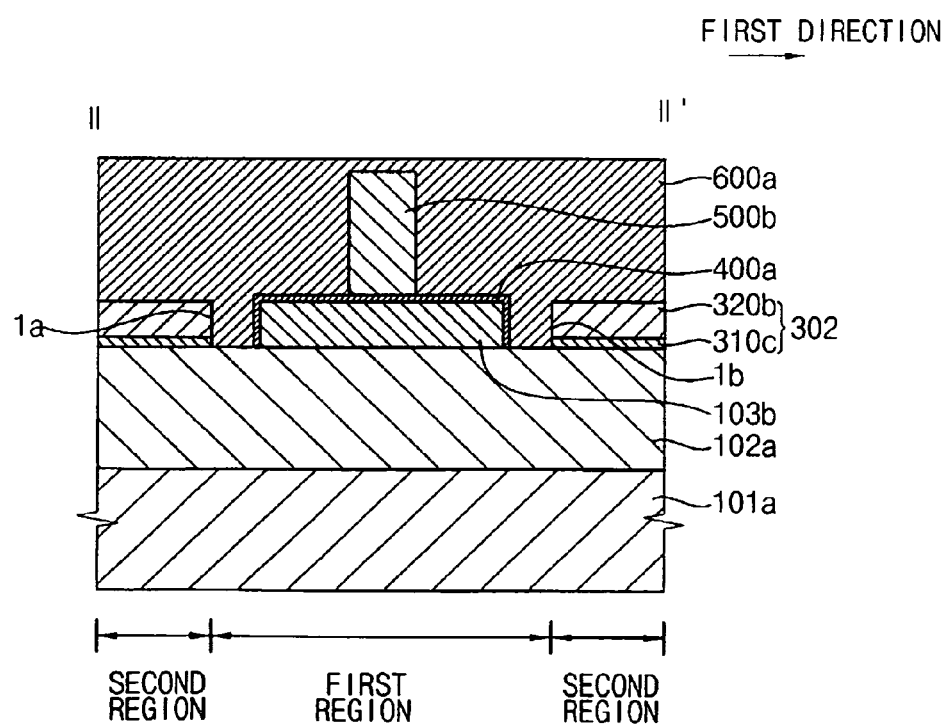

Referring to FIGS. 24A to 24C, an insulation layer 600a is formed on the first dummy layer pattern 301c, the second dummy layer pattern 320b, the insulating layer 102A, the gate dielectric layers 400A and the gate electrodes 500b.

Figure 25A:
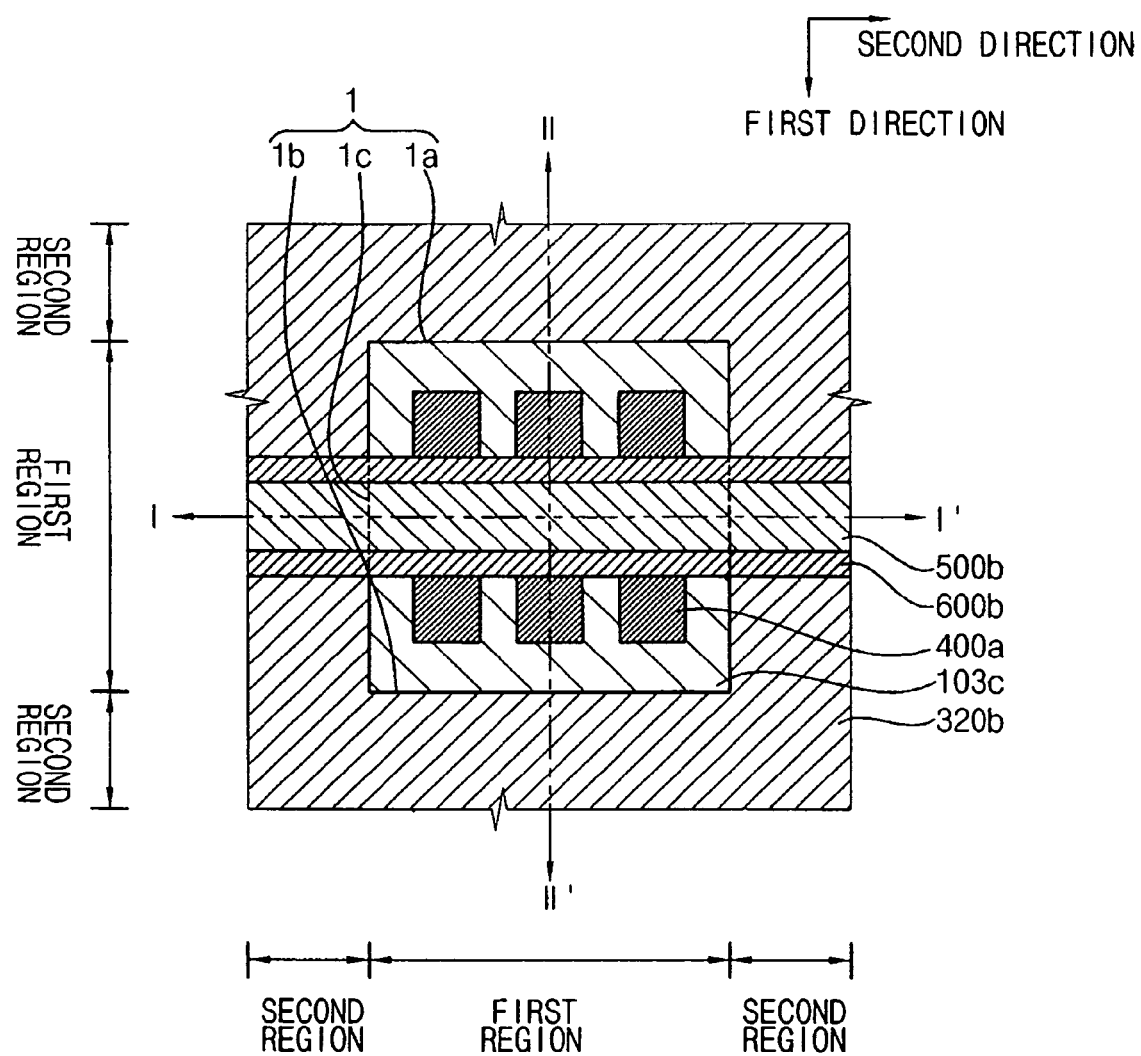
Figure 25B:
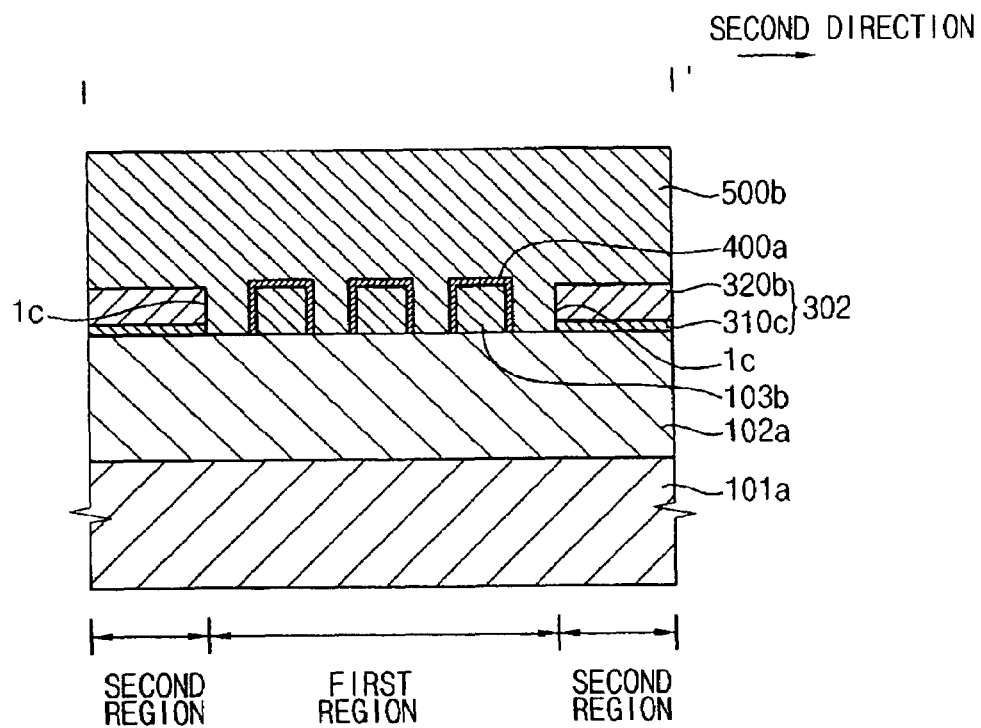
Figure 25C:
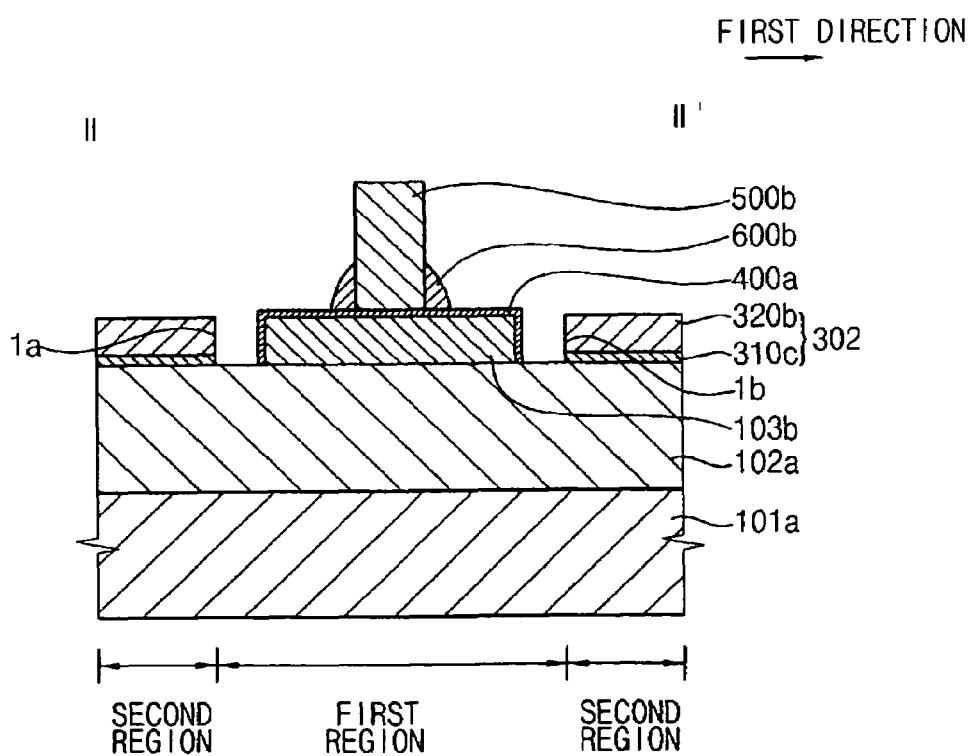

Referring to FIGS. 25A to 25C, the insulation layer 600a is partially etched so that a spacer 600b may be formed on a sidewall of the gate electrode 500b.

Figure 26A:
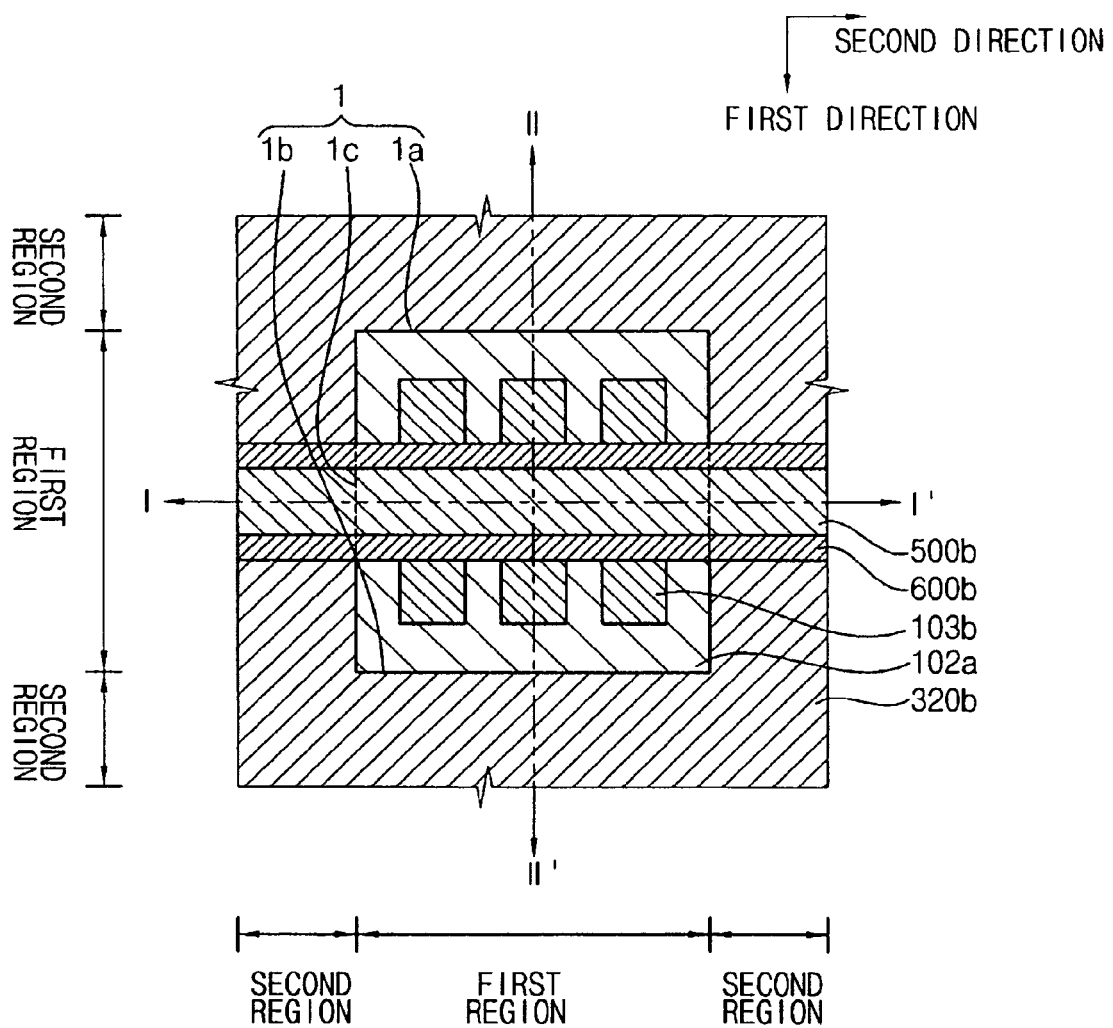
Figure 26B:
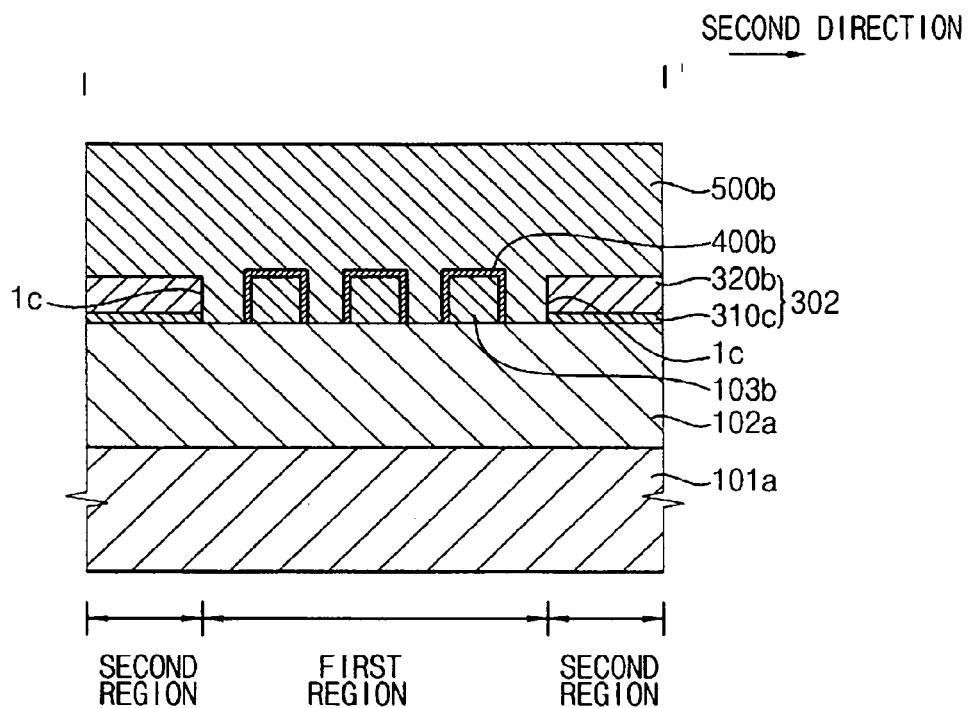
Figure 26C:
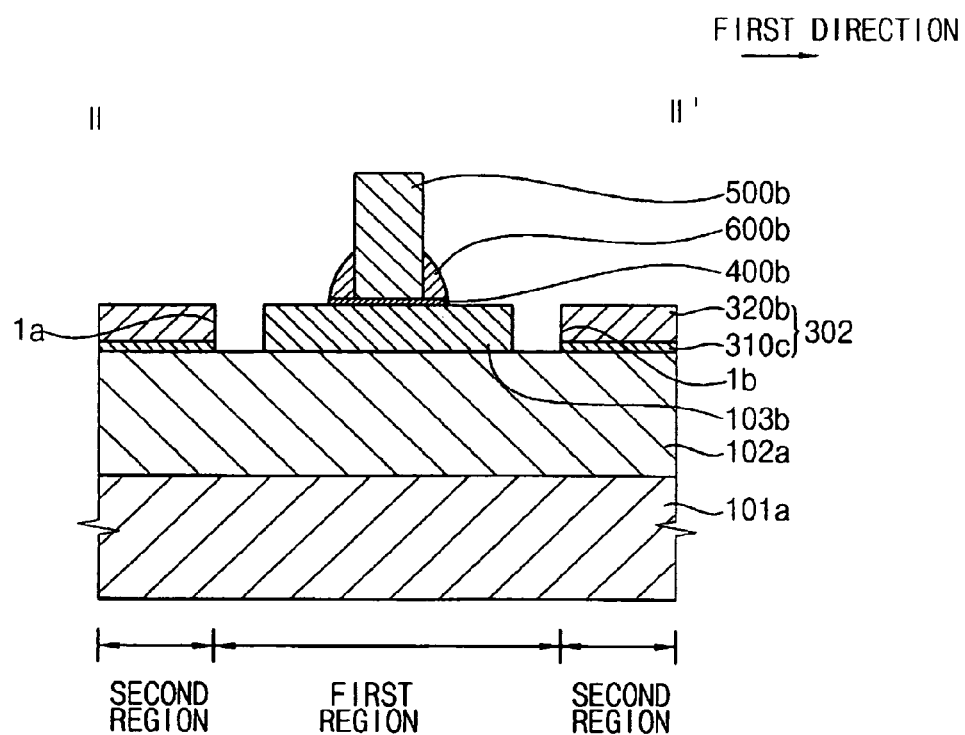
Figure 27A:
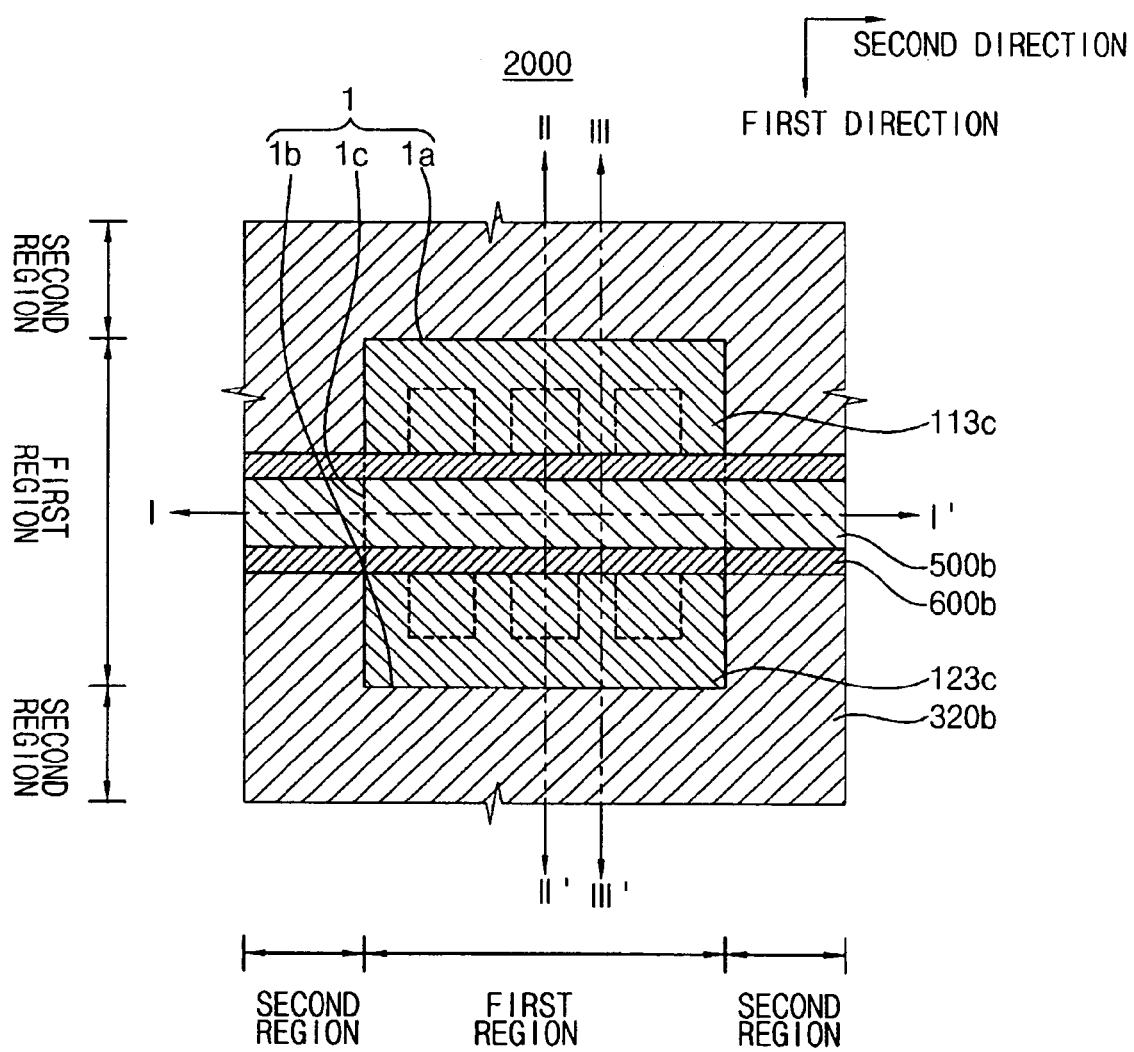
Figure 27B:
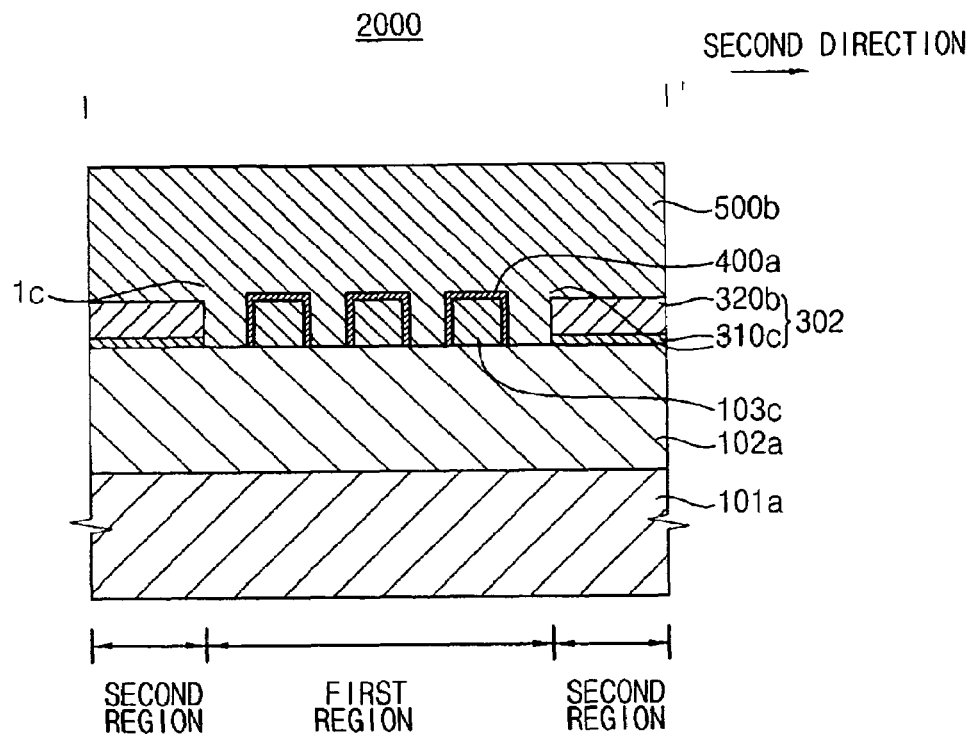
Figure 27C:
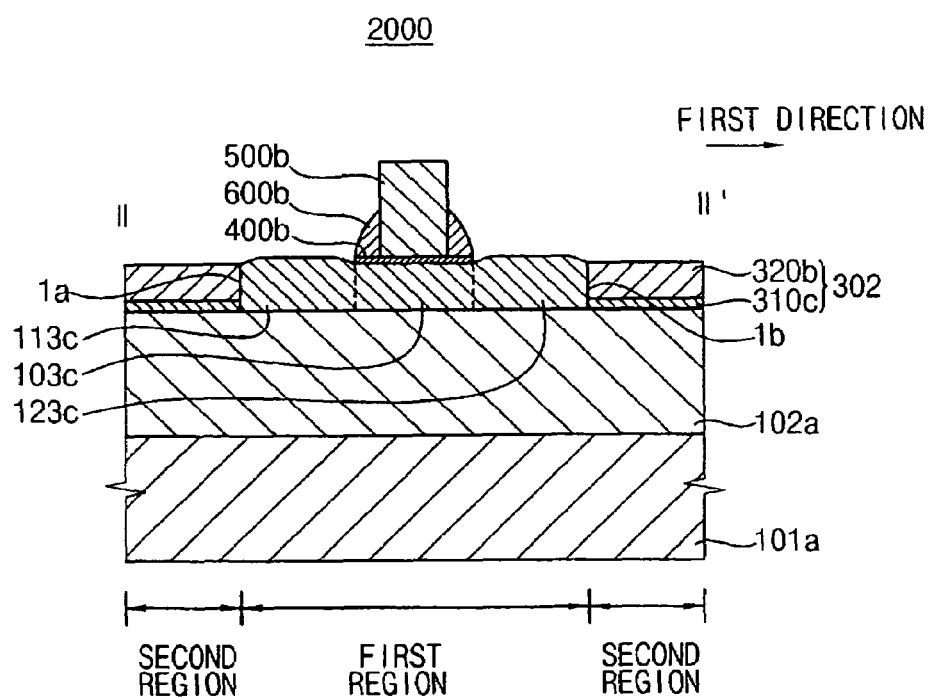
Figure 27D:
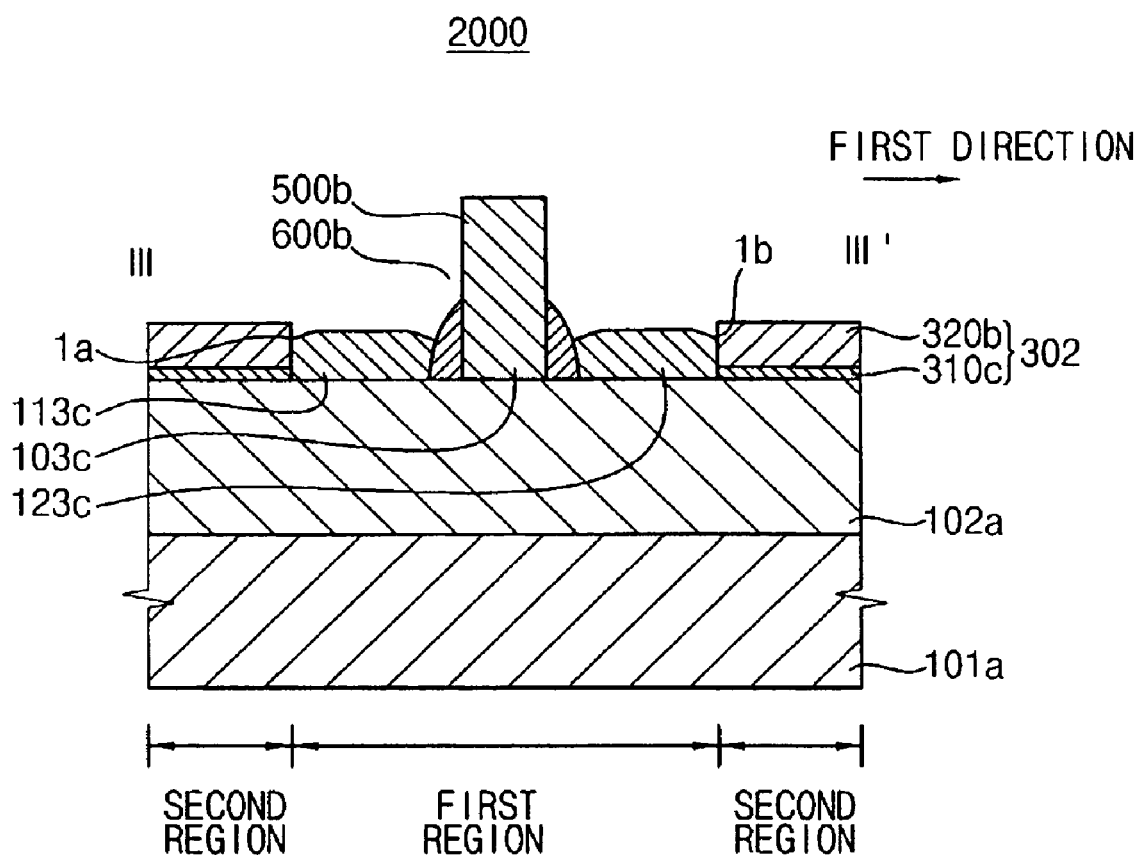
FIG. 27D is a cross sectional view taken along line III-III' of FIG. 27A.

Referring to FIGS. 26A to 26C, portions of the gate dielectric layers 400a, the portions being exposed by the spacer 600b, are removed so that gate dielectric layer patterns 400b may be formed under the gate electrode 500b and the spacer 600b.

Referring to FIGS. 27A to 27D, an epitaxial process is performed using end portions of the active patterns 103b as seeds so that a preliminary first source/drain structure and a preliminary second source/drain structure may be formed.

Thereafter, impurities are doped into the preliminary first and second source/drain structures so that first and second source/drain structures 113c and 123c may be formed, respectively. Thus, the transistor 2000 is manufactured.

According to the present invention, an upper face of a conductive layer formed over an active pattern may be relatively flat. Thus, a margin of a photolithography process performed on the conductive layer may increase.

In addition, an excessive growth of a source/drain structure in an epitaxial process may be prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a transistor, the method comprising:
   providing an insulating layer having a first region and a second region enclosing the first region;
   forming an active pattern on the insulating layer in the first region;
   forming a dummy structure on the second region;
   forming a gate dielectric layer on the active pattern;
   forming a gate electrode pattern on the gate dielectric layer;
   forming a spacer on a sidewall of the gate electrode, the spacer covering a part of the gate dielectric layer;
   removing a part of the gate dielectric layer that is not covered by the spacer;
   forming an epitaxial growth structure on the first region to form a source/drain structure; and
   wherein the epitaxial growth structure is in contact with the active pattern, and
   wherein forming the dummy structure comprises:
      forming a first dummy layer on the insulating layer and on the active pattern;
      forming a second dummy layer on the first dummy layer;
      forming a second dummy layer pattern by partially removing the second dummy layer formed on the first region;
      forming a first dummy layer pattern using a first etching process for the first dummy layer formed on the first region and a part of it formed on the second region so that an undercut region is formed under the edge of the second dummy layer pattern;
      forming a third dummy layer on the second dummy layer pattern, the insulating layer, the active patterns, and in the undercut region; and
      forming a third dummy layer pattern in the undercut region using a second etching process and by removing the third dummy layer formed on the second dummy layer pattern, the insulating layer, and on the active pattern.

2. The method of claim 1, wherein the first etching process is an isotropic etching process.

3. The method of claim 1, wherein the second etching process is an anisotropic etching process.

4. The method of claim 1, wherein the first dummy layer has an etching selectivity with respect to the second dummy layer.

* * * * *